(12) United States Patent
Yoshida et al.

(10) Patent No.: US 8,431,451 B2
(45) Date of Patent: Apr. 30, 2013

(54) DISPLAY DEVICE AND METHOD FOR MANUFACTURING THE SAME

(75) Inventors: Yasunori Yoshida, Kanagawa (JP); Akihisa Shimomura, Kanagawa (JP); Yurika Sato, Kanagawa (JP)

(73) Assignee: Semicondutor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 285 days.

(21) Appl. No.: 12/213,799

(22) Filed: Jun. 24, 2008

(65) Prior Publication Data
US 2009/0001469 A1 Jan. 1, 2009

(30) Foreign Application Priority Data
Jun. 29, 2007 (JP) ................................ 2007-173511

(51) Int. Cl.
H01L 21/84 (2006.01)
(52) U.S. Cl.
USPC .................. 438/164; 438/455; 257/E21.7
(58) Field of Classification Search ............... 438/164; 257/E21.7
See application file for complete search history.

(56) References Cited

U.S. PATENT DOCUMENTS

| | | | |
|---|---|---|---|
| 5,852,488 A | 12/1998 | Takemura | |
| 6,004,866 A | 12/1999 | Nakano et al. | |
| 6,078,371 A * | 6/2000 | Ichikawa et al. | 349/95 |
| 6,242,324 B1 | 6/2001 | Kub et al. | |
| 6,337,731 B1 * | 1/2002 | Takemura | 438/30 |
| 6,372,609 B1 | 4/2002 | Aga et al. | |
| 6,380,046 B1 | 4/2002 | Yamazaki | |
| 6,485,993 B2 | 11/2002 | Trezza et al. | |
| 6,534,380 B1 | 3/2003 | Yamauchi et al. | |
| 6,562,127 B1 | 5/2003 | Kud et al. | |
| 6,767,802 B1 | 7/2004 | Maa et al. | |
| 6,818,529 B2 * | 11/2004 | Bachrach et al. | 438/455 |
| 6,953,736 B2 | 10/2005 | Ghyselen et al. | |
| 7,015,994 B2 | 3/2006 | Cho et al. | |
| 7,038,277 B2 | 5/2006 | Chu et al. | |
| 7,119,365 B2 | 10/2006 | Takafuji et al. | |
| 7,148,124 B1 | 12/2006 | Usenko | |
| 7,176,528 B2 | 2/2007 | Couillard et al. | |
| 7,192,844 B2 | 3/2007 | Couillard et al. | |
| 7,199,024 B2 | 4/2007 | Yamazaki | |
| 7,199,397 B2 | 4/2007 | Huang et al. | |
| 7,399,681 B2 | 7/2008 | Couillard et al. | |
| 7,508,034 B2 | 3/2009 | Takafuji et al. | |
| 7,655,566 B2 | 2/2010 | Fujii | |
| 7,674,687 B2 | 3/2010 | Henley | |
| 7,795,627 B2 | 9/2010 | Yamazaki | |
| 8,102,494 B2 | 1/2012 | Nishida et al. | |

(Continued)

FOREIGN PATENT DOCUMENTS
JP 64-061943 A 3/1989
JP 06-018926 A 1/1994

(Continued)

*Primary Examiner* — Chandra Chaudhari
(74) *Attorney, Agent, or Firm* — Eric J. Robinson; Robinson Intellectual Property Law Office, P.C.

(57) ABSTRACT

A semiconductor substrate is formed into a regular hexagon or a shape similar to the regular hexagon. The semiconductor substrate is bonded to and separated from a large-area substrate. Moreover, layout is designed so that a boundary of bonded semiconductors is located in a region which is removed by etching when patterning is performed by photolithography or the like.

7 Claims, 38 Drawing Sheets

U.S. PATENT DOCUMENTS

| | | |
|---|---|---|
| 2002/0109144 A1 | 8/2002 | Yamazaki |
| 2003/0183876 A1 | 10/2003 | Takafuji et al. |
| 2004/0056332 A1 | 3/2004 | Bachrach et al. |
| 2004/0061176 A1 | 4/2004 | Takafuji et al. |
| 2004/0121557 A1 | 6/2004 | Ghyselen |
| 2004/0135149 A1 | 7/2004 | Cho et al. |
| 2004/0147095 A1 | 7/2004 | Yamazaki |
| 2004/0198026 A1 | 10/2004 | Chu et al. |
| 2004/0229444 A1 | 11/2004 | Couillard et al. |
| 2004/0248380 A1 | 12/2004 | Aulnette et al. |
| 2004/0259328 A1 | 12/2004 | Ito et al. |
| 2005/0247932 A1 | 11/2005 | Huang et al. |
| 2005/0255670 A1 | 11/2005 | Couillard et al. |
| 2005/0266658 A1 | 12/2005 | Couillard et al. |
| 2007/0026580 A1 | 2/2007 | Fujii |
| 2007/0026638 A1 | 2/2007 | Henley |
| 2007/0117354 A1 | 5/2007 | Gadkaree et al. |
| 2007/0134891 A1 | 6/2007 | Adetutu et al. |
| 2007/0173000 A1 | 7/2007 | Yamazaki |
| 2007/0207593 A1 | 9/2007 | Couillard et al. |
| 2007/0281399 A1 | 12/2007 | Cites et al. |
| 2007/0281440 A1 | 12/2007 | Cites et al. |
| 2008/0038908 A1 | 2/2008 | Henley |
| 2008/0061301 A1 | 3/2008 | Yamazaki |
| 2008/0067529 A1 | 3/2008 | Yamazaki |
| 2008/0067597 A1 | 3/2008 | Yamazaki |
| 2008/0083953 A1 | 4/2008 | Yamazaki |
| 2008/0224254 A1 | 9/2008 | Couillard et al. |
| 2008/0246109 A1 | 10/2008 | Ohnuma et al. |
| 2008/0280424 A1 | 11/2008 | Yamazaki et al. |
| 2008/0283848 A1 | 11/2008 | Yamazaki |
| 2008/0299744 A1 | 12/2008 | Yamazaki et al. |
| 2008/0315350 A1 | 12/2008 | Tanaka |
| 2008/0318367 A1 | 12/2008 | Shimomura et al. |
| 2009/0004821 A1 | 1/2009 | Shimomura et al. |
| 2009/0004823 A1 | 1/2009 | Shimomura et al. |
| 2009/0017598 A1 | 1/2009 | Shimomura et al. |
| 2009/0081849 A1 | 3/2009 | Yamazaki et al. |
| 2011/0006314 A1 | 1/2011 | Yamazaki |

FOREIGN PATENT DOCUMENTS

| | | |
|---|---|---|
| JP | 08-032038 | 2/1996 |
| JP | 10-135479 A | 5/1998 |
| JP | 11-087200 | 3/1999 |
| JP | 11-087200 A | 3/1999 |
| JP | 11-097379 A | 4/1999 |
| JP | 11-163363 A | 6/1999 |
| JP | 2000-012864 A | 1/2000 |
| JP | 2000-124092 A | 4/2000 |
| JP | 2000-294754 A | 10/2000 |
| JP | 2003-029667 A | 1/2003 |
| JP | 2003-324188 A | 11/2003 |
| JP | 2004-134675 A | 4/2004 |
| JP | 2005-203596 A | 7/2005 |
| JP | 2005-252244 A | 9/2005 |
| JP | 2005-539259 | 12/2005 |
| WO | WO-2001/011670 | 2/2001 |
| WO | WO-2005/029576 | 3/2005 |
| WO | WO-2006/062180 | 6/2006 |
| WO | WO-2007/008897 | 1/2007 |

\* cited by examiner

DISPLAY DEVICE AND METHOD FOR MANUFACTURING THE SAME

BACKGROUND OF THE INVENTION

1. Field of the Invention

The present invention relates to devices, methods of operating the devices, and methods of manufacturing the devices. The present invention relates to a semiconductor device among the devices, and in particular, a substrate including a semiconductor (a semiconductor substrate), and in particular, a semiconductor substrate in which a semiconductor layer having single crystallinity or crystallinity similar to single crystallinity is bonded to a substrate having an insulating surface, such as glass. Further, the present invention relates to a semiconductor device which includes a circuit including a thin film transistor (hereinafter referred to as a TFT) formed using the semiconductor substrate. For example, the present invention relates to an electronic device on which an electro-optic device typified by a liquid crystal display panel or a light-emitting display device including an organic light-emitting element is mounted as components.

Note that in this specification, a semiconductor device refers to all devices which can function by utilizing semiconductor characteristics. An electro-optic device, a semiconductor circuit, and an electronic device are all included in the semiconductor device.

2. Description of the Related Art

A technology for forming a thin film transistor (a TFT) by using a semiconductor thin film (with a thickness of approximately several to several hundreds of nanometers) formed over a substrate having an insulating surface is widely applied to electronic devices such as an IC and an electro-optic device. In particular, a technology for forming a TFT with stable characteristics is important for an image display device including a plurality of pixels, each of which needs an active element.

When an image display device including a TFT is formed, a photolithography technique with high precision is necessary to obtain precise image display. Further, a substrate with a large area tends to be used in order to reduce manufacturing costs. In order to precisely form a TFT using such a large-area substrate, a large one-shot exposure device, a stepper exposure device, or the like is used.

Although a large area can be exposed to light at one time in a large one-shot exposure device, there is a problem in that variation in irradiation intensity and degree of parallelization of light is large. Accordingly, a stepper exposure device, in which such a problem is not likely to occur, is often used.

Note that there are limitations on a region which can be exposed to light at one time with a stepper exposure device. Accordingly, when the area larger than the region is exposed to light, exposure is repeated several times.

A semiconductor substrate called a silicon-on-insulator (an SOI substrate) which has a thin single-crystal semiconductor layer on an insulating layer has been developed instead of a silicon wafer which is manufactured by thinly slicing an ingot of a single-crystal semiconductor, and the SOI substrate is spreading as a substrate in manufacturing a microprocessor or the like. This is because an integrated circuit including the SOI substrate has a variety of characteristics necessary for higher performance of the integrated circuit, such as small power consumption in high-frequency operation due to small parasitic capacitance between a drain of a transistor and a substrate.

As a method for manufacturing an SOI substrate, a hydrogen ion implantation separation method is known (e.g., see Reference 1: U.S. Pat. No. 6,372,609). The hydrogen ion implantation separation method is a method by which hydrogen ions are implanted into a silicon wafer to form a microbubble layer at a predetermined depth from the surface, and ia thin silicon layer (an SOI layer) is bonded to another silicon wafer using the microbubble layer as a cleavage plane. In addition to heat treatment for separating the SOI layer, it is necessary to perform heat treatment in an oxidizing atmosphere to form an oxide film on the SOI layer, remove the oxide film, and perform heat treatment at 1000 to 1300° C. in a reducing atmosphere to increase bonding strength.

On the other hand, there is an attempt to form an SOI layer on an insulating substrate such as a glass substrate. As an example of an SOI substrate in which an SOI layer is formed on a glass substrate, an SOI substrate in which a thin single-crystal silicon layer is formed on a glass substrate having a coating film by a hydrogen ion implantation separation method is known (see Reference 2: U.S. Pat. No. 7,119,365). In this case also, a thin silicon layer (an SOI layer) is formed on the glass substrate in such a manner that a microbubble layer is formed at a predetermined depth from the surface by implantation of hydrogen ions to a piece of single-crystal silicon, the glass substrate and the piece of single-crystal silicon are bonded to each other, and thereafter, the piece of silicon is separated using the microbubble layer as a cleavage plane.

SUMMARY OF THE INVENTION

When an SOI substrate using a large-area glass substrate is manufactured by a hydrogen ion implantation separation method, a silicon wafer for forming the SOI layer is smaller than the glass substrate; thus, for a region which needs the SOI layer, a plurality of SOI layers are arranged over the glass substrate. The silicon wafer is circular in general, and circular SOI layers as they are cannot be arranged with any space therebetween. Moreover, when a silicon wafer or an SOI layer is cut into a rectangular shape in order to arrange SOI layers with little space therebetween as possible, efficiency in the use of the silicon wafer is low since portions other than the rectangular shape is removed from the substrate.

Further, when a plurality of SOI layers are not precisely arranged, a boundary of bonding is located in a region where a transistor is formed in some cases. A transistor located at a boundary of bonding does not operate normally because SOI layers are divided. Accordingly, it is necessary to arrange a plurality of SOI layers over a glass substrate with precise alignment, which is extremely difficult.

The problem that efficiency in the use of a silicon wafer is low can be solved by cutting a circular silicon wafer into a polygonal shape to be used for forming an SOI layer.

The problem that it is necessary to arrange a plurality of SOI layers over a glass substrate with precise alignment can be solved by devising arrangement of a transistor depending on a shape of a boundary of bonding.

Specifically, one feature of the present invention is a display device including a display portion. The display portion includes a plurality of pixels. The plurality of pixels are classified into pixel groups of m columns (m is a positive integer) including the same signal line. The pixels included in the pixel group each include a semiconductor region at approximately the same position in their respective regions. The pixel group is arranged so as to have a distance of a pixel pitch X in a direction parallel to a scan line from an adjacent pixel group. The position of the semiconductor region in the region of the pixel included in the pixel group is different from the position of the semiconductor region in the region of the pixel included in the adjacent pixel group by approximately X/2. The semiconductor region has single crystallinity or crystallinity similar to single crystallinity.

In the above-described structure, in each of the plurality of pixels, a ratio of a shorter side to a longer side of the region is 1:√3. Moreover, in the above-described structure, the semiconductor regions in the display portion are arranged at an angle of approximately 30° (25°-35°) with respect to a direction parallel to the signal line.

Another feature of the present invention disclosed in this specification is a display device including a display portion. The display portion includes a plurality of pixels. The plurality of pixels are classified into pixel groups of n rows (n is a positive integer) including the same scan line. The pixels included in the pixel group each include a semiconductor region at approximately the same position in their respective regions. The pixel group is arranged so as to have a distance of a pixel pitch Y in a direction parallel to a signal line from an adjacent pixel group. The position of the semiconductor region in the region of the pixel included in the pixel group is different from the position of the semiconductor region in the region of the pixel included in the adjacent pixel group by approximately Y/2. The semiconductor region has single crystallinity or crystallinity similar to single crystallinity.

In the above-described structure, in each of the plurality of pixels, a ratio of a shorter side to a longer side of the region is √3/2:1. Moreover, in the above-described structure, the semiconductor regions in the display portion are arranged at an angle of approximately 30° (25°-35°) or approximately 60° (55°-65°) with respect to a direction parallel to the signal line.

Another feature of the present invention disclosed in this specification is a display device including a plurality of semiconductor regions. Each of the plurality of semiconductor regions has single crystallinity or crystallinity similar to single crystallinity. The plurality of semiconductor regions are defined (divided) into a plurality of groups of semiconductor regions having the same crystal orientation. Boundaries of the plurality of groups are such that a plurality of regular hexagons are arranged.

In each of the above-described structures, the display device may further include a pixel electrode and an insulating film. The pixel electrode is provided in contact with the insulating film. The insulating film is a planarization film including an organic material.

Another feature of the present invention disclosed in this specification is a method of manufacturing a display device by the following steps. A wafer is cut to form a hexagonal semiconductor substrate. An imaginary defined (division) line by which a rectangular substrate is defined (divided) into the number of display portions formed over the rectangular substrate is set. A plurality of hexagonal semiconductor substrates are arranged and attached to the rectangular substrate so that one side of the hexagonal semiconductor substrate is parallel to the imaginary defined (division) line and the one side of the hexagonal semiconductor substrate is parallel to one side of the nearest hexagonal semiconductor substrate. The imaginary defined (division) line is an outline of the display portion.

Another feature of the present invention disclosed in this specification is a method of manufacturing a display device by the following steps. A wafer is cut to form a hexagonal semiconductor substrate. A plurality of hexagonal semiconductor substrates are arranged over and attached to a rectangular substrate. A plurality of semiconductor regions are formed. A display portion provided with a plurality of pixels each including at least one semiconductor region and one pixel electrode which is electrically connected to the semiconductor region is formed. The plurality of semiconductor regions are formed in such a manner that a plurality of hexagonal semiconductor substrates are attached to the rectangular substrate and a boundary region of the adjacent hexagonal semiconductor substrates is provided between one semiconductor region and the next semiconductor region. In this manufacturing method, the pixels in the display portion are arranged in a delta pattern.

Note that various types of switches, for example, an electrical switch and a mechanical switch can be used. That is, any element can be used without being limited to a particular type as long as it can control a current flow. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a thyristor, or the like can be used as a switch. Alternatively, a logic circuit in which such elements are combined can be used as a switch.

Examples of a mechanical switch include a switch formed using a micro electro mechanical system (MEMS) technology, such as a digital micromirror device (DMD). Such a switch includes an electrode which can be moved mechanically, and operates by controlling connection or non-connection based on movement of the electrode.

When a transistor is used as a switch, polarity (a conductivity type) of the transistor is not particularly limited since it operates just as a switch. Note that when off-current is preferably to be suppressed, a transistor of polarity with smaller off-current is preferably used. Examples of a transistor with smaller off-current include a transistor having an LDD region and a transistor having a multi-gate structure. Further, an n-channel transistor is preferably used when a transistor operates with a potential of a source terminal closer to a potential of a low potential side power supply (e.g., $V_{SS}$, GND, or 0 V). On the other hand, a p-channel transistor is preferably used when a transistor operates with a potential of a source terminal closer to a potential of a high potential side power supply (e.g., $V_{dd}$). This is because when the n-channel transistor operates with the potential of the source terminal closer to the low potential side power supply and when the p-channel transistor operates with the potential of the source terminal closer to the high potential side power supply, an absolute value of gate-source voltage can be increased; thus, the transistor can more precisely operate as a switch. Moreover, this is because reduction in output voltage does not occur often because the transistor does not often perform a source follower operation.

Note that a CMOS switch may also be employed by using both n-channel and p-channel transistors. A CMOS switch can easily function as a switch since current can flow when one of the n-channel transistor and the p-channel transistor is turned on. For example, voltage can be output as appropriate whether voltage of an input signal to the switch is high or low. Further, since a voltage amplitude value of a signal for turning on/off the switch can be decreased, power consumption can be reduced.

Note that when a transistor is used as a switch, the switch includes an input terminal (one of a source terminal and a drain terminal), an output terminal (the other of the source terminal and the drain terminal), and a terminal (a gate terminal) for controlling electrical conduction. On the other hand, when a diode is used as a switch, the switch does not have a terminal for controlling electrical conduction in some cases. Therefore, when a diode is used as a switch, the number of wirings for controlling terminals can be reduced compared with the case where a transistor is used as a switch.

Note that when it is explicitly described that A and B are connected, the case where A and B are electrically connected, the case where A and B are functionally connected, and the case where A and B are directly connected are included. Here, each of A and B is an object (e.g., a device, an element, a circuit, a wiring, an electrode, a terminal, a conductive film, or a layer). Accordingly, another element may be provided in a connection relationship shown in drawings and texts, without being limited to a predetermined connection relationship, for example, connection relationships shown in the drawings and the texts.

For example, when A and B are electrically connected, one or more elements which enable electrical connection of A and B (e.g., a switch, a transistor, a capacitor, an inductor, a resistor, or a diode) may be provided between A and B. Alternatively, when A and B are functionally connected, one or more circuits which enable functional connection of A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a booster circuit or a voltage step-down circuit) or a level shifter circuit for changing potential level of a signal; a voltage source; a current source; a switching circuit; or an amplifier circuit which can increase signal amplitude, the amount of current, or the like, such as an operational amplifier, a differential amplifier circuit, a source follower circuit, or a buffer circuit; a signal generation circuit; a memory circuit; or a control circuit may be provided between A and B. Alternatively, when A and B are directly connected, A and B may be directly connected without interposing another element or another circuit therebetween.

When it is explicitly described that A and B are directly connected, the case where A and B are directly connected (i.e., the case where A and B are connected without interposing another element or another circuit therebetween) and the case where A and B are electrically connected (i.e., the case where A and B are connected by interposing another element or another circuit therebetween) are included.

In addition, when it is explicitly described that A and B are electrically connected, the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included. That is, when it is explicitly described that A and B are electrically connected, the description is the same as the case where it is explicitly described only that A and B are connected.

Note that a display element, a display device which is a device including a display element, a light-emitting element, and a light-emitting device which is a device including a light-emitting element can employ various modes and can include various elements. For example, as a display element, a display device, a light-emitting element, and a light-emitting device, a display medium whose contrast, luminance, reflectivity, transmittance, or the like is changed by electromagnetic action, such as an EL (electroluminescence) element (e.g., an EL element including both organic and inorganic materials, an organic EL element, or an inorganic EL element), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube can be used. Note that display devices using an EL element include an EL display in its category; display devices using an electron emitter include a field emission display (FED) and an SED-type flat panel display (SED: surface-conduction electron-emitter display) in its category; display devices using a liquid crystal element include a liquid crystal display (e.g., a transmissive liquid crystal display, a transflective liquid crystal display, a reflective liquid crystal display, a direct-view liquid crystal display, or a projection type liquid crystal display) in its category; and display devices using electronic ink include electronic paper in its category.

Note that an EL element is an element including an anode, a cathode, and an EL layer interposed between the anode and the cathode. Examples of the EL layer include various types of EL layers, for example, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high molecular material, a layer including a low molecular material, and a layer including a high molecular material and a low molecular material. Note that the present invention is not limited thereto, and various types of EL elements can be used.

Note that an electron emitter is an element in which electrons are extracted by high electric field concentration on a pointed cathode. For example, the electron emitter may be any one of a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin-film diode type, a diamond type, a surface conduction emitter SCD type, a thin film type in which a metal, an insulator, a semiconductor, and a metal are stacked, a HEED type, an EL type, a porous silicon type, a surface-conduction electron-emitter (SED) type, and the like. However, the present invention is not limited thereto, and various elements can be used as an electron emitter.

Note that a liquid crystal element is an element which controls transmission or non-transmission of light by optical modulation action of a liquid crystal and includes a pair of electrodes and a liquid crystal. Optical modulation action of the liquid crystal is controlled by an electric filed applied to the liquid crystal (including a horizontal electric field, a vertical electric field, and an oblique electric field). The following liquid crystals can be used for a liquid crystal element: a nematic liquid crystal, a cholesteric liquid crystal, a smectic liquid crystal, a discotic liquid crystal, a thermotropic liquid crystal, a lyotropic liquid crystal, a low molecular liquid crystal, a high molecular liquid crystal, a ferroelectric liquid crystal, an anti-ferroelectric liquid crystal, a main chain type liquid crystal, a side chain type polymer liquid crystal, a plasma addressed liquid crystal (PAIC), a banana-shaped liquid crystal, a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, and a guest-host mode. Note that the present invention is not limited thereto, and various kinds of liquid crystal elements can be used.

Note that examples of electronic paper include a device displaying an image by molecules which utilizes optical anisotropy, dye molecular orientation, or the like; a device displaying an image by particles which utilizes electrophoresis, particle movement, particle rotation, phase change, or the like; a device displaying an image by moving one end of a film; a device using coloring properties or phase change of molecules; a device using optical absorption by molecules; and a device using self-light emission by combination of electrons and holes. For example, the followings can be used for electronic paper: microcapsule type electrophoresis, horizontal type electrophoresis, vertical type electrophoresis, a spherical twisting ball, a magnetic twisting ball, a column twisting ball, a charged toner, an electro liquid powder, magnetic electrophoresis, a magnetic heat-sensitive type element, an electrowetting type element, a light-scattering (transparent-opaque change) type element, a cholesteric liquid crystal and a photoconductive layer, a cholesteric liquid crystal, a bistable nematic liquid crystal, a ferroelectric liquid crystal, a liquid crystal dispersed type element with a dichroic dye, a movable film, coloring and decoloring properties of a leuco dye, photochromism, electrochromism, electrodeposition, flexible organic E-L, and the like. Note that the present invention is not limited thereto, and various types of electronic paper can be used. By using a microcapsule electrophoretic device, defects of the electrophoresis type, which are aggregation and precipitation of phoresis particles, can be solved. Electro liquid powder has advantages such as high-speed response, high reflectivity, wide viewing angle, low power consumption, and memory properties.

A plasma display includes a substrate having a surface provided with an electrode, and a substrate having a surface provided with an electrode and a minute groove in which a phosphor layer is formed. In the plasma display, the substrates are opposite to each other with a narrow interval, and a rare gas is sealed therein. Display can be performed by applying voltage between the electrodes to generate an ultraviolet ray so that the phosphor emits light. Note that the plasma display panel may be a DC type PDP or an AC type PDP. As a driving method of the plasma display panel, AWS (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, and the like can be used. Note that the present invention is not limited thereto, and various types of plasma displays can be used.

Note that electroluminescence, a cold cathode fluorescent lamp, a hot cathode fluorescent lamp, an LED, a laser light source, a mercury lamp, or the like can be used for a light source needed for a display device, such as a liquid crystal display device (a transmissive liquid crystal display, a transflective liquid crystal display, a reflective liquid crystal display, a direct-view liquid crystal display, and a projection type liquid crystal display), a display device using a grating light valve (GLV), and a display device using a digital micromirror device (DMD). Note that the present invention is not limited thereto, and various light sources can be used.

Note that as a transistor, various types of transistors can be employed without being limited to a certain type. For example, a thin film transistor (TFT) including a non-single crystal semiconductor film typified by amorphous silicon, polycrystalline silicon, microcrystalline (also referred to as semi-amorphous) silicon, or the like can be used. The use of the TFT has various advantages. For example, since a transistor can be formed at temperature lower than that of the case of using single-crystal silicon, reduction in manufacturing costs or increase in size of a manufacturing device can be realized. A transistor can be formed using a large substrate with increase in size of the manufacturing device. Accordingly, a large number of display devices can be formed at the same time, and thus can be formed at low cost. Further, since manufacturing temperature is low, a substrate having low heat resistance can be used. Accordingly, a transistor can be formed over a light-transmitting substrate; thus, transmission of light in a display element can be controlled by using the transistor formed over the light-transmitting substrate. Alternatively, since the thickness of the transistor is thin, part of a film forming the transistor can transmit light; thus, an aperture ratio can be increased.

When polycrystalline silicon is formed, the use of a catalyst (e.g., nickel) enables further improvement in crystallinity and formation of a transistor having excellent electrical characteristics. Thus, a gate driver circuit (a scan line driver circuit), a source driver circuit (a signal line driver circuit), and a signal processing circuit (e.g., a signal generation circuit, a gamma correction circuit, or a DA converter circuit) can be formed over the same substrate.

When microcrystalline silicon is formed, the use of a catalyst (e.g., nickel) enables further improvement in crystallinity and formation of a transistor having excellent electrical characteristics. At this time, the crystallinity can be improved by performing only heat treatment without laser irradiation. Thus, a gate driver circuit (a scan line driver circuit) and part of a source driver circuit (e.g., an analog switch) can be formed over the same substrate. Further, when laser irradiation is not performed for crystallization, unevenness of silicon crystallinity can be suppressed. Accordingly, an image with improved image quality can be displayed.

Note that polycrystalline silicon and microcrystalline silicon can be formed without using a catalyst (e.g., nickel).

Note that the crystallinity of silicon is preferably improved to polycrystal or microcrystal in the whole panel, but not limited thereto. The crystallinity of silicon may be improved only in part of the panel. The selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. As a result, the crystallinity of silicon only in a region in which a circuit needs to operate at high speed can be improved. A pixel region does not especially need to operate at high speed. Thus, even if the crystallinity is not improved, the pixel circuit can operate without problems. Since a region crystallinity of which is improved is small, manufacturing steps can be shortened, throughput can be increased, and manufacturing costs can be reduced. Since the number of manufacturing devices needed is small, manufacturing costs can be reduced.

Alternatively, a transistor can be formed using a semiconductor substrate, an SOI substrate, or the like. Accordingly, a small transistor with few variations in characteristics, sizes, shapes, or the like, with high current supply capacity can be formed. By using such a transistor, reduction in power consumption or high integration of circuits can be realized.

Alternatively, a transistor including a compound semiconductor or an oxide semiconductor such as ZnO, a-InGaZnO, SiGe, GaAs, IZO, ITO, or SnO, a thin film transistor obtained by thinning such a compound semiconductor or an oxide semiconductor, or the like can be used. Thus, manufacturing temperature can be lowered, and a transistor can be formed at room temperature, for example. Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or an electrode having a light-transmitting property. Further, since such an element can be formed at the same time as the transistor, cost can be reduced.

Alternatively, a transistor or the like formed by using an inkjet method or a printing method can be used. Accordingly, the transistor can be formed at room temperature or at a low vacuum, or can be formed using a large substrate. Since the transistor can be formed without using a mask (a reticle), layout of the transistor can be easily changed. Further, since it is not necessary to use a resist, material cost is reduced and the number of steps can be reduced. Moreover, since a film is formed only in a required portion, a material is not wasted and cost can be reduced compared with a manufacturing method in which etching is performed after the film is formed over the entire surface.

A transistor or the like including an organic semiconductor or a carbon nanotube can also be used. Accordingly, a transistor can be formed using a substrate which can be bent. A semiconductor device using such a substrate can resist a shock.

In addition, transistors with various structures can be used. For example, a MOS transistor, a junction transistor, a bipolar transistor, or the like can be used as a transistor. The use of a MOS transistor can reduce the size of a transistor. Accordingly, a plurality of transistors can be mounted. The use of a bipolar transistor can allow large current to flow; thus, a circuit can operate at high speed.

Note that a MOS transistor, a bipolar transistor, and the like may be mixed over one substrate. Thus, low power consumption, reduction in size, high-speed operation, and the like can be achieved.

In addition, various other transistors can be used.

Note that transistor can be formed using various substrates. The type of a substrate is not limited to a certain type. For example, a single crystalline-substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human may be used as the substrate. In addition, the transistor may be formed using one substrate, and then, the transistor may be transferred to another substrate so as to be provided over another substrate. As a substrate to which the transistor is transferred, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, a skin (e.g., epidermis or corium) or hypodermal tissue of an animal such as a human may be used as the substrate. Further alternatively, a transistor may be formed using a substrate, and the substrate may be thinned by polishing. As a substrate to be polished, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, a skin (e.g., epidermis or corium) or hypodermal tissue of an animal such as a human may be used as the substrate. By using such a substrate, a transistor with excellent properties or a transistor with low power consumption can be formed, a device with high durability can be formed, high heat resistance can be provided, and reduction in weight or size can be realized.

Note that a structure of a transistor can employ various modes without being limited to a specific stricture. For example, a multi-gate structure having two or more gate electrodes can be employed. When the multi-gate structure is employed, a structure where a plurality of transistors are connected in series is provided since channel regions are connected in series. The multi-gate structure realizes reduction in off-current and improvement in reliability due to improvement in withstand voltage of the transistor. Further, by employing the multi-gate structure, drain-source current does not change much even if drain-source voltage changes when the transistor operates in a saturation region; thus, the slope of voltage-current characteristics can be flat. By utilizing the characteristics in which the slope of the voltage-current characteristics is flat, an ideal current source circuit and an active load having an extremely high resistance value can be realized. Thus, a differential circuit or a current mirror circuit having excellent properties can be realized.

As another example, a structure where gate electrodes are formed above and below a channel can be employed. By employing the structure where gate electrodes are formed above and below the channel, a channel region is enlarged; thus, a subthreshold swing (an S value) can be reduced because the amount of current is increased or a depletion layer is easily formed. When the gate electrodes are formed above and below the channel, it seems that a plurality of transistors are connected in parallel.

A structure where a gate electrode is formed above a channel region, a structure where a gate electrode is formed below a channel region, a staggered structure, an inversely staggered structure, a structure where a channel region is divided into a plurality of regions, or a structure where a plurality of channel regions are connected in parallel or in series can be employed. Further, a structure where a source electrode or a drain electrode overlaps with a channel region (or part thereof) can be employed. By employing the structure where the source electrode or the drain electrode overlaps with the channel region (or part thereof), an unstable operation due to accumulation of charge in part of the channel region can be prevented. Alternatively, an LDD region may be provided. By providing the LDD region, off-current can be reduced, or reliability can be improved by improvement in withstand voltage of the transistor. Further, by providing the LDD region, drain-source current does not change much even if drain-source voltage changes when the transistor operates in the saturation region, so that characteristics where a slope of voltage-current characteristics is flat can be obtained.

Note that various types of transistors can be used, and the transistor can be formed using various types of substrates. Accordingly, all of circuits which are necessary to realize a predetermined function can be formed using the same substrate. For example, all of the circuits which are necessary to realize the predetermined function can be formed using a variety of substrates such as a glass substrate, a plastic substrate, a single crystalline substrate, or an SOI substrate. When all of the circuits which are necessary to realize the predetermined function are formed using the same substrate, cost can be reduced by reduction in the number of component parts or reliability can be improved by reduction in the number of connections between circuit components. Alternatively, part of the circuits which is necessary to realize the predetermined function may be formed using one substrate and another part of the circuits which is necessary to realize the predetermined function may be formed using another substrate. That is, not all of the circuits which are necessary to realize the predetermined function are required to be formed using the same substrate. For example, part of the circuits which is necessary to realize the predetermined function may be formed over a glass substrate using transistors and another part of the circuits which is necessary to realize the predetermined function may be formed using a single crystalline substrate, and an IC chip formed by a transistor using the single crystalline substrate may be connected to the glass substrate by COG (chip on glass) so that the IC chip is provided over the glass substrate. Alternatively, the IC chip can be connected to the glass substrate by TAB (tape automated bonding) or a printed wiring board. When part of the circuits is formed using the same substrate in such a manner, cost can be reduced by reduction in the number of component parts or reliability can be improved by reduction in the number of connections between circuit components. In addition, circuits in a portion with high driving voltage or a portion with high driving frequency consume large power. Accordingly, the circuits in such portions are formed using a single crystalline substrate, for example, instead of using the same substrate, and an IC chip formed by the circuit is used; thus, increase in power consumption can be prevented.

Note that one pixel corresponds to one element whose brightness can be controlled. For example, one pixel corresponds to one color element, and brightness is expressed with one color element. Accordingly, in the case of a color display device having color elements of R (red), G (green), and B (blue), the smallest unit of an image is formed of three pixels of an R pixel, a G pixel, and a B pixel. Note that the color elements are not limited to three colors, and color elements of more than three colors may be used and/or a color other than RGB may be used. For example, RGBW can be employed by adding W (white). Alternatively, RGB added with one or more colors of yellow, cyan, magenta, emerald green, vermilion, and the like can be used. Further alternatively, a color similar to at least one of R, G, and B can be added to RGB. For example, R, G, B1, and B2 may be used. Although both B1 and B2 are blue, they have slightly different frequencies. Similarly, R1, R2, Q and B can be used. By using such color elements, display which is closer to a real object can be performed, and power consumption can be reduced. As another example, when brightness of one color element is controlled by using a plurality of regions, one region can correspond to one pixel. For example, when area ratio gray scale display is performed or a subpixel is included, a plurality of regions which control brightness are provided in one color element and gray scales are expressed with all of the regions, and one region which controls brightness can correspond to one pixel. In that case, one color element is formed of a plurality of pixels. Alternatively, even when a plurality of the regions which control brightness are provided in one color element, these regions may be collected and one color element may be referred to as one pixel. In that case, one color element is formed of one pixel. In addition, when brightness of one color element is controlled by a plurality of regions, regions which contribute to display may have different area dimensions depending on pixels in some cases. Alternatively, in a plurality of the regions which control brightness in one color element, signals supplied to respective regions may slightly vary to widen a viewing angle. That is, potentials of pixel electrodes included in the plurality of the regions in one color element can be different from each other. Accordingly, voltages applied to liquid crystal molecules vary depending on the pixel electrodes. Thus, the viewing angle can be widened.

Note that when it is explicitly described as one pixel (for three colors), it corresponds to the case where three pixels of R, G, and B are considered as one pixel. When it is explicitly described as one pixel (for one color), it corresponds to the case where a plurality of the regions provided in each color element are collectively considered as one pixel.

Note that pixels are provided (arranged) in matrix in some cases. Here, description that pixels are provided (arranged) in matrix includes the case where the pixels are arranged in a straight line or in a jagged line in a longitudinal direction or a lateral direction. For example, when full-color display is performed with three color elements (e.g., RGB), the following cases are included therein: the case where the pixels are arranged in stripes, the case where dots of the three color elements are arranged in a delta pattern, and the case where dots of the three color elements are provided in Bayer arrangement. Note that the color elements are not limited to three colors, and color elements of more than three colors may be employed, for example, RGBW (W corresponds to white) or RGB added with one or more of yellow, cyan, magenta, and the like. In addition, the size of display regions may vary in respective dots of color elements. Thus, power consumption can be reduced or the life of a display element can be prolonged.

Note that an active matrix method in which an active element is included in a pixel or a passive matrix method in which an active element is not included in a pixel can be used.

In the active matrix method, as an active element (a non-linear element), various active elements (non-linear elements), such as a metal-insulator-metal (MIM) and a thin film diode (TFD) can be used as well as a transistor. Since such an element has a small number of manufacturing steps, manufacturing costs can be reduced or the yield can be improved. Further, since the size of the element is small, an aperture-ratio can be increased, and reduction in power consumption and high luminance can be achieved.

As a method other than the active matrix method, the passive matrix method in which an active element (a non-linear element) is not used can also be used. Since an active element (a non-linear element) is not used, the number of manufacturing steps is small, so that manufacturing costs can be reduced or the yield can be improved. Further, since an active element (a non-linear element) is not used, an aperture ratio can be increased, and reduction in power consumption and high luminance can be achieved.

Note that a transistor is an element having at least three terminals of a gate, a drain, and a source. The transistor includes a channel region between a drain region and a source region, and current can flow through the drain region, the channel region, and the source region. Here, since the source and the drain of the transistor may change depending on a structure, operating conditions, and the like of the transistor, it is difficult to define which is a source or a drain. Therefore, in this document (the specification, the claims, the drawings, and the like), a region functioning as a source and a drain is not called the source or the drain in some cases. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be referred to as a drain region.

In addition, a transistor may be an element having at least three terminals of a base, an emitter, and a collector. In this case also, one of the emitter and the collector may be referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to part of a conductive film which overlaps with a semiconductor forming a channel region with a gate insulating film interposed therebetween. Note that in some cases, part of the gate electrode overlaps with an LDD (lightly doped drain) region or a source region (or a drain region) with the gate insulating film interposed therebetween. A gate wiring corresponds to a wiring for connecting gate electrodes of transistors, a wiring for connecting gate electrodes included in pixels, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, when a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

Note that a portion (a region, a conductive film, a wiring, or the like) which is formed of the same material as a gate electrode and forms the same island as the gate electrode to be connected to the gate electrode may also be called a gate electrode. Similarly, a portion (a region, a conductive film, a wiring, or the like) which is formed of the same material as a gate wiring and forms the same island as the gate wiring to be connected to the gate wiring may also be called a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed of the same material as a gate electrode or a gate wiring and forms the same island as the gate electrode or the gate wiring to be connected to the gate electrode or the gate wiring in relation to a specification in manufacturing and the like. Thus, such a portion (a region, a conductive film, a wiring, or the like) may also be called either a gate electrode or a gate wiring.

In a multi-gate transistor, for example, a gate electrode is often connected to another gate electrode by using a conductive film which is formed of the same material as the gate electrode. Since such a portion (a region, a conductive film, a wiring, or the like) is for connecting the gate electrode and another gate electrode, it may be called a gate wiring, and it may also be called a gate electrode since a multi-gate transistor can be considered as one transistor. That is, a portion (a region, a conductive film, a wiring, or the like) which is formed of the same material as a gate electrode or a gate wiring and forms the same island as the gate electrode or the gate wiring to be connected to the gate electrode or the gate wiring may be called either a gate electrode or a gate wiring. In addition, part of a conductive film which connects the gate electrode and the gate wiring and is formed of a material different from that of the gate electrode or the gate wiring may also be called either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

When a wiring is called a gate wiring, a gate line, a gate signal line, a scan line, a scan signal line, or the like, there is the case where a gate of a transistor is not connected to the wiring. In this case, the gate wiring, the gate line, the gate signal line, the scan line, or the scan signal line corresponds to a wiring formed in the same layer as the gate of the transistor, a wiring formed of the same material as the gate of the transistor, or a wiring formed at the same time as the gate of the transistor in some cases. Examples of such a wiring include a wiring for storage capacitance, a power supply line, and a reference potential supply line.

A source corresponds to all or part of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, a so-called LDD (lightly doped drain) region is not included in the source region. A source electrode is part of a conductive layer formed of a material different from that of a source region and electrically connected to the source region. However, there is the case where a source electrode and a source region are collectively called a source electrode. A source wiring corresponds to a wiring for connecting source electrodes of transistors, a wiring for connecting source electrodes included in pixels, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, when a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

Note that a portion (a region, a conductive film, a wiring, or the like) which is formed of the same material as a source electrode and forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a region which is formed of the same material as a source wiring and forms the same island as the source wiring to be connected to the source wiring may also be called a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed of the same material as a source electrode or a source wiring and forms the same island as the source electrode or the source wiring to be connected to the source electrode or the source wiring in relation to a specification in manufacturing and the like. Thus, such a portion (a region, a conductive film, a wiring, or the like) may also be called either a source electrode or a source wiring.

For example, part of a conductive film which connects a source electrode and a source wiring and is formed of a material which is different from that of the source electrode or the source wiring may be called either a source electrode or a source wiring.

Note that a source terminal corresponds to part of a source region, a source electrode, or a portion (a region, a conductive film, a wiring, or the like) which is electrically connected to the source electrode.

When a wiring is called a source wiring, a source line, a source signal line, a data line, a data signal line, or the like, there is the case where a source (a drain) of a transistor is not connected to the wiring. In this case, the source wiring, the source line, the source signal line, the data line, or the data signal line corresponds to a wiring formed in the same layer as the source (the drain) of the transistor, a wiring formed of the same material as the source (the drain) of the transistor, or a wiring formed at the same time as the source (the drain) of the transistor in some cases. Examples of such a wiring include a wiring for storage capacitance, a power supply line, and a reference potential supply line.

Note that a drain is similar to the source.

Note that a semiconductor device corresponds to a device having a circuit including a semiconductor element (e.g., a transistor, a diode, or a thyristor). The semiconductor device may also refer to all devices which can function by utilizing semiconductor characteristics. Alternatively, the semiconductor device refers to a device including a semiconductor material.

A display element corresponds to an optical modulation element, a liquid crystal element, a light-emitting element, an EL element (an organic EL element, an inorganic EL element, or an EL element including both organic and inorganic materials), an electron emitter, an electrophoresis element, a discharging element, a light-reflecting element, a light diffraction element, a digital micromirror device (DMD), or the like. Note that the present invention is not limited thereto.

A display device corresponds to a device including a display element. The display device may include a plurality of pixels having a display element. The display device may include a peripheral driver circuit for driving a plurality of pixels. The peripheral driver circuit for driving a plurality of pixels may be formed over the same substrate as the plurality of pixels. The display device may also include a peripheral driver circuit provided over a substrate by wire bonding or bump bonding, that is, an IC chip connected by so-called chip on glass (COG), TAB, or the like. Further, the display device may also include a flexible printed circuit (FPC) to which an IC chip, a resistor, a capacitor, an inductor, a transistor, or the like is attached. The display device may also include a printed wiring board (PWB) which is connected through a flexible printed circuit (FPC) and the like and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, an optical sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling type or an air cooling type), or the like.

A lighting device corresponds to a device including a backlight unit, a light guide plate, a prism sheet, a diffusion sheet, a reflective sheet, a light source (e.g., an LED, a cold cathode fluorescent lamp, or a hot cathode fluorescent lamp), a cooling device, or the like.

A light-emitting device corresponds to a device including a light-emitting element or the like. A light-emitting device including a light-emitting element as a display element is a specific example of a display device.

A reflective device corresponds to a device including a light-reflecting element, a light diffraction element, a light reflecting electrode, or the like.

A liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like in its category.

A driving device corresponds to a device including a semiconductor element, an electric circuit, or an electronic circuit. Examples of the driving device include a transistor (also referred to as a selection transistor, a switching transistor, or the like) which controls input of a signal from a source signal line to a pixel, a transistor which supplies voltage or current to a pixel electrode, and a transistor which supplies voltage or current to a light-emitting element. Moreover, examples of the driving device include a circuit (also referred to as a gate driver, a gate line driver circuit, or the like) which supplies a signal to a gate signal line, and a circuit (also referred to as a source driver, a source line driver circuit, or the like) which supplies a signal to a source signal line.

Note that categories of a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

When it is explicitly described that B is formed on or over A, it does not necessarily mean that B is formed in direct contact with A. The description includes the case where A and B are not in direct contact with each other, that is, the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., the layer C or the layer D) may be a single layer or a plurality of layers.

Similarly, when it is explicitly described that B is formed above A, it does not necessarily mean that B is in direct contact with A, and another object may be interposed between A and B. For example, when it is explicitly described that a layer B is formed above a layer A, it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., the layer C or the layer D) may be a single layer or a plurality of layers.

When it is explicitly described that B is formed in direct contact with A, it includes the case where B is formed in direct contact with A and does not include the case where another object is interposed between A and B.

Note that the same can be said when it is explicitly described that B is formed below or under A.

Note that explicit singular forms are preferably singular forms. However, without being limited thereto, such singular forms can include plural forms. Similarly, explicit plural forms are preferably plural forms. However, without being limited thereto, such plural forms can include singular forms.

An SOI layer can be formed efficiently over a glass substrate which is larger in area than a silicon wafer; thus, efficiency in the use of the silicon wafer is improved, and manufacturing costs can be reduced. Moreover, since the amount of silicon wafers to be removed can be reduced, environmental burden can also be reduced. Further, since a transistor is arranged depending on a shape of a boundary of bonding, the SOI layer of the transistor is prevent from being divided; thus, yield can be improved.

DETAILED DESCRIPTION OF THE INVENTION

Figure 1A:
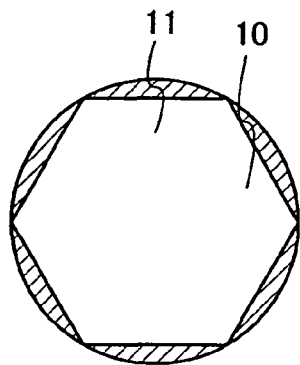
FIGS. 1A and 1B illustrate methods of manufacturing a semiconductor device according to the present invention.

Hereinafter, embodiment modes of the present invention will be described with reference to drawings. Note that the present invention can be implemented in various modes, and it is easily understood by those skilled in the art that modes and details can be variously changed without departing from the scope and the spirit of the present invention. Therefore, the present invention is not construed as being limited to description of the embodiment modes. Note that in structures of the present invention described below, reference numerals denoting the same components are used in common in different drawings, and detailed description of the same portions or portions having similar functions is omitted.

Embodiment Mode 1

First, a specific method in which a circular silicon wafer is cut into a polygonal shape to be used for forming an SOI layer (a semiconductor layer) is described. As the polygonal shape to be cut out, a regular hexagon can be typically used. With a regular hexagon or a shape similar to the regular hexagon, SOI layers can be laid in a planer manner. In particular, the polygonal shape to be cut out is preferably a regular hexagon since a portion to be removed can be made small (see FIGS. 1A and 1B).

Note that in this specification, being "laid" refers to being arranged with a certain gap. For example, when SOI layers are arranged using a circular semiconductor substrate, a gap between the SOI layers includes a circumferential portion; thus, a space therebetween is not constant, and the SOI layers cannot be laid.

FIG. 1A illustrates a state in which a semiconductor substrate 10 such as a silicon wafer is cut into a regular hexagonal region 11. Regions of the semiconductor substrate 10 other than the region 11 are portions to be removed, which can be made smaller when the region 11 is a regular hexagon. Note that when an orientation flat is included in the portions to be removed, a vertex of the regular hexagon can be prevented from being located at the orientation flat, which is a notch portion; thus, a regular hexagon to be cut out can be made larger. Further, when a direction of the orientation flat is made parallel to a side to be cut out, the side to be cut out can be adjusted to crystal orientation of the semiconductor substrate 10; thus, the regular hexagon can be cut out easily and accurately.

Figure 1B:
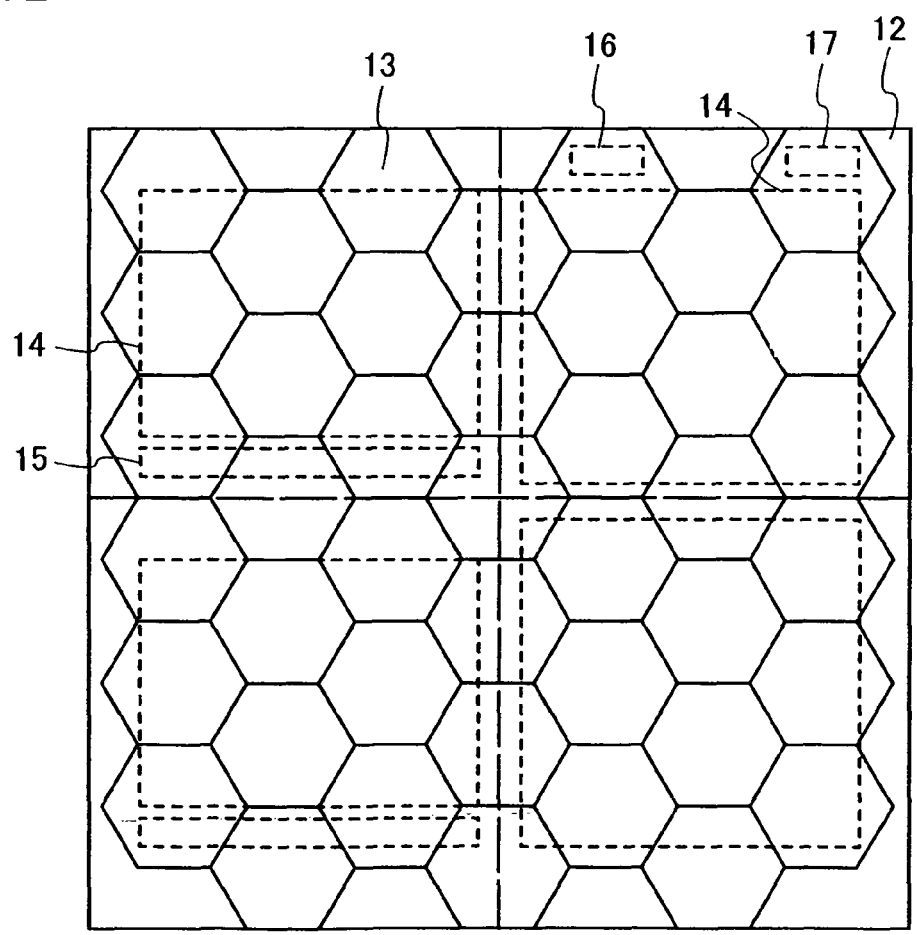

FIG. 1B illustrates a state in which SOI layers 13 are laid over a glass substrate 12 which is larger in area than the semiconductor substrate 10. The SOI layer 13 is formed in such a manner that a semiconductor substrate which is cut into the shape shown as the region 11 in FIG. 1A is attached to the glass substrate 12 and thereafter separated from the glass substrate 12. In FIG. 1B, one regular hexagon correspond to the SOI layer 13 formed by one processing for forming an SOI layer. When processing for forming an SOI layer is performed plural times, the SOI layers 13 can be laid in a planer manner over the glass substrate 12. A dashed-line rectangle in FIG. 1B represents a region to be a display portion 14 of a display device. Further, the dashed-line rectangle in FIG. 1B can be referred to as an outline of the display portion. Moreover, the dashed-line rectangle in FIG. 1B can be referred to as an imaginary defined (division) line. A plurality of hexagonal semiconductor substrates are arranged and attached to a rectangular substrate so that one side of the hexagonal semiconductor substrate is parallel to the imaginary defined (division) line and the one side of the hexagonal semiconductor substrate is parallel to one side of the nearest hexagonal semiconductor substrate. Furthermore, a substrate division line can also be referred to as an imaginary defined (division) line, and the following steps may be employed. A wafer is cut to form a hexagonal semiconductor substrate. An imaginary defined (division) line by which a rectangular substrate is defined (divided) into the number of display portions formed over the rectangular substrate is set. A plurality of hexagonal semiconductor substrates are arranged and attached to the rectangular substrate so that one side of the hexagonal semiconductor substrate is parallel to the imaginary defined (division) line and the one side of the hexagonal semiconductor substrate is parallel to one side of the nearest hexagonal semiconductor substrate. As shown in FIG. 1B, a peripheral portion of the region to be the display portion preferably includes a boundary or a vertex of the SOI layer. This is because display of an image can be prevented from being affected even if an element that does not exhibit normal characteristics is generated at the boundary of the SOI layers.

Note that an outer edge portion of the glass substrate 12 includes a region where an SOI layer is not formed, and it is preferable to form the display portion 14 so as not to include such a region.

Note that in a region where an SOI layer is formed among regions over the glass substrate 12 other than the display portion 14, a circuit 15 for driving an element included in the display portion 14 may be formed. Further, even in the outer edge portion of the glass substrate 12, a driver circuit for the element included in the display portion 14, such as a circuit 16 and a circuit 17, can be formed. The reason why the driver circuit with the small area, such as the circuit 16 and the circuit 17, can be realized is that the SOI layer can have single crystallinity or crystallinity similar to single crystallinity, and thus, a driver circuit with high-speed operation, high integration, and low power consumption can be formed even if the area is small.

As described above, this embodiment mode describes the case where a circular silicon wafer is cut into a regular hexagon. Note that a shape to be cut from the circular silicon wafer can be a variety of shapes without being limited to a regular hexagon. For example, even when a hexagon is not a regular hexagon, SOI layers can be laid in a planer manner as long as the shape is a hexagon with three pairs of parallel opposite sides (referred to as a shape similar to the regular hexagon). Moreover, when the shape is a parallelogram, a diamond, a trapezoid, an equilateral triangle, a right triangle, or the like, SOI layers can be laid in a planer manner.

Note that a large substrate may have a three-dimensional shape as well as a planer shape. For example, when a combination of a regular pentagon and a regular hexagon are employed, SOI layers can be laid over a substrate having a curved surface.

In addition, a large substrate may be a soft and flexible substrate such as a plastic substrate. Damage to the SOI layer due to being bent can be reduced by thinning the SOI layer. Further, when the SOI layer has a hexagonal shape or a shape similar to the hexagonal shape, stress applied to the SOI layer can be dispersed compared with a quadrangle or the like; thus, the SOI layer can be prevented from being easily separated when bent in a particular direction, for example.

As a specific method of cutting the semiconductor substrate 10, a grinding device or a dicing device which includes a diamond wheel or a metal wheel can be used. For example, when the semiconductor substrate 10 is cut from a 5-inch wafer, the maximum size can be a region with a 5-inch diagonal line.

As shown in FIG. 1B, the regular hexagonal SOI layers 13 are laid over the glass substrate 12 by the above-described method or the like, and thereafter, the laid SOI layers are patterned by a photolithography method or the like; thus, a plurality of semiconductor regions included in a variety of practical semiconductor devices (typically, a display portion of a display device) can be formed. At this time, basically, how SOI layers used for forming the semiconductor regions are formed cannot be known only from arrangement of a plurality of semiconductor regions. However, when crystal orientations of a plurality of semiconductor regions are compared with each other and semiconductor regions which have approximately the same crystal orientation and are located adjacent to each other are classified as the same group, it can be known to which SOI layer the plurality of semiconductor regions originally belong.

Specifically, crystal orientation of each semiconductor region is precisely examined by an X-ray diffraction method or the like, and semiconductor regions which have approximately the same crystal orientation and are located adjacent to each other are classified as the same group. In this case, as for the semiconductor region formed by laying the regular hexagonal SOI layers 13 over the glass substrate 12 as shown in FIG. 1B, for example, an outline of the same group is an approximately regular hexagonal shape. That is, a plurality of semiconductor regions can be classified into a plurality of groups of semiconductor regions each having the same crystal orientation, and a boundary of the plurality of groups has a shape such that a plurality of regular hexagons are arranged.

When a plurality of groups of semiconductor regions having different crystal orientations exist in one semiconductor device, variation of characteristics of the semiconductor regions due to the crystal orientation can be equalized. Specifically, when the semiconductor device is a display device, variation of display in the display portion can be equalized, and thus, display quality can be improved.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode.

Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 2

In this embodiment mode, effective arrangement of semiconductor regions included in the semiconductor device, which are formed by attaching and laying SOI layers as the example shown in Embodiment Mode 1, is described.

Since regular hexagonal SOI layers are laid in the example shown in Embodiment Mode 1, there is a boundary of SOI layers which has a slope that is not perpendicular or parallel to four sides of a substrate to which the SOI layers are attached (a large substrate such as a glass substrate, and hereinafter simply referred to as a large substrate). In such a case, when semiconductor regions included in the semiconductor device are arranged in accordance with the slope of the boundary, a possibility that a semiconductor region located at the boundary of SOI layers is used for a transistor can be reduced, and thus, yield of the semiconductor device can be improved.

Note that in this embodiment mode also, it is apparent that a shape of the SOI layer to be attached can be a variety of shapes as has been described in Embodiment Mode 1, without being limited to a regular hexagon.

Note that the slope of the boundary of the SOI layers is not limited to a slope with respect to four sides of a large substrate, and can depend on a variety of portions. For example, when the semiconductor device is a display device, the slope can depend on four sides of a display portion. Further, the slope can also depend on four sides of a display panel obtained by division of a large substrate or an outer edge portion of a peripheral driver circuit (e.g., a source driver or a gate driver) of the display portion, for example. Hereinafter, a standard for the slope of the boundary of the SOI layers is referred to as four sides or the like of a display portion for simplification.

The following description is an example of a specific arrangement method of semiconductor regions. First, the case is considered in which in a region serving as a standard of repeated patterns of semiconductor regions (a unit region, or a pixel region in the case of a display device), the semiconductor regions included in respective unit regions are located at the same or approximately the same position (see FIG. 2). Here, with a focused semiconductor region $S_{ij}$ used as a reference, a region between a group obtained by connecting the semiconductor region $S_{ij}$ and other semiconductor regions with a straight line and a group that is parallel and adjacent to the group is referred to as a boundary region. In the boundary region, an SOI layer is removed by etching, so that a semiconductor region is not included in the boundary region. Accordingly, when the boundary of the SOI layers is located in the boundary region, a possibility that a semiconductor region located at the boundary of SOI layers is used for a transistor can be reduced. Further, it is advantageous to make the boundary region as large as possible because the possibility can be further reduced. In the arrangement example shown in FIG. 2, directions of large boundary regions are the parallel direction and the perpendicular direction. Thus, in the arrangement example shown in FIG. 2, the boundary of the SOI layers is preferably parallel or perpendicular to four sides or the like of a display portion. A wafer is cut to form a hexagonal semiconductor substrate. A plurality of hexagonal semiconductor substrates are arranged over and attached to a rectangular substrate. A plurality of semiconductor regions are formed. A display portion provided with a plurality of pixels each including at least one semiconductor region and one pixel electrode which is electrically connected to the semiconductor region is formed. As shown in the arrangement example shown in FIG. 2, the plurality of semiconductor regions are formed in such a manner that a plurality of hexagonal semiconductor substrates are attached to the rectangular substrate and a boundary region of the adjacent hexagonal semiconductor substrates is provided between one semiconductor region and the next semiconductor region.

Here, a positive integer m and a positive integer n are the number of repetition of unit regions in the parallel direction and the perpendicular direction, respectively. For example, when the semiconductor device is a display device, the positive integer m can be the number of signal lines or a multiple of the number of signal lines, and the positive integer n can be the number of scan lines or a multiple of the number of scan lines. Each of the number i and the number j represents the position of a unit region, and is an integer satisfying $1 \leq i \leq m$ and $1 \leq j \leq n$. For example, when the semiconductor device is a display device, i can be the number of a signal line, and j can be the number of a scan line.

Next, the case is considered in which semiconductor regions included in respective unit regions which are located at approximately the same position are treated as the same unit region group (the same pixel group in the case of a display device), and a semiconductor region located at a different position is treated as a different unit region group.

Figure 3:
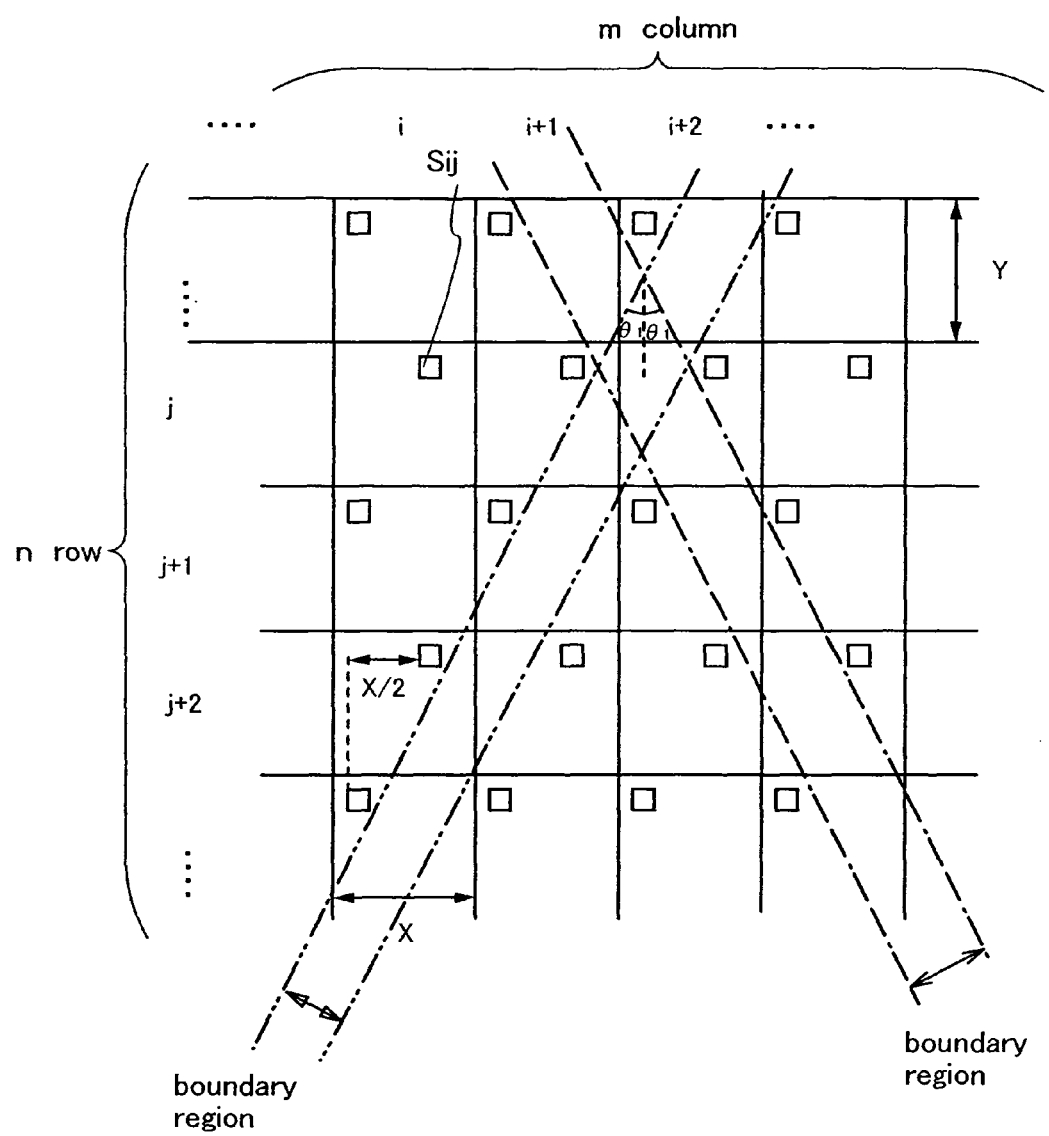
FIG. 3 illustrates a layout of a semiconductor device according to the present invention.

An arrangement example shown in FIG. 3 illustrates the case in which unit regions belonging to the same perpendicular position are regarded as a unit region group, and unit regions of one unit region group are alternately arranged in the perpendicular direction. For example, when the semiconductor device is a display device, FIG. 3 illustrates the case in which pixels connected to the same scan line is in the same pixel group and one pixel group and another pixel group are alternately arranged for one scan line.

As for a correlation of different unit region groups in the arrangement example shown in FIG. 3, the parallel position of each semiconductor region included in one unit region group is different from that in another unit region group by X/2 which is half of a repetition distance of unit regions (a pixel pitch in the case of a display device) X. In such a case, directions of increasing boundary regions are not only the parallel direction but also a direction having an angle $\theta_1$ with respect to the perpendicular side of the display portion. That is, in the arrangement example shown in FIG. 3, the boundary region can be made sufficiently large even when the a direction of a boundary of the SOI layers is not the parallel direction (is a direction having an angle $\theta_1$ with respect to the perpendicular side of the display portion). Accordingly, a possibility that a semiconductor region located at the boundary of SOI layers is used for a transistor can be reduced, and thus, yield of the semiconductor device can be improved. A wafer is cut to form a hexagonal semiconductor substrate. A plurality of hexagonal semiconductor substrates are arranged over and attached to a rectangular substrate. A plurality of semiconductor regions are formed. A display portion provided with a plurality of pixels each including at least one semiconductor region and one pixel electrode which is electrically connected to the semiconductor region is formed. As shown in the arrangement example shown in FIG. 3, the plurality of semiconductor regions are formed in such a manner that a plurality of hexagonal semiconductor substrates are attached to the rectangular substrate and a boundary region of the adjacent hexagonal semiconductor substrates is provided between one semiconductor region and the next semiconductor region.

Note that a direction of increasing boundary regions depends on an aspect ratio (here, a ratio of a shorter side to a longer side) of a unit region or a pixel region. Accordingly, when the aspect ratio of the unit region or the pixel region is optimized in accordance with a direction of the boundary of the SOI layers, more precise angle alignment can be performed in accordance with the direction of the boundary of the SOI layers, and a larger boundary region can be obtained. In particular, when regular hexagons are laid as shown in FIGS. 1A and 1B, $\theta_1$ is 30°, and accordingly, the aspect ratio of the pixel region is preferably $X:Y=1:\sqrt{3}$.

Note that here, the case is described in which the parallel position of each semiconductor region included in one unit region group is different from that in another unit region group by X/2 which is half of the repetition distance of unit regions (the pixel pitch in the case of a display device) X; however, a specific distance is not limited thereto, and varied arrangement can be employed. For example, when three unit region groups in each of which the position of the semiconductor region is different by X/3 between three unit region groups are sequentially arranged, more precise angle alignment can be performed in accordance with the direction of the boundary of the SOI layers. Further, the case of four or more groups is similar thereto.

Figure 2:
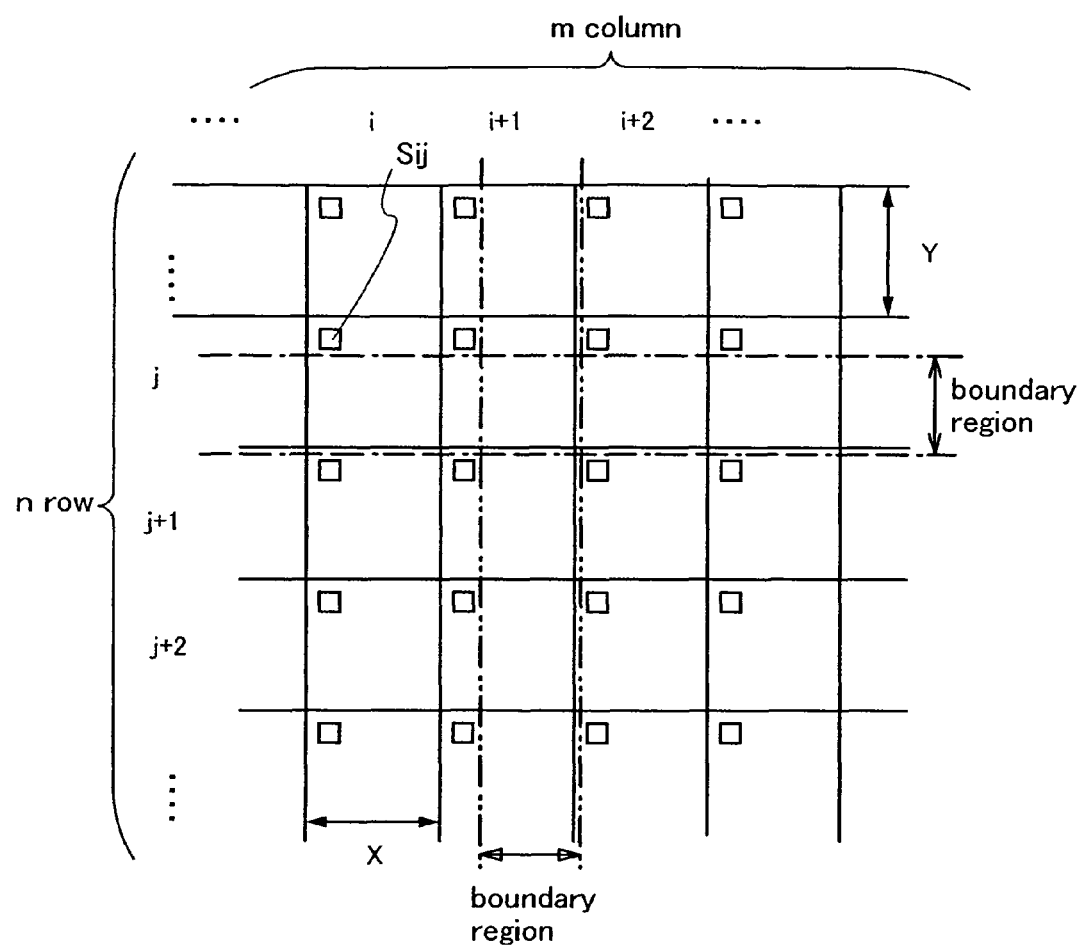
FIG. 2 illustrates a layout of a semiconductor device according to the present invention.

Next, an arrangement example appropriate for the case where it is difficult to obtain an optimal boundary region with the arrangement example shown in FIG. 2 or FIG. 3 because of a direction of the boundary of the SOI layers is described. For example, when the direction of the boundary of the SOI layers is 45° or more with respect to the perpendicular side of the display portion, it is difficult to obtain an optimal boundary region with the arrangement example shown in FIG. 2 or FIG. 3. An arrangement example shown in FIG. 4 is sometimes appropriate for such a case.

Figure 4:
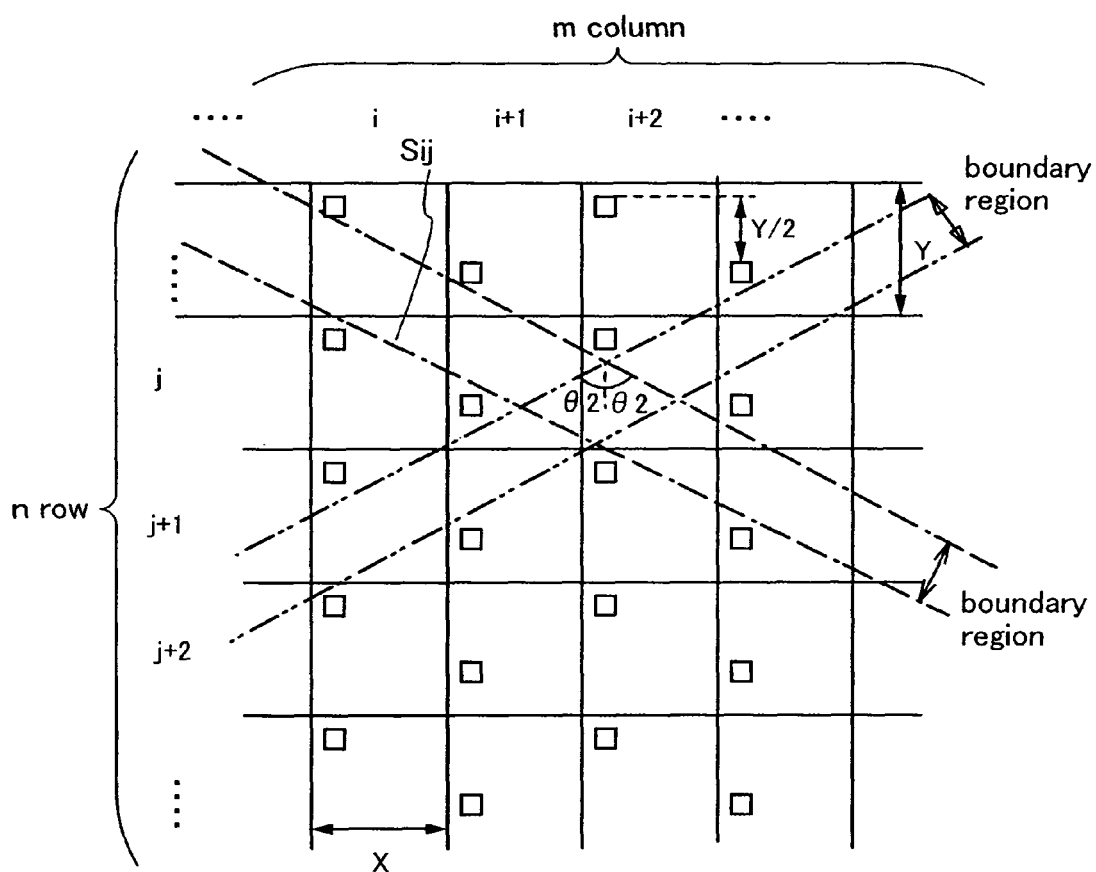
FIG. 4 illustrates a layout of a semiconductor device according to the present invention.

An arrangement example shown in FIG. 4 illustrates the case in which unit regions belonging to the same parallel position are regarded as a unit region group, and unit regions of one unit region group are alternately arranged in the parallel direction. For example, when the semiconductor device is a display device, FIG. 4 illustrates the case in which pixels connected to the same signal line is in the same pixel group and one pixel group and another pixel group are alternately arranged for one signal line.

As for a correlation of different unit region groups in the arrangement example shown in FIG. 4, the perpendicular position of each semiconductor region included in one unit region group is different from that in another unit region group by Y/2 which is half of a repetition distance of unit regions (a pixel pitch in the case of a display device) Y. In such a case, directions of increasing boundary regions are not only the perpendicular direction but also a direction having an angle $\theta_2$ that is larger than 45° with respect to the perpendicular side of the display portion. That is, in the arrangement example shown in FIG. 4, the boundary region can be made sufficiently large even when the a direction of a boundary of the SOI layers is a direction having an angle of more than 45° with respect to the perpendicular side of the display portion. Accordingly, a possibility that a semiconductor region located at the boundary of SOI layers is used for a transistor can be reduced, and thus, yield of the semiconductor device can be improved.

Note that in the arrangement example shown in FIG. 4 also, with the use of the aspect ratio of the unit region or the pixel region and the different number of unit region groups, more precise angle alignment can be performed in accordance with the direction of the boundary of the SOI layers. In particular, when the regular hexagons shown in FIGS. 1A and 1B are rotated 90° and laid, $\theta_2$ is 60°, and accordingly, the aspect ratio of the pixel region is preferably $X:Y=\sqrt{3}/2:1$.

In addition, in the arrangement example shown in FIGS. 2 to 4, it is possible to shift unit regions themselves so as to obtain boundary regions. For example, when pixels are arranged in a delta pattern or the like by shifting pixel regions in a display portion of a display device, a large boundary region can be obtained. When pixels are arranged in a delta pattern, display quality of a display device in which moving images are mainly displayed can be improved. Note that pixel arrangement in a delta pattern can also be realized by shifting pixel electrodes formed above transistors without shifting unit regions themselves. In this case, it is preferable to improve planarity by formation of an insulating film containing an organic material over the transistor so that a three-dimensional shape of the pixel electrode is not changed much by a structure of an object arranged under the pixel electrode.

Next, an arrangement example of semiconductor regions appropriate for the case where a boundary of SOI layers can have a plurality of directions with respect to one display portion, such as the case where the boundary of the SOI layers is a regular hexagon or a shape similar to the regular hexagon as shown in Embodiment Mode 1, is described.

Figure 5:
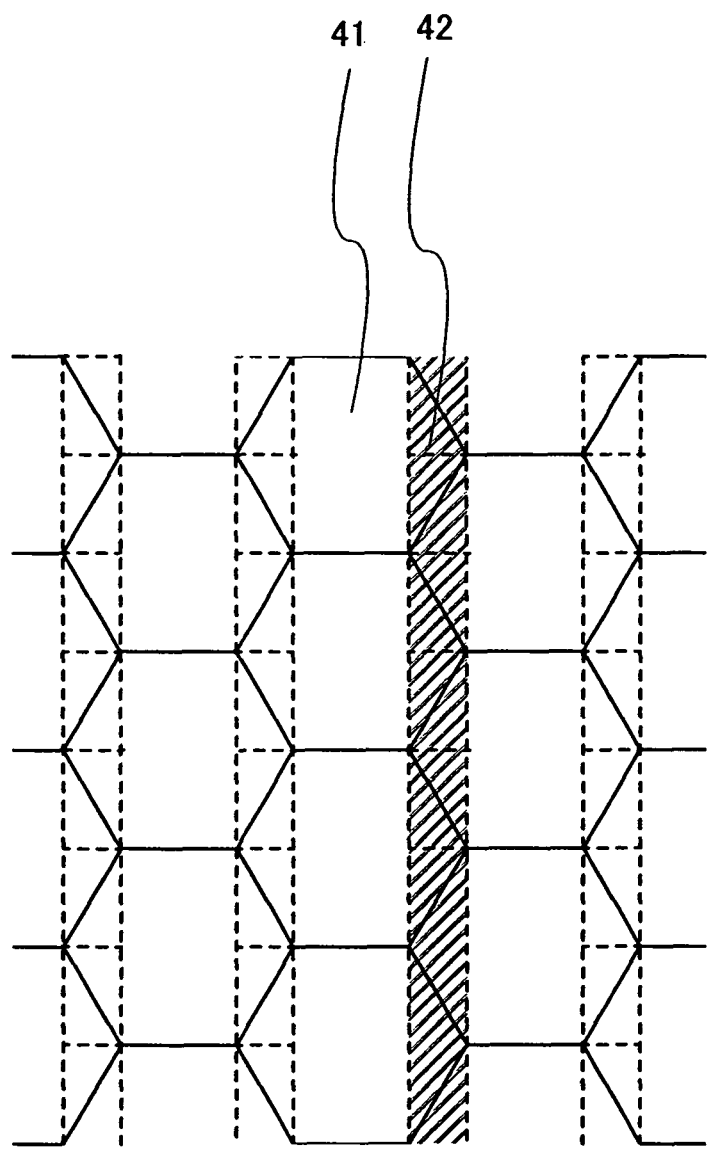
FIG. 5 illustrates a method of determining a layout of a semiconductor device according to the present invention.

When the boundary of the SOI layers has a plurality of directions with respect to one display portion, regions are divided so that the boundary of the SOI layers only has particular directions as shown in FIG. 5. In an example of FIG. 5, the display portion is divided into a region 41 and a region 42. In the region 41, there are only boundaries of the SOI layers which are perpendicular or parallel to four sides or the like of the display portion. On the other hand, in the region 42, there are only boundaries of the SOI layers having a certain angle with respect to the four sides or the like of the display portion.

In the region 41, the boundaries of the SOI layers are arranged so as to have a large boundary region in a direction perpendicular or parallel to the four sides or the like of the display portion. For example, as shown in FIG. 2, the semiconductor regions S can be arranged in matrix. In the region 42, the boundaries of the SOI layers are arranged so as to have a large boundary region in a direction having a certain angle with respect to the four sides or the like of the display portion. For example, as shown in FIG. 3 or FIG. 4, the semiconductor regions S can be arranged so as to be shifted per one row or one column. Accordingly, when arrangement of the semiconductor regions are changed as appropriate in accordance with the boundaries of the SOI layers, an optimal boundary region depending on each boundary can be obtained. Thus, a possibility that a semiconductor region located at the boundary of the SOI layers is used for a transistor can be reduced, and yield of the semiconductor device can be improved.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode.

Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 3

Figure 6A:
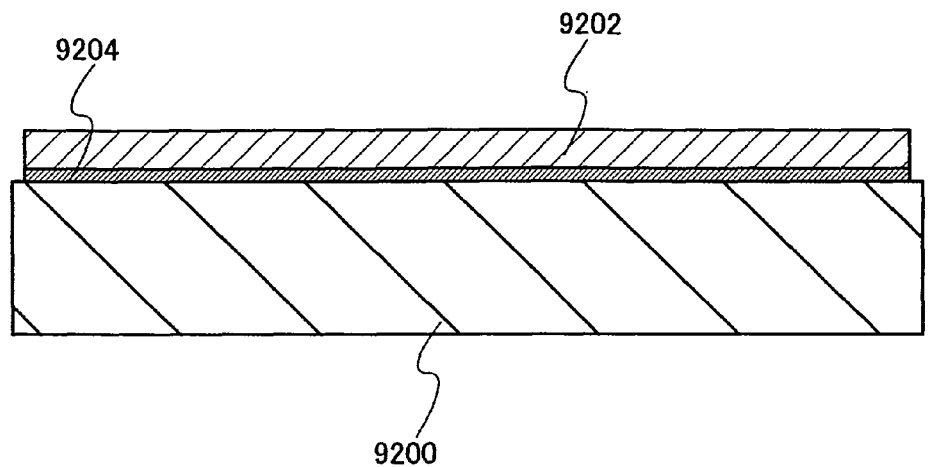
FIGS. 6A and 6B illustrate a method of manufacturing a semiconductor device according to the present invention.
Figure 6B:
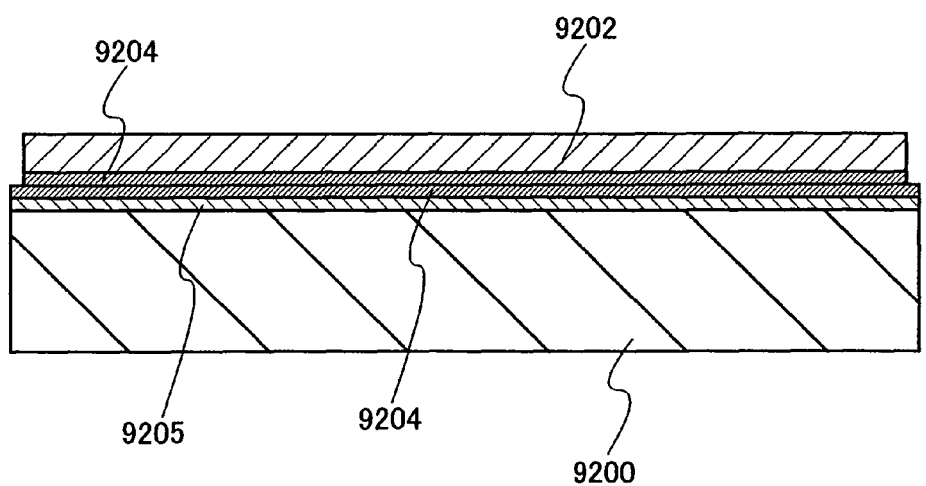

FIGS. 6A and 6B each show an SOI substrate according to the present invention. In FIG. 6A, a base substrate 9200 is a substrate having an insulating surface or an insulating substrate, and any of various glass substrates which are used in the electronics industry, such as an aluminosilicate glass substrate, an aluminoborosilicate glass substrate, and a barium borosilicate glass substrate, can be used. Alternatively, a quartz glass substrate or a semiconductor substrate such as a silicon wafer can be used. An SOI layer 9202 is a single-crystal semiconductor, and single-crystal silicon is typically used. Further alternatively, a crystalline semiconductor layer formed of silicon, germanium, or a compound semiconductor which can be separated from a single-crystal semiconductor substrate or a polycrystalline semiconductor substrate by a hydrogen ion implantation separation method can be used.

Between the base substrate 9200 and the SOI layer 9202 described above, a bonding layer 9204 which has a smooth surface and forms a hydrophilic surface is provided. A silicon oxide film is suitable for the bonding layer 9204. In particular, a silicon oxide film formed using an organic silane gas by a chemical vapor deposition method is preferable. As an organic silane gas, a silicon-containing compound such as tetraethoxysilane (TEOS: $Si(OC_2H_5)_4$), tetramethylsilane (TMS: $Si(CH_3)_4$), tetramethylcyclotetrasiloxahe (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$) can be used.

The bonding layer 9204 which has a smooth surface and forms a hydrophilic surface is provided with a thickness of 5 to 500 nm. With such a thickness, roughness of a surface on which the bonding layer 9204 is formed can be smoothed, and smoothness of the bonding layer 9204 can be ensured. Moreover, distortion between the substrate and the SOI layer which are bonded to each other can be reduced. The base substrate 9200 may be provided with a similar silicon oxide film. That is, in the case where the SOI layer 9202 is bonded to the base substrate 9200, which is a substrate having an insulating surface or an insulating substrate, the base substrate 9200 and the SOI layer 9202 can be firmly bonded to each other when the bonding layer 9204 formed of a silicon oxide film which is preferably formed using organic silane as a material is provided on one or both surfaces of the base substrate 9200 and the SOI layer 9202 which are to be bonded.

FIG. 6B shows a structure in which the base substrate 9200 is provided with a barrier layer 9205 and the bonding layers 9204. When the SOI layer 9202 is bonded to the base substrate 9200, the SOI layer 9202 can be prevented from being contaminated by diffusion of impurities such as mobile ions like alkali metal or alkaline earth metal from a glass substrate used as the base substrate 9200. The bonding layer 9204 may be provided on the base substrate 9200 side as appropriate.

Figure 7A:
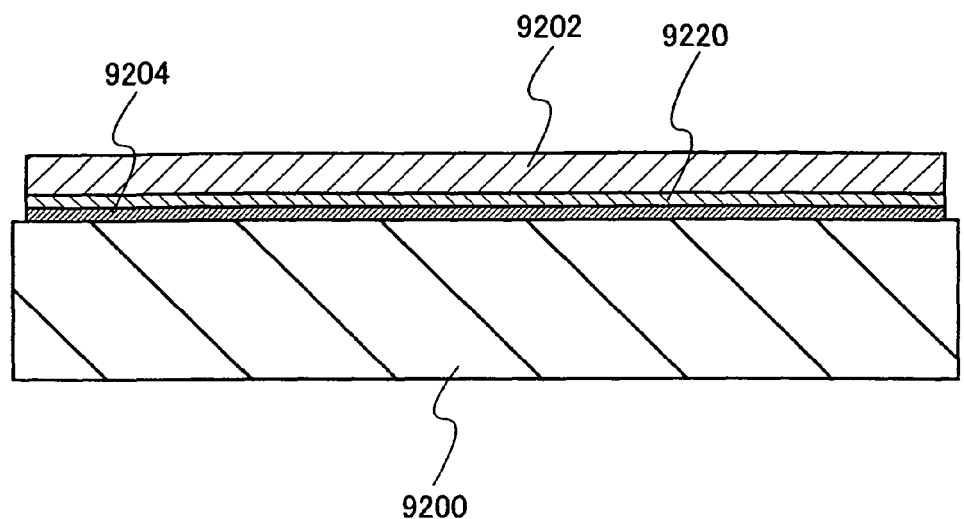
FIGS. 7A and 7B illustrate a method of manufacturing a semiconductor device according to the present invention.

FIG. 7A shows a structure in which a nitrogen-containing insulating layer 9220 is provided between the SOI layer 9202 and the bonding layer 9204. The nitrogen-containing insulating layer 9220 is formed by stacking one or a plurality of films selected from a silicon nitride film, a silicon nitride oxide film, or a silicon oxynitride film. For example, the nitrogen-containing insulating layer 9220 can be formed by stacking a silicon oxynitride film and a silicon nitride oxide film from the SOI layer 9202 side. The bonding layer 9204 is provided in order to form a bond with the base substrate 9200, whereas the nitrogen-containing insulating layer 9220 is preferably provided in order to prevent the SOI layer 9202 from being contaminated by diffusion of impurities such as mobile ions or moisture.

Note that a silicon oxynitride film corresponds to a film which contains much oxygen than nitrogen, and in the case where measurement is performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film corresponds to a film which contains much nitrogen than oxygen and includes oxygen, nitrogen, silicon, and hydrogen at concentrations ranging from 5 to 30 at. %, 20 to 55 at %, 25 to 35 at. %, and 10 to 30 at. %, respectively in the case where measurement is performed using RBS and HFS. Note that percentages of nitrogen, oxygen, silicon, and hydrogen fall within the ranges given above, where the total number of atoms contained in the silicon oxynitride film or the silicon nitride oxide film is defined as 100 at. %.

Figure 7B:
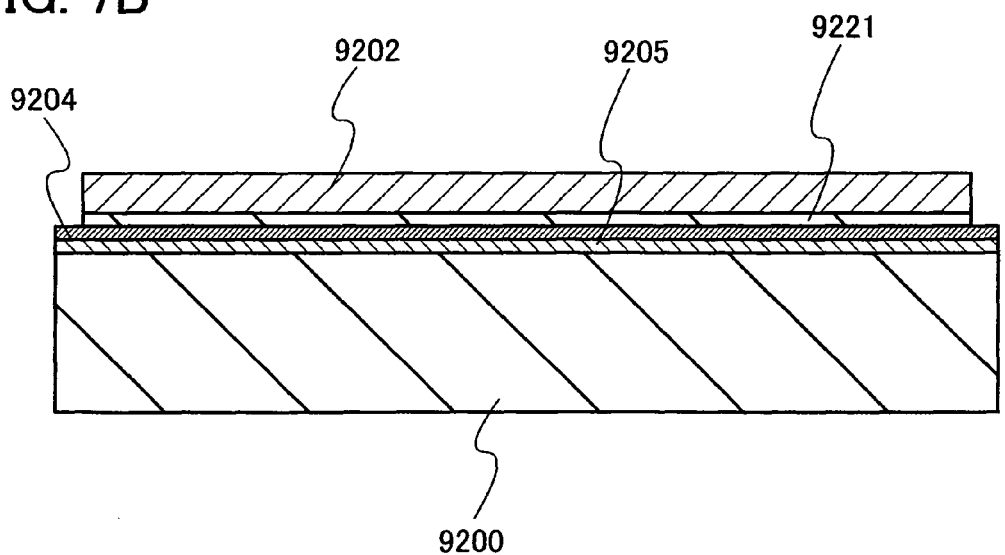

FIG. 7B shows a structure in which the base substrate 9200 is provided with the bonding layer 9204. Between the base substrate 9200 and the bonding layer 9204, the barrier layer 9205 is preferably provided. The barrier layer 9205 is provided in order to prevent the SOI layer 9202 from being contaminated by diffusion of impurities such as mobile ions like alkali metal or alkaline earth metal from a glass substrate used as the base substrate 9200. Further, the SOI layer 9202 is provided with a silicon oxide film 9221. The silicon oxide film 9221 forms a bond with the bonding layer 9204 to fix the SOI layer 9202 over the base substrate 9200. The silicon oxide film 9221 is preferably formed by thermal oxidation. Alternatively, similar to the bonding layer 9204, the silicon oxide film 9221 may be formed by a chemical vapor deposition method using TEOS. Further alternatively, chemical oxide can be used for the silicon oxide film 9221. Chemical oxide can be formed by, for example, performing treatment on a surface of a semiconductor substrate with ozone-containing water. Chemical oxide is preferable because it reflects flatness of the surface of the semiconductor substrate.

A method for manufacturing such an SOI substrate is described with reference to FIGS. 8A to 8C and FIG. 9.

Figure 8A:
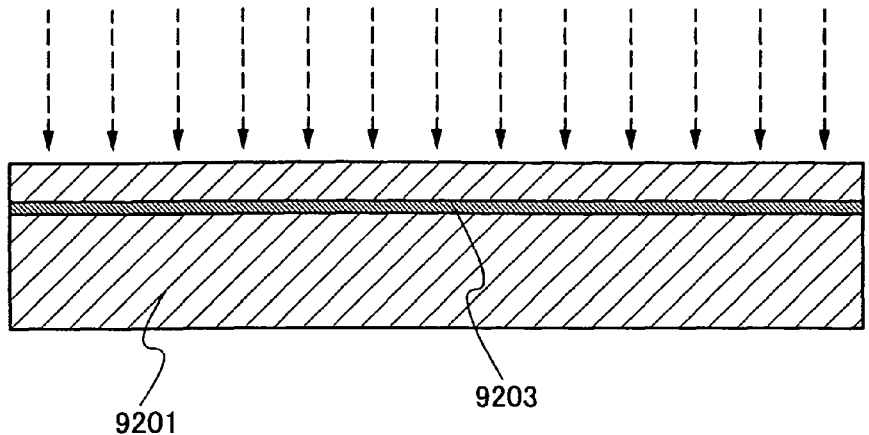
FIGS. 8A to 8C illustrate a method of manufacturing a semiconductor device according to the present invention.

A semiconductor substrate 9201 shown in FIG. 8A is cleaned, and a surface of the semiconductor substrate 9201 is irradiated with ions which are accelerated by an electric field to a predetermined depth from the surface to form a separation layer 9203. Ion irradiation is performed in consideration of the thickness of an SOI layer which is to be transferred to a base substrate. The thickness of the SOI layer is 5 to 500 nm, preferably 10 to 200 nm. Accelerating voltage for ion irradiation is set in consideration of such a thickness. The separation layer is formed by ion irradiation with hydrogen, helium, or halogen typified by fluorine. In this case, it is preferable to perform irradiation with one or a plurality of ions of the same atoms having different mass numbers. In the case of hydrogen ion irradiation, the hydrogen ions preferably include $H^+$, $H_2^+$, and $H_3^+$ ions with a high proportion of $H_3^+$ ions. In the case of hydrogen ion irradiation, when the hydrogen ions include $H^+$, $H_2^+$, and $H_3^+$ with a high proportion of $H_3^+$ ions, efficiency can be increased, and irradiation time can be shortened. With such a structure, separation in a subsequent step can be easily performed.

Since it is necessary to perform ion irradiation at a high dose, the surface of the semiconductor substrate 9201 is roughened in some cases. Accordingly, a protective film against ion irradiation may be provided on a surface irradiated with ions by using a silicon nitride film, a silicon nitride oxide film, or the like with a thickness of 50 to 200 nm.

Figure 8B:
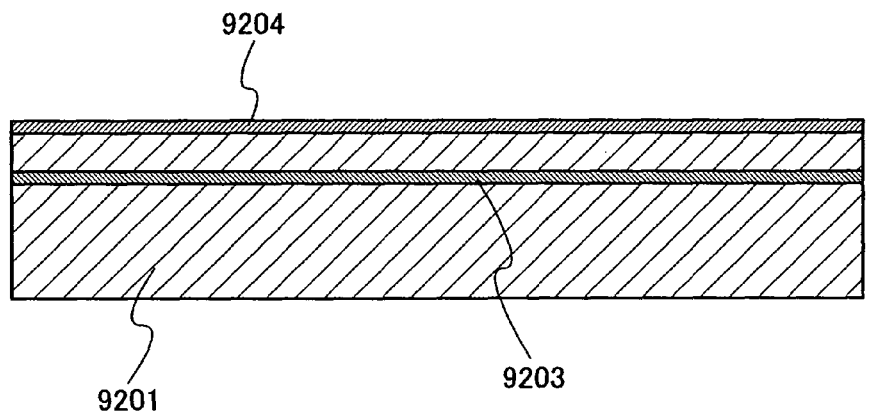

Next, as shown in FIG. 8B, a silicon oxide film is formed as the bonding layer 9204 over a surface to which the base substrate is bonded. As the silicon oxide film, a silicon oxide film formed by a chemical vapor deposition method using an organic silane gas as described above is preferably used. Alternatively, a silicon oxide film formed by a chemical vapor deposition method using a silane gas can be used. In film formation by a chemical vapor deposition method, a film formation temperature of, for example, 350° C. or lower, at which degassing of the separation layer 9203 formed in the single-crystal semiconductor substrate does not occur, is employed. Heat treatment for separating an SOI layer from a single-crystal or polycrystalline semiconductor substrate is performed at a higher temperature than the film formation temperature.

Figure 8C:
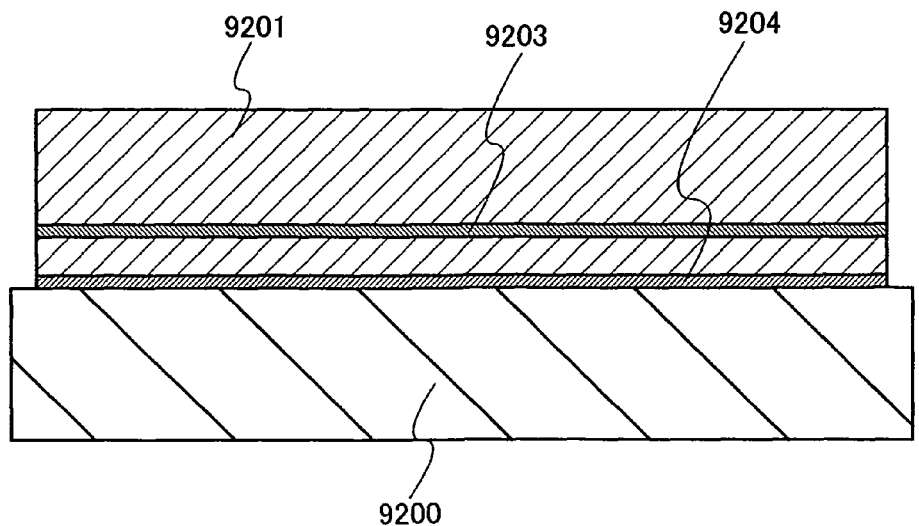

FIG. 8C shows a mode in which the base substrate 9200 and a surface of the semiconductor substrate 9201, on which the bonding layer 9204 is formed, are disposed in close contact to be bonded to each other. The surfaces which are to be bonded are cleaned sufficiently. Then, when the base substrate 9200 and the bonding layer 9204 are disposed in close contact, a bond is formed. Van der Waals force acts on this bond. By making the base substrate 9200 and the semiconductor substrate 9201 face each other and pressing at least one part thereof from the outside, a distance between the bonding surfaces is locally reduced. Accordingly, van der Waals force is increased, and further, the base substrate 9200 and the semiconductor substrate 9201 attract each other and are bonded also due to contribution of hydrogen bonding. Furthermore, since the distance between the opposed substrates is also reduced in an adjacent region, a region in which van der Waals force strongly acts or a region which is contributed by hydrogen bonding is widened; thus, bonding proceeds and spreads to the entire bonding surfaces.

In order to form a favorable bond, the surfaces which are to form a bond may be activated. For example, the surfaces which are to form a bond are irradiated with an atomic beam or an ion beam. When an atomic beam or an ion beam is used, an inert gas neutral atom beam or an inert gas ion beam of argon or the like can be used. In addition, plasma irradiation or radical treatment is performed. With such surface treatment, a bond between different kinds of materials can be easily formed even at a temperature of 200 to 400° C.

After the base substrate 9200 and the semiconductor substrate 9201 are bonded to each other with the bonding layer 9204 interposed therebetween, heat treatment or pressure treatment is preferably performed. When heat treatment or pressure treatment is performed, bonding strength can be increased. Temperature of heat treatment is preferably lower than or equal to the upper temperature limit of the base substrate 9200. Pressure treatment is performed so that pressure is applied in a perpendicular direction to the bonded surface, in consideration of pressure resistance of the base substrate 9200 and the semiconductor substrate 9201.

Figure 9:
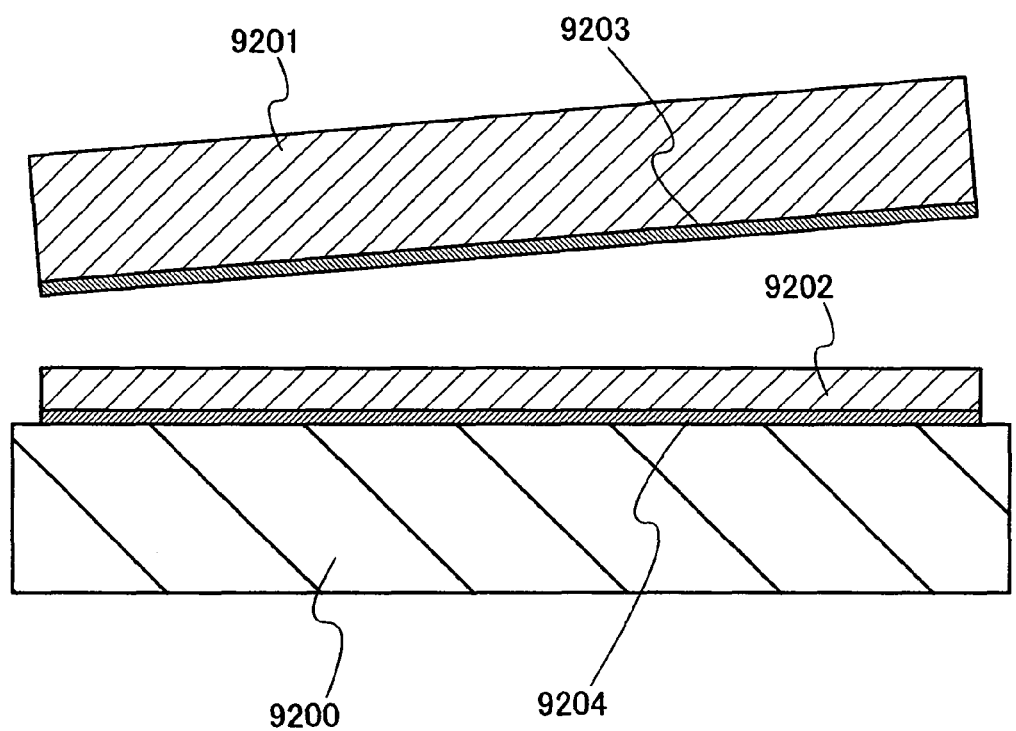
FIG. 9 illustrates a method of manufacturing a semiconductor device according to the present invention.

In FIG. 9, after the base substrate 9200 and the semiconductor substrate 9201 are bonded to each other, heat treatment is performed to separate the semiconductor substrate 9201 from the base substrate 9200 along a cleavage plane inside the separation layer 9203 or at the top interface or the bottom interface of the separation layer 9203. The heat treatment is preferably performed at a temperature ranging from the film formation temperature of the bonding layer 9204 to the upper temperature limit of the base substrate 9200. For example, when the heat treatment is performed at 400 to 600° C., the volume of microvoids formed in the separation layer 9203 is changed, so that cleavage can be performed along the inside of the separation layer 9203 or the top interface or the bottom interface of the separation layer 9203. Since the bonding layer 9204 is bonded to the base substrate 9200, the SOI layer 9202 having the same crystallinity as the semiconductor substrate 9201 remains over the base substrate 9200.

Figure 10A:
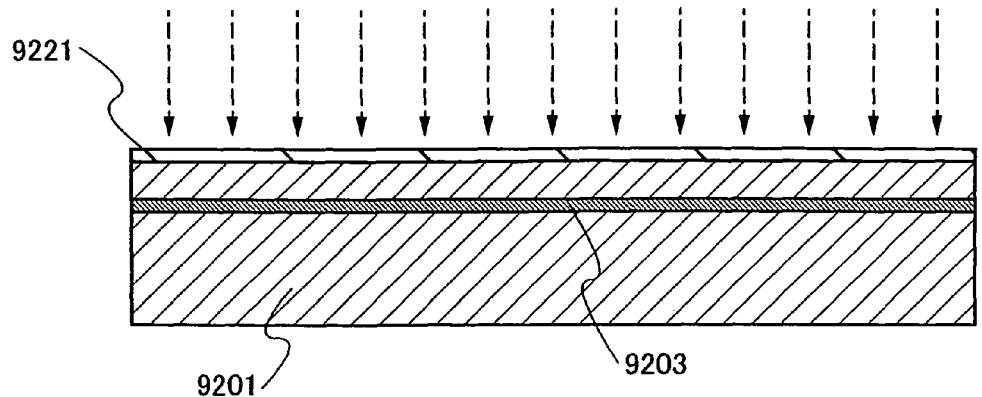
FIGS. 10A to 10C illustrate a method of manufacturing a semiconductor device according to the present invention.
Figure 10B:
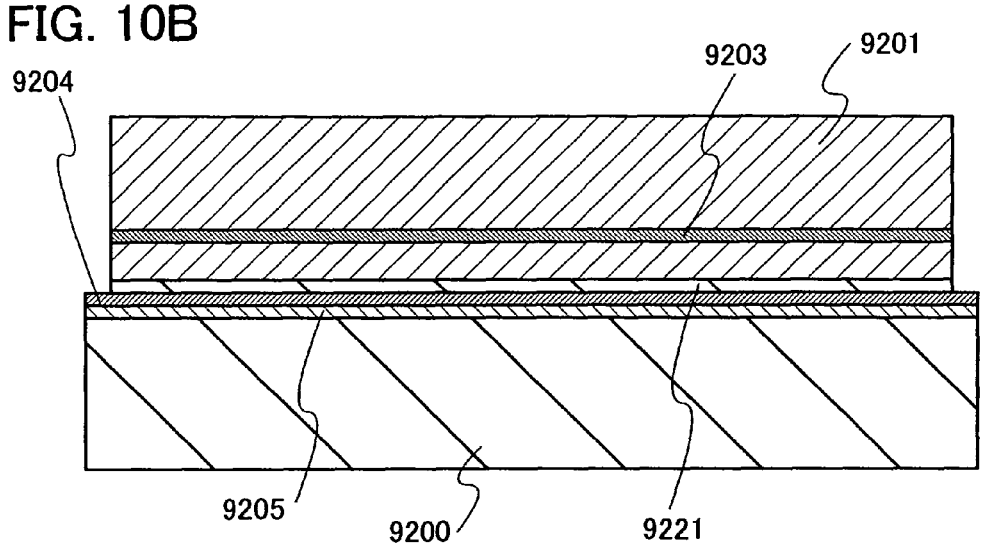
Figure 10C:
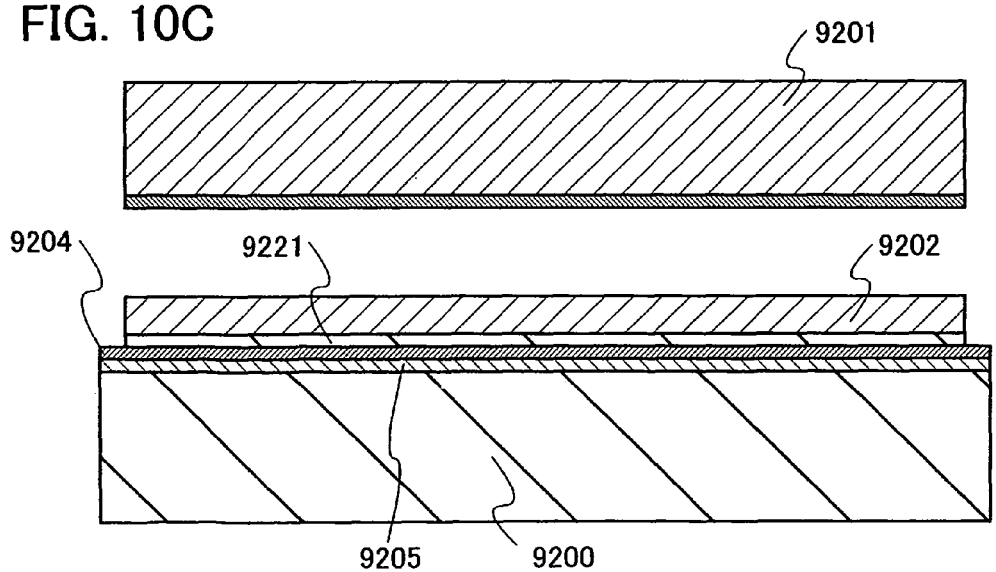

FIGS. 10A to 10C show steps of forming an SOI layer with a bonding layer provided on a base substrate side. FIG. 10A shows a step in which the semiconductor substrate 9201 provided with the silicon oxide film 9221 is irradiated with ions accelerated by an electric field to a predetermined depth to form the separation layer 9203. Ion irradiation with hydrogen, helium, or halogen typified by fluorine is performed in a manner similar to that of the case shown in FIG. 8A. When the silicon oxide film 9221 is formed on the surface of the semiconductor substrate 9201, the surface of the semiconductor substrate 9201 can be prevented from being damaged by ion irradiation using an ion doping apparatus and from losing its flatness.

FIG. 10B shows a step in which the base substrate 9200 provided with the barrier layer 9205 and the bonding layer 9204; and a surface of the semiconductor substrate 9201, on which the silicon oxide film 9221 is formed, are disposed in close contact to be bonded to each other. The bond is formed when the bonding layer 9204 over the base substrate 9200 is disposed in close contact with the silicon oxide film 9221 formed on the semiconductor substrate 9201.

After that, as shown in FIG. 10C, the semiconductor substrate 9201 is separated. Heat treatment for separating the semiconductor substrate is performed in a manner similar to that of the case shown in FIG. 9. In this manner, the SOI substrate shown in FIG. 7B can be obtained.

In such a manner, in accordance with this embodiment mode, even if a substrate with an upper temperature limit of 700° C. or lower, such as a glass substrate, is used as the base substrate 9200, the SOI layer 9202 having strong adhesiveness of a bonded portion can be obtained. As the base substrate 9200, any of various glass substrates which are used in the electronics industry and are referred to as non-alkali glass substrates, such as an aluminosilicate glass substrate, an aluminoborosilicate glass substrate, and a barium borosilicate glass substrate, can be used. That is, a single-crystal semiconductor layer can be formed over a substrate which is longer than one meter on a side. When such a large-area substrate is used, not only a display device such as a liquid crystal display but also a semiconductor integrated circuit can be manufactured.

Figure 11A:
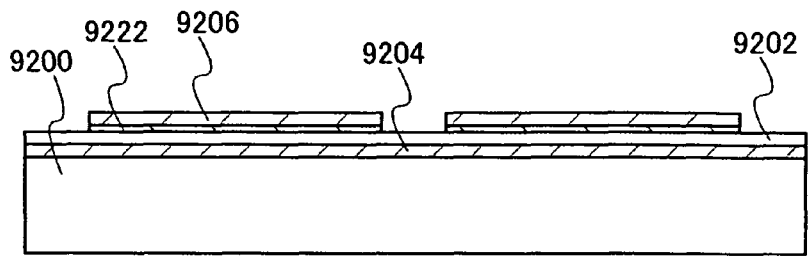
FIGS. 11A to 11E illustrate a method of manufacturing a semiconductor device according to the present invention.

Next, a semiconductor device including an SOI substrate is described with reference to FIGS. 11A to 11E and FIGS. 12A and 12B. In FIG. 11A, the SOI layer 9202 is provided over the base substrate 9200 with the bonding layer 9204 interposed therebetween. A silicon nitride layer 9222 and a silicon oxide layer 9206 are formed over the SOI layer 9202 in accordance with an element formation region. The silicon oxide layer 9206 is used as a hard mask when the SOI layer 9202 is etched for element separation. The silicon nitride layer 9222 serves as an etching stopper.

The thickness of the SOI layer 9202 is 5 to 500 nm, preferably 10 to 200 nm. The thickness of the SOI layer 9202 can be set as appropriate by controlling the depth of the separation layer 9203 described in FIGS. 8A to 8C. In order to control the threshold voltage, a p-type impurity such as boron, aluminum, or gallium is added to the SOI layer 9202. For example, boron may be added as a p-type impurity at a concentration of $5 \times 10^{17}$ to $1 \times 10^{18}$ $cm^{-3}$.

Figure 11B:
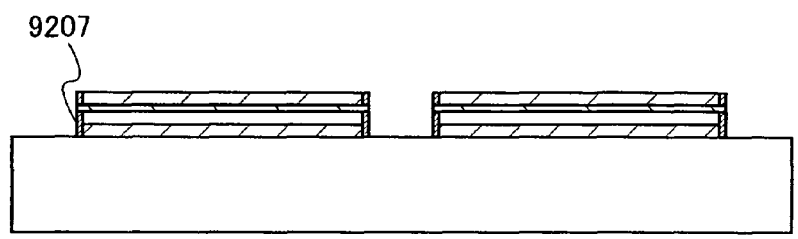

FIG. 11B shows a step of etching the SOI layer 9202 and the bonding layer 9204 with the use of the silicon oxide layer 9206 as a mask. Exposed end surfaces of the SOI layer 9202 and the bonding layer 9204 are nitrided by plasma treatment. By this nitridation treatment, a silicon nitride layer 9207 is formed at least at a peripheral end portion of the SOI layer 9202. The silicon nitride layer 9207 has insulating properties and has an effect of preventing leakage current from flowing through an end surface of the SOI layer 9202. Moreover, since the silicon nitride layer 9207 has resistance to oxidation, it can prevent an oxide film from growing from the end surface into a bird's beak between the SOI layer 9202 and the bonding layer 9204.

Figure 11C:
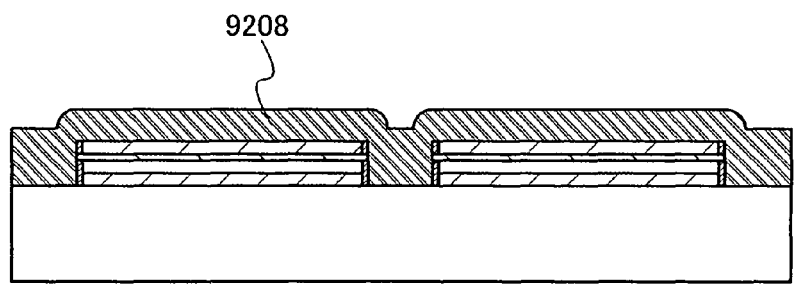

FIG. 11C shows a step of depositing an element separation insulating layer 9208. As the element separation insulating layer 9208, a silicon oxide film is deposited using TEOS by a chemical vapor deposition method. The element separation insulating layer 9208 is deposited thickly so that the SOI layer 9202 is buried.

Figure 11D:
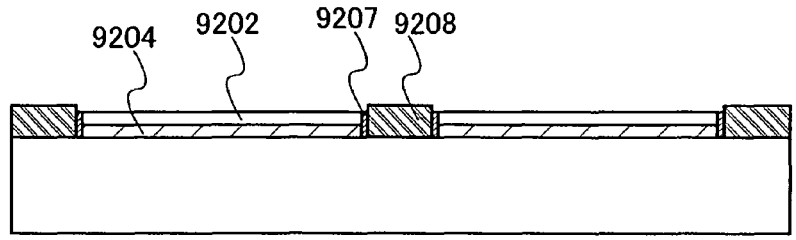

FIG. 11D shows a step of removing the element separation insulating layer 9208 until the silicon nitride layer 9222 is exposed. The removing step can be performed by dry etching or chemical mechanical polishing. The silicon nitride layer 9205 serves as an etching stopper. The element separation insulating layer 9208 remains so as to be embedded between the SOI layers 9202. Thereafter, the silicon nitride layer 9222 is removed.

Figure 11E:
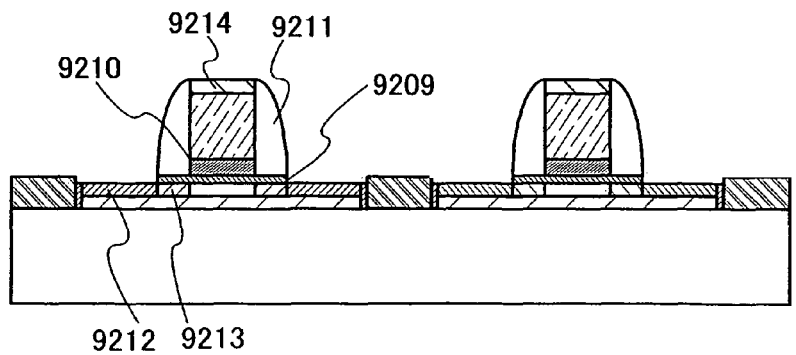

In FIG. 11E, after the SOI layer 9202 is exposed, a gate insulating layer 9209, a gate electrode 9210, and a sidewall insulating layer 9211 are formed, and a first impurity region 9212 and a second impurity region 9213 are formed. An insulating layer 9214 is formed using silicon nitride and is used as a hard mask when the gate electrode 9210 is etched.

Figure 12A:
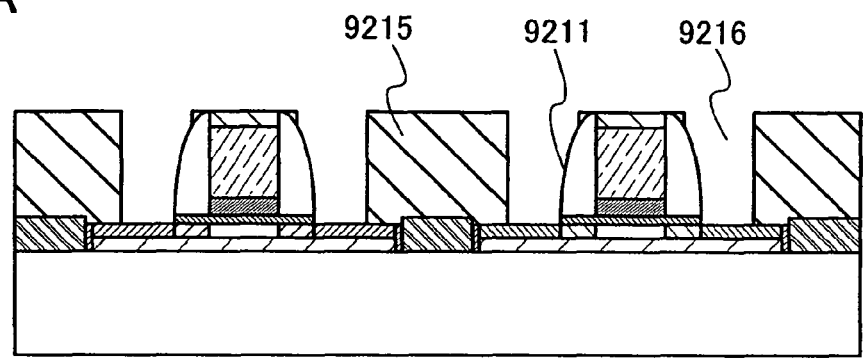
FIGS. 12A and 12B illustrate a method of manufacturing a semiconductor device according to the present invention.

In FIG. 12A, an interlayer insulating layer 9215 is formed. As the interlayer insulating layer 9215, a borophosphosilicate glass (BPSG) film is formed and then planarized by reflow. Alternatively, a silicon oxide film may be formed using TEOS and then planarized by chemical mechanical polishing. In planarization treatment, the insulating layer 9214 over the gate electrode 9210 functions as an etching stopper. A contact hole 9216 is formed in the interlayer insulating layer 9215. The contact hole 9216 is formed in a self-aligned manner by utilizing the sidewall insulating layer 9211.

Figure 12B:
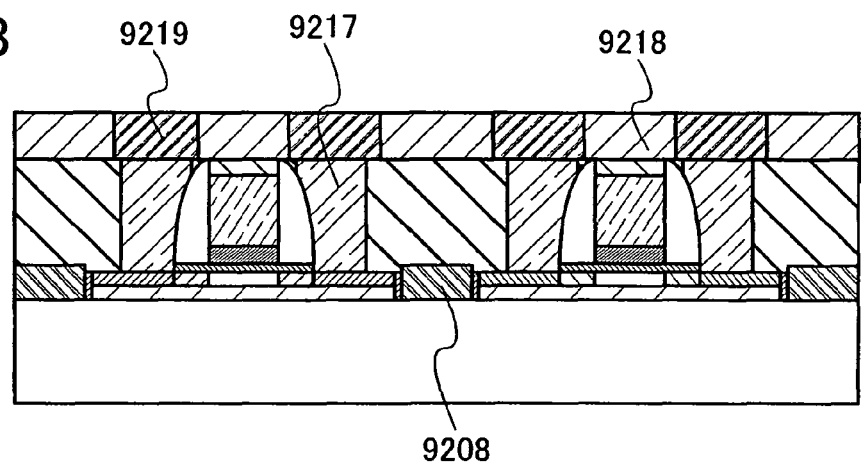

After that, as shown in FIG. 12B, a contact plug 9217 is formed using tungsten hexafluoride by a CVD method. Further, an insulating layer 9218 is formed, and an opening is formed in accordance with the contact plug 9217 to provide a wiring 9219. The wiring 9219 is formed using aluminum or an aluminum alloy and is provided with upper and lower metal films of molybdenum, chromium, titanium, or the like as barrier metal.

In such a manner, a field effect transistor can be manufactured using the SOI layer 9202 bonded to the base substrate 9200. Since the SOI layer 9202 according to this embodiment mode is a single-crystal semiconductor with uniform crystal orientation, uniform and high-performance field-effect transistors can be obtained. That is, variation in values of important transistor characteristics, such as the threshold voltage and mobility, can be suppressed, and high performance such as high mobility can be achieved.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode. Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 4

Figure 13A:
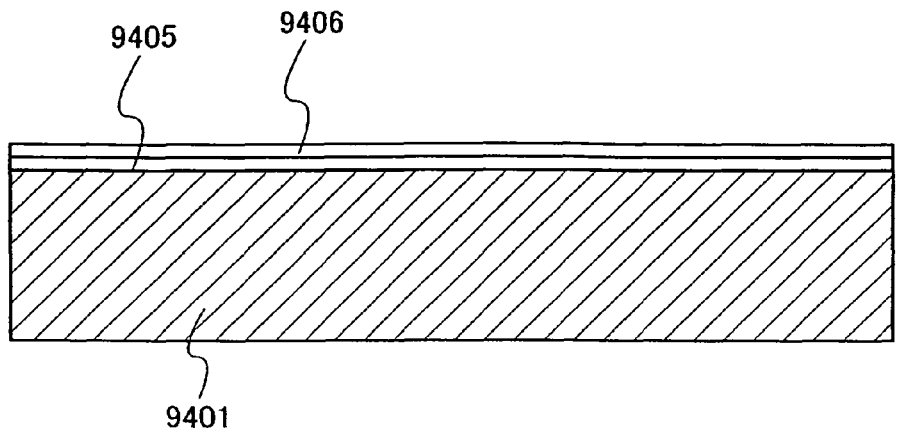
FIGS. 13A to 13C illustrate a method of manufacturing a semiconductor device according to the present invention.

In this embodiment mode, a method for manufacturing an SOI substrate is described with reference to FIGS. 13A to 13C and FIGS. 14A and 14B. In FIG. 13A, a silicon oxynitride film 9405 is formed with a thickness of 100 nm over a single-crystal silicon substrate 9401 from which a natural oxide film has been removed using an $SiH_4$ gas and an $N_2O$ gas by a plasma CVD method. Further, a silicon nitride oxide film 9406 is formed with a thickness of 50 nm using an $SiH_4$ gas, an $N_2O$ gas, and an $NH_3$ gas.

Figure 13B:
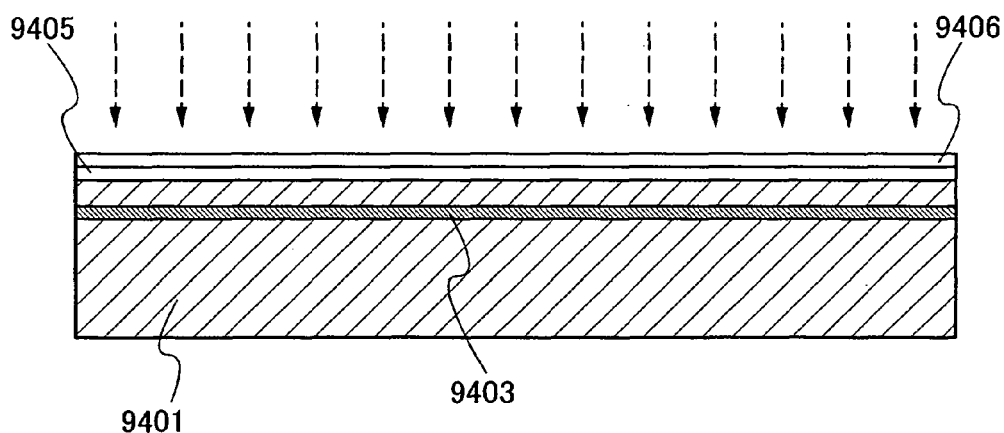

Then, as shown in FIG. 13B, a surface of the silicon nitride oxide film 9406 is irradiated with hydrogen ions using an ion doping apparatus. The ion doping apparatus is an apparatus used for irradiation of a substrate with an ionized gas which is accelerated by an electric field without mass separation.

When this apparatus is used, ion doping treatment can be performed with high efficiency and at high dose even in the case of a large-area substrate. In this example, hydrogen is ionized, and a separation layer 9403 is formed in the single-crystal silicon substrate 9401. Ion doping treatment is performed with an acceleration voltage of 80 kV and a dose of $2 \times 10^{16}/\text{cm}^2$.

In this case, it is preferable to perform irradiation with one or a plurality of ions of the same atoms having different mass numbers. In the case of hydrogen ion irradiation, the hydrogen ions preferably include $H^+$, $H_2^+$, and $H_3^+$ ions with a high proportion of $H_3^+$ ions of up to approximately 80%. When a large number of higher-order ions with small mass numbers are contained in the single-crystal silicon substrate 9401 in such a manner, cleavage inside the separation layer 9403 or at the top interface or the bottom interface of the separation layer 9403 can be easily performed in a heat treatment step. In this case, when the silicon nitride oxide film 9406 and the silicon oxynitride film 9405 are provided on the surface of the single-crystal silicon substrate 9401, on which ion irradiation is performed, the surface of the single-crystal silicon substrate 9401 can be prevented from being roughened by ion doping treatment.

Figure 13C:
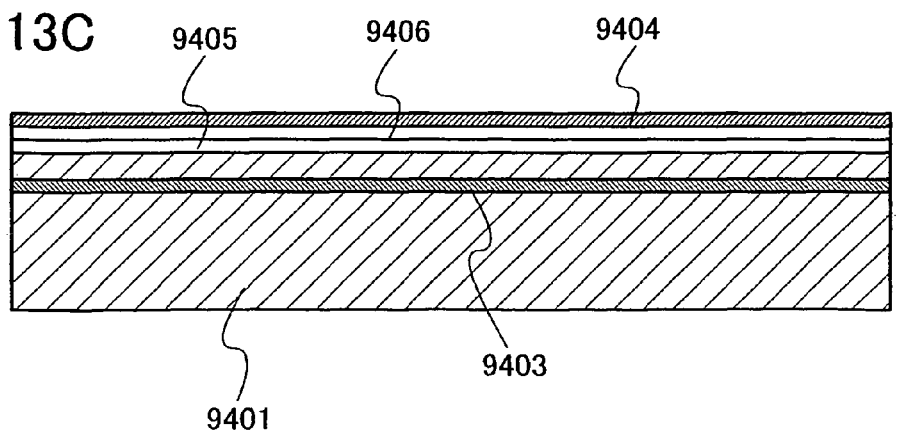

Next, as shown in FIG. 13C, a silicon oxide film 9404 is formed over the silicon nitride oxide film 9406. The silicon oxide film 9404 is formed with a thickness of 50 nm by a plasma CVD method using tetraethoxysilane (TEOS: $Si(OC_2H_5)_4$) and an oxygen gas. The film formation temperature is set to be 350° C. or lower so that hydrogen is not removed from the separation layer 9403.

Figure 14A:
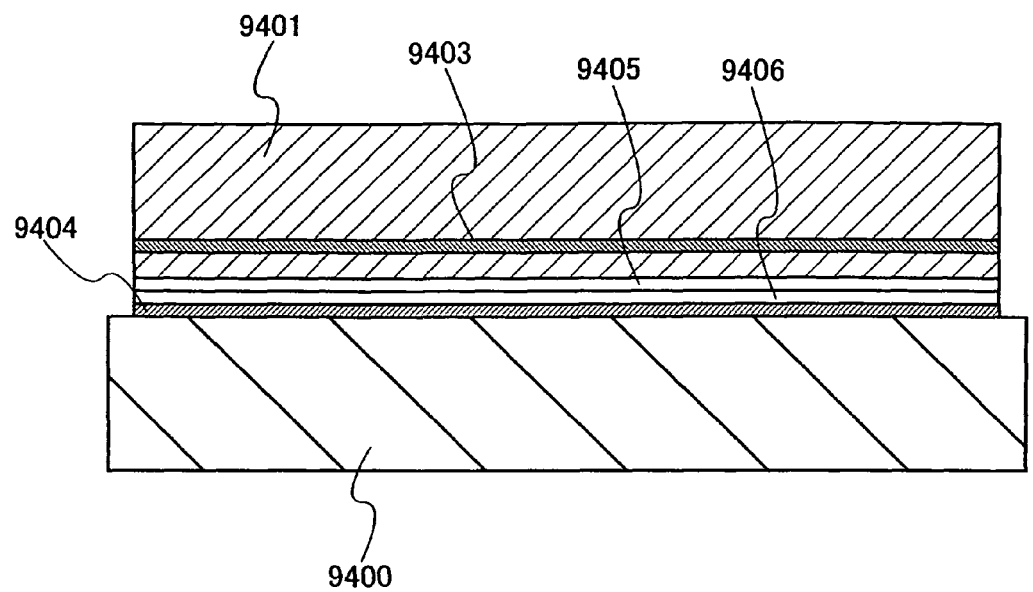
FIGS. 14A and 14B illustrate a method of manufacturing a semiconductor device according to the present invention.
Figure 14B:
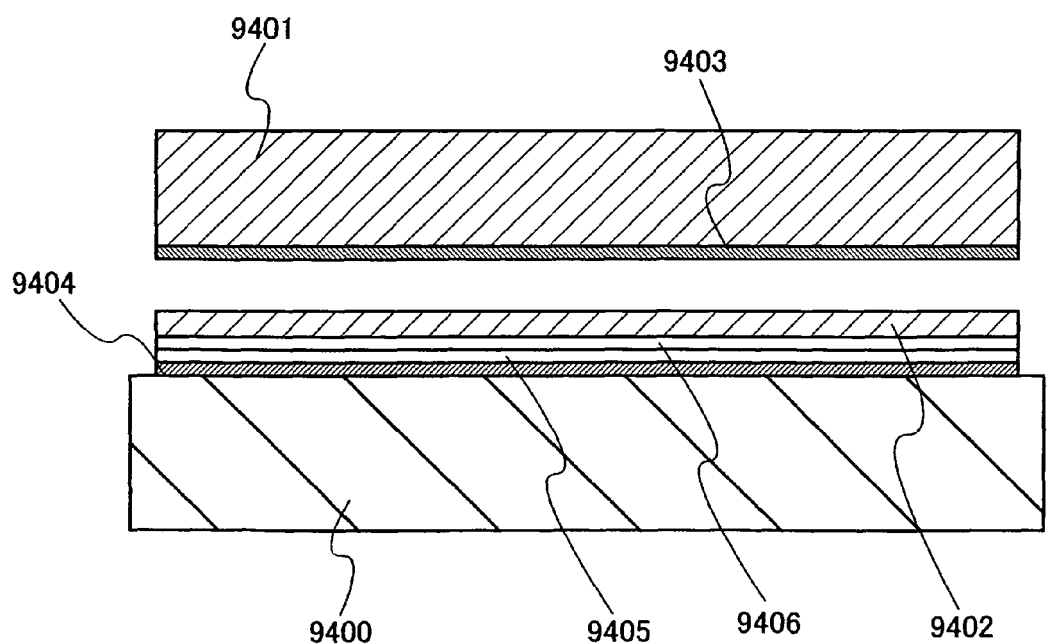

FIG. 14A shows a step in which a glass substrate 9400 which is subjected to ultrasonic cleaning with the use of ozone-containing water and the single-crystal silicon substrate 9401 are superposed on each other with the silicon oxide film 9404 interposed therebetween, and the substrates are pressed against each other so that a bond is formed. Thereafter, heat treatment is performed at 400° C. for 10 minutes in a nitrogen atmosphere and then at 500° C. for two hours, and the temperature is held constant at 400° C. for several hours and then gradually lowered to room temperature. Accordingly, a crack can be formed inside the separation layer 9403 or at the top interface or the bottom interface of the separation layer 9403 to separate the single-crystal silicon substrate 9401, and the silicon oxide film 9404 and the glass substrate 9400 can be firmly bonded.

In such a manner, a single-crystal silicon layer 9402 can be formed over the glass substrate 9400 at a temperature at which the glass substrate 9400 is not distorted. The single-crystal silicon layer 9402 manufactured in this example is firmly bonded to the glass substrate 9400, and the silicon layer is not separated even when a tape peeling test is performed. That is, a single-crystal silicon layer can be provided over any of various glass substrates which are used in the electronics industry and are referred to as non-alkali glass substrates, such as an aluminosilicate glass substrate, an aluminoborosilicate glass substrate, and a barium borosilicate glass substrate, and a variety of integrated circuits and display devices can be manufactured using a substrate which is longer than one meter on a side.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode. Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 5

In this embodiment mode, a structure of a display device is described.

Figure 15A:
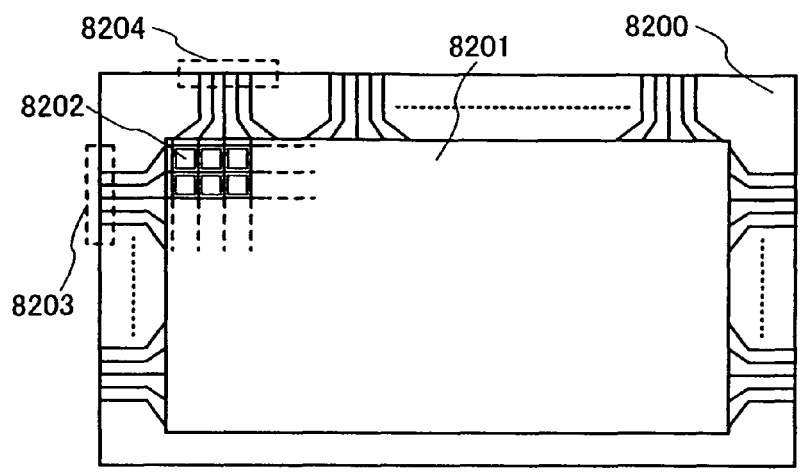
FIGS. 15A to 15C each illustrate a structure of a peripheral circuit of a semiconductor device according to the present invention.

A structure of a display device is described with reference to FIG. 15A. FIG. 15A is a top plan view of the display device.

A pixel portion 8201, a scan line input terminal 8203, and a signal line input terminal 8204 are formed over a substrate 8200. Scan lines extending in a row direction from the scan line input terminal 8203 are formed over the substrate 8200, and signal lines extending in a column direction from the signal line input terminal 8204 are formed over the substrate 8200. Pixels 8202 are arranged in matrix at each intersection of the scan lines and the signal lines in the pixel portion 8201.

The above is the description of the case where a signal is input from an external driver circuit; however, the present invention is not limited to this structure, and an IC chip can be mounted on a display device.

Figure 16A:
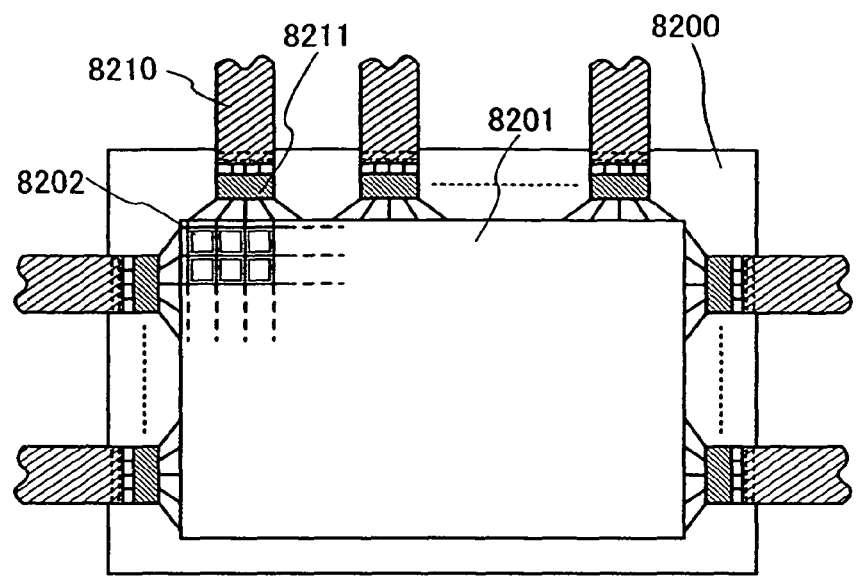
FIGS. 16A and 16B each illustrate a structure of a peripheral circuit of a semiconductor device according to the present invention.

For example, as shown in FIG. 16A, an IC chip 8211 can be mounted on the substrate 8200 by a COG (chip on glass) method. In this case, the IC chip 8211 can be examined before being mounted on the substrate 8200, so that improvement in yield and reliability of the display device can be realized. Note that portions common to those in FIG. 15A are denoted by common reference numerals, and description thereof is omitted.

Figure 16B:
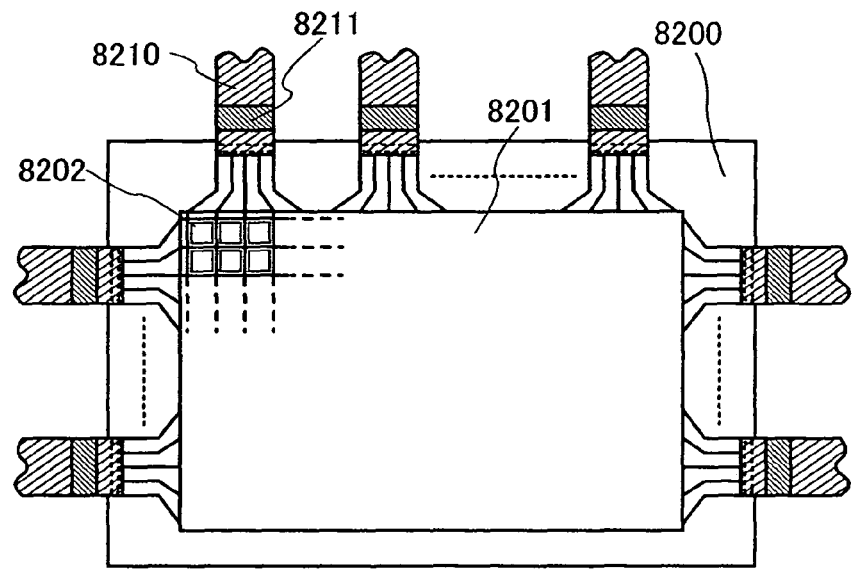

As another example, as shown in FIG. 16B, the IC chip 8211 can be mounted on an FPC (flexible printed circuit) 8210 by a TAB (tape automated bonding) method. In this case, the IC chip 8211 can be examined before being mounted on the FPC 8210, so that improvement in yield and reliability of the display device can be realized. Note that portions common to those in FIG. 15A are denoted by common reference numerals, and description thereof is omitted.

Not only the IC chip can be mounted on the substrate 8200, but also a driver circuit can be formed over the substrate 8200.

Figure 15B:
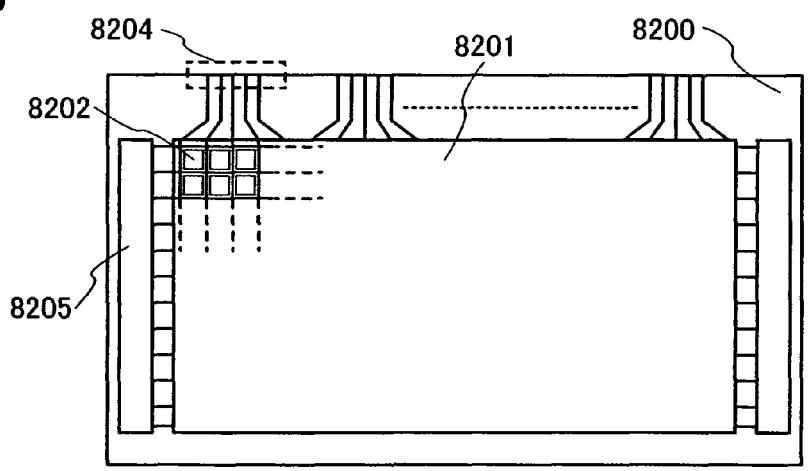

For example, as shown in FIG. 15B, a scan line driver circuit 8205 can be formed over the substrate 8200. In this case, the cost can be reduced by reduction in the number of components. Further, reliability can be improved by reduction in the number of connection points between components. Since the driving frequency of the scan line driver circuit 8205 is low, the scan line driver circuit 8205 can be easily formed using amorphous silicon or microcrystalline silicon as a semiconductor layer of a transistor. Note that an IC chip for outputting a signal to the signal line may be mounted on the substrate 8200 by a COG method. Alternatively, an FPC on which an IC chip for outputting a signal to the signal line is mounted by a TAB method may be provided on the substrate 8200. In addition, an IC chip for controlling the scan line driver circuit 8205 may be mounted on the substrate 8200 by a COG method. Alternatively, an FPC on which an IC chip for controlling the scan line driver circuit 8205 is mounted by a TAB method may be provided on the substrate 8200. Note that portions common to those in FIG. 15A are denoted by common reference numerals, and description thereof is omitted.

Figure 15C:
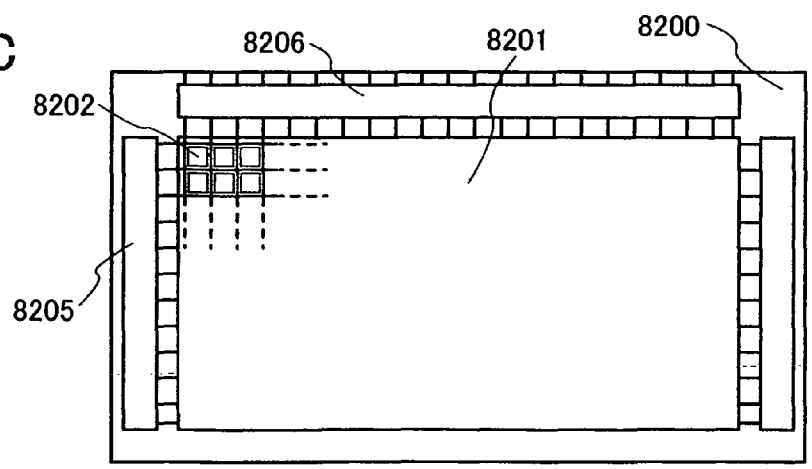

As another example, as shown in FIG. 15C, the scan line driver circuit 8205 and a signal line driver circuit 8206 can be formed over the substrate 8200. Thus, the cost can be reduced by reduction in the number of components. Further, reliability can be improved by reduction in the number of connection points between components. Note that an IC chip for controlling the scan line driver circuit 8205 may be mounted on the substrate 8200 by a COG method. Alternatively, an FPC on which an IC chip for controlling the scan line driver circuit 8205 is mounted by a TAB method may be provided on the substrate 8200. In addition, an IC chip for controlling the signal line driver circuit 8206 may be mounted on the substrate 8200 by a COG method. Alternatively, an FPC on which an IC chip for controlling the signal line driver circuit 8206 is mounted by a TAB method may be provided on the substrate 8200. Note that portions common to those in FIG. 15A are denoted by common reference numerals, and description thereof is omitted.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode.

Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 6

In this embodiment mode, a pixel structure and an operation of a pixel which can be applied to a liquid crystal display device are described.

In this embodiment mode, as an operation mode of a liquid crystal element, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Figure 17A:
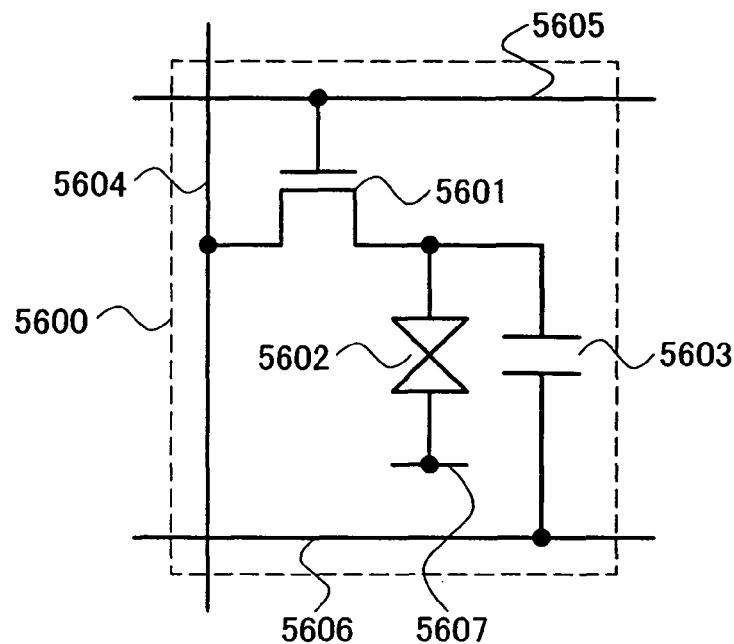
FIGS. 17A and 17B each illustrate a circuit structure of a semiconductor device according to the present invention.

FIG. 17A shows an example of a pixel structure which can be applied to the liquid crystal display device.

A pixel 5600 includes a transistor 5601, a liquid crystal element 5602, and a capacitor 5603. A gate of the transistor 5601 is connected to a wiring 5605. A first terminal of the transistor 5601 is connected to a wiring 5604. A second terminal of the transistor 5601 is connected to a first electrode of the liquid crystal element 5602 and a first electrode of the capacitor 5603. A second electrode of the liquid crystal element 5602 corresponds to a counter electrode 5607. A second electrode of the capacitor 5603 is connected to a wiring 5606.

The wiring 5604 functions as a signal line. The wiring 5605 functions as a scan line. The wiring 5606 functions as a capacitor line. The transistor 5601 functions as a switch. The capacitor 5603 functions as a storage capacitor.

It is acceptable as long as the transistor 5601 functions as a switch, and the transistor 5601 may be either a p-channel transistor or an n-channel transistor.

Figure 17B:
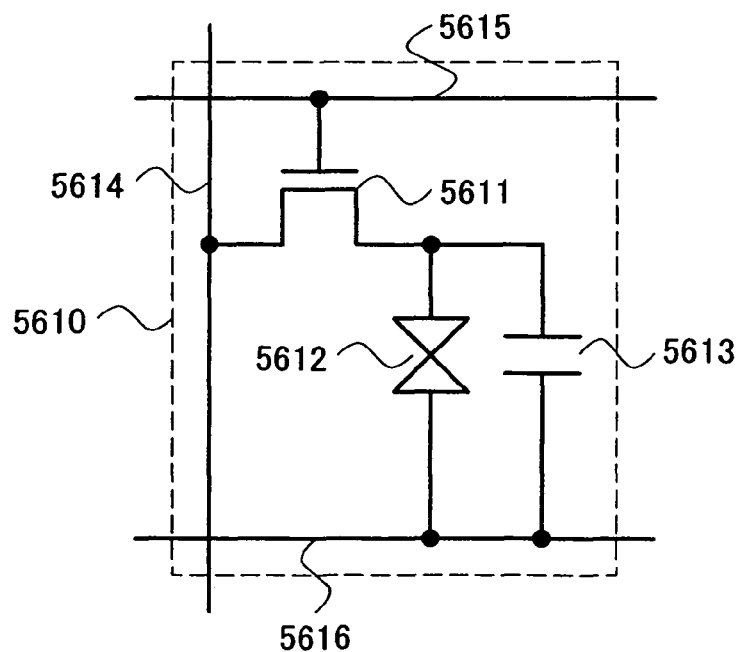

FIG. 17B shows an example of a pixel structure which can be applied to the liquid crystal display device. In particular, FIG. 17B shows an example of a pixel structure which can be applied to a liquid crystal display device suitable for a horizontal electric field mode (including an IPS mode and an FFS mode).

A pixel 5610 includes a transistor 5611, a liquid crystal element 5612, and a capacitor 5613. A gate of the transistor 5611 is connected to a wiring 5615. A first terminal of the transistor 5611 is connected to a wiring 5614. A second terminal of the transistor 5611 is connected to a first electrode of the liquid crystal element 5612 and a first electrode of the capacitor 5613. A second electrode of the liquid crystal element 5612 is connected to a wiring 5616. A second electrode of the capacitor 5603 is connected to the wiring 5616.

The wiring 5614 functions as a signal line. The wiring 5615 functions as a scan line. The wiring 5616 functions as a capacitor line. The transistor 5611 functions as a switch. The capacitor 5613 functions as a storage capacitor.

It is acceptable as long as the transistor 5611 functions as a switch, and the transistor 5611 may be a p-channel transistor or an n-channel transistor.

Figure 18:
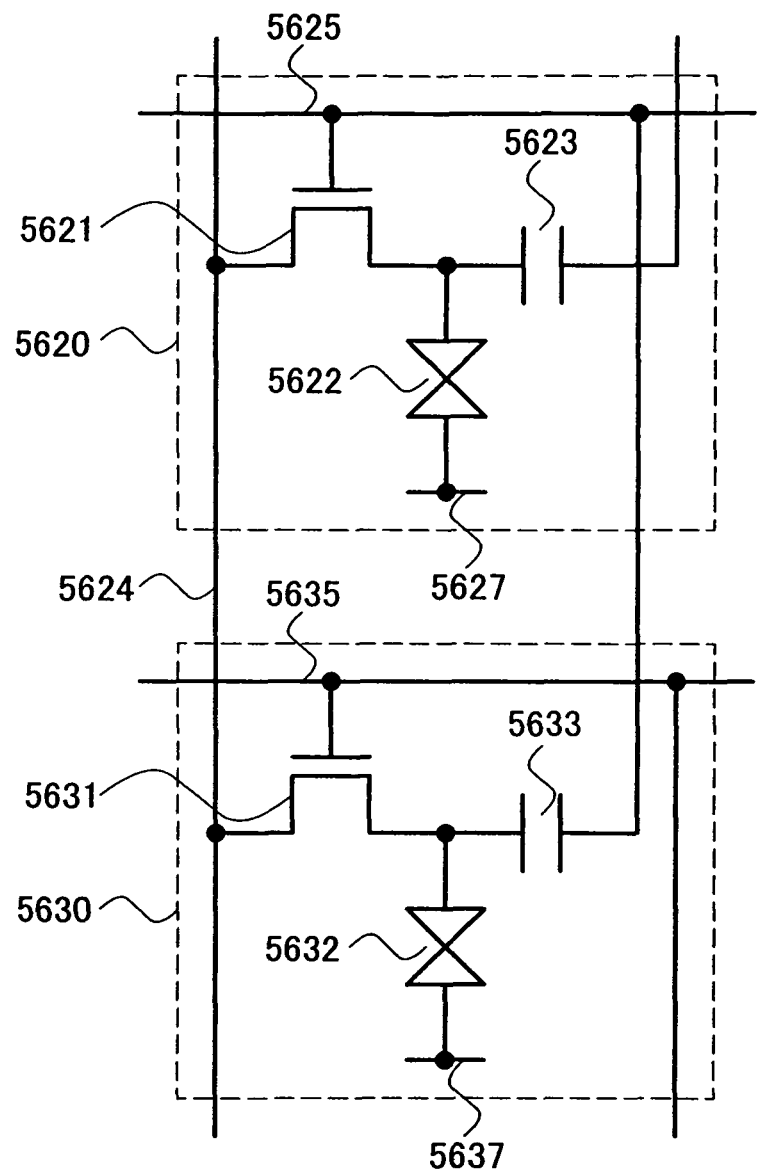
FIG. 18 illustrates a circuit structure of a semiconductor device according to the present invention.

FIG. 18 shows an example of a pixel structure which can be applied to the liquid crystal display device. In particular, FIG. 18 shows an example of a pixel structure in which an aperture ratio of a pixel can be increased by reducing the number of wirings.

FIG. 18 shows two pixels which are provided in the same column direction (a pixel 5620 and a pixel 5630). For example, when the pixel 5620 is provided in an N-th row, the pixel 5630 is provided in an (N+1)th row.

The pixel 5620 includes a transistor 5621, a liquid crystal element 5622, and a capacitor 5623. A gate of the transistor 5621 is connected to a wiring 5625. A first terminal of the transistor 5621 is connected to a wiring 5624. A second terminal of the transistor 5621 is connected to a first electrode of the liquid crystal element 5622 and a first electrode of the capacitor 5623. A second electrode of the liquid crystal element 5622 corresponds to a counter electrode 5627. A second electrode of the capacitor 5623 is connected to a wiring which is the same as a wiring connected to a gate of a transistor of the previous row.

The pixel 5630 includes a transistor 5631, a liquid crystal element 5632, and a capacitor 5633. A gate of the transistor 5631 is connected to a wiring 5635. A first terminal of the transistor 5631 is connected to the wiring 5624. A second terminal of the transistor 5631 is connected to a first electrode of the liquid crystal element 5632 and a first electrode of the capacitor 5633. A second electrode of the liquid crystal element 5632 corresponds to a counter electrode 5637. A second electrode of the capacitor 5633 is connected to the wiring which is the same as the wiring connected to the gate of the transistor of the previous row (the wiring 5625).

The wiring 5624 functions as a signal line. The wiring 5625 functions as a scan line of the N-th row and as a capacitor line of the (N+1)th row. The transistor 5621 functions as a switch. The capacitor 5623 functions as a storage capacitor.

The wiring 5635 functions as a scan line of the (N+1)th row and as a capacitor line of the (N+2)th row. The transistor 5631 functions as a switch. The capacitor 5633 functions as a storage capacitor.

It is acceptable as long as each of the transistor 5621 and the transistor 5631 functions as a switch, and each of the transistor 5621 and the transistor 5631 may be either a p-channel transistor or an n-channel transistor.

Figure 19:
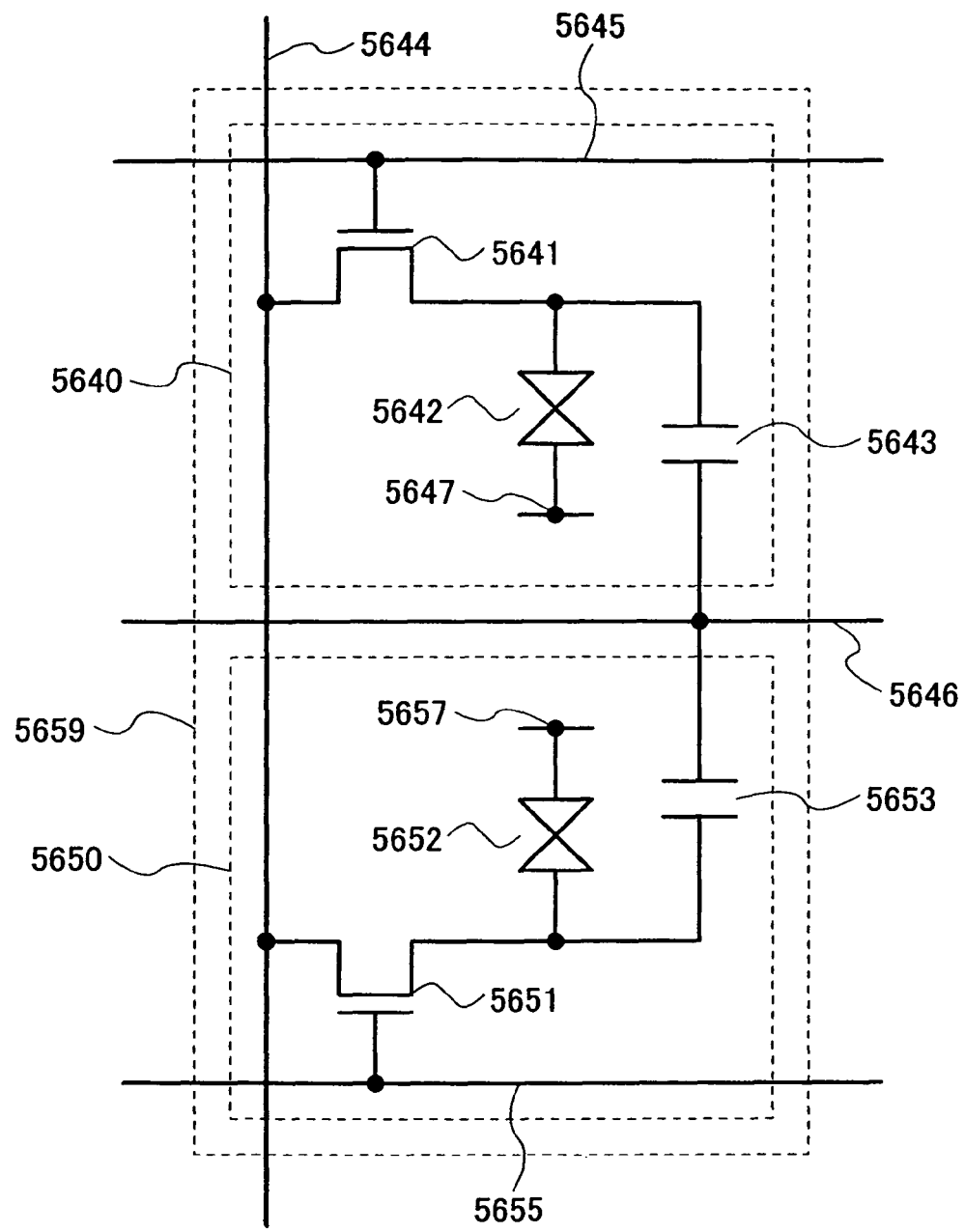
FIG. 19 illustrates a circuit structure of a semiconductor device according to the present invention.

FIG. 19 shows an example of a pixel structure which can be applied to the liquid crystal display device. In particular, FIG. 19 shows an example of a pixel structure in which a viewing angle can be improved by using a subpixel.

A pixel 5659 includes a subpixel 5640 and a subpixel 5650. Although the case in which the pixel 5659 includes two subpixels is described, the pixel 5659 may include three or more subpixels.

The subpixel 5640 includes a transistor 5641, a liquid crystal element 5642, and a capacitor 5643. A gate of the transistor 5641 is connected to a wiring 5645. A first terminal of the transistor 5641 is connected to a wiring 5644. A second terminal of the transistor 5641 is connected to a first electrode of the liquid crystal element 5642 and a first electrode of the capacitor 5643. A second electrode of the liquid crystal element 5642 corresponds to a counter electrode 5647. A second electrode of the capacitor 5643 is connected to a wiring 5646.

The subpixel 5650 includes a transistor 5651, a liquid crystal element 5652, and a capacitor 5653. A gate of the transistor 5651 is connected to a wiring 5655. A first terminal of the transistor 5651 is connected to the wiring 5644. A second terminal of the transistor 5651 is connected to a first electrode of the liquid crystal element 5652 and a first electrode of the capacitor 5653. A second electrode of the liquid crystal element 5652 corresponds to a counter electrode 5657. A second electrode of the capacitor 5653 is connected to the wiring 5646.

The wiring 5644 functions as a signal line. The wiring 5645 functions as a scan line. The wiring 5655 functions as a signal line. The wiring 5646 functions as a capacitor line. Each of the transistor 5641 and the transistor 5651 functions as a switch. Each of the capacitor 5643 and the capacitor 5653 functions as a storage capacitor.

It is acceptable as long as each of the transistor 5641 and the transistor 5651 functions as a switch, and each of the transistor 5641 and the transistor 5651 may be either a p-channel transistor or an n-channel transistor.

A video signal input to the subpixel 5640 may be a value which is different from that of a video signal input to the subpixel 5650. In this case, the viewing angle can be widened because alignment of liquid crystal molecules of the liquid crystal element 5642 and alignment of liquid crystal molecules of the liquid crystal element 5652 can be varied from each other.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode.

Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 7

In this embodiment mode, a structure and an operation of a pixel in a display device are described.

Figures 20A, 20B:
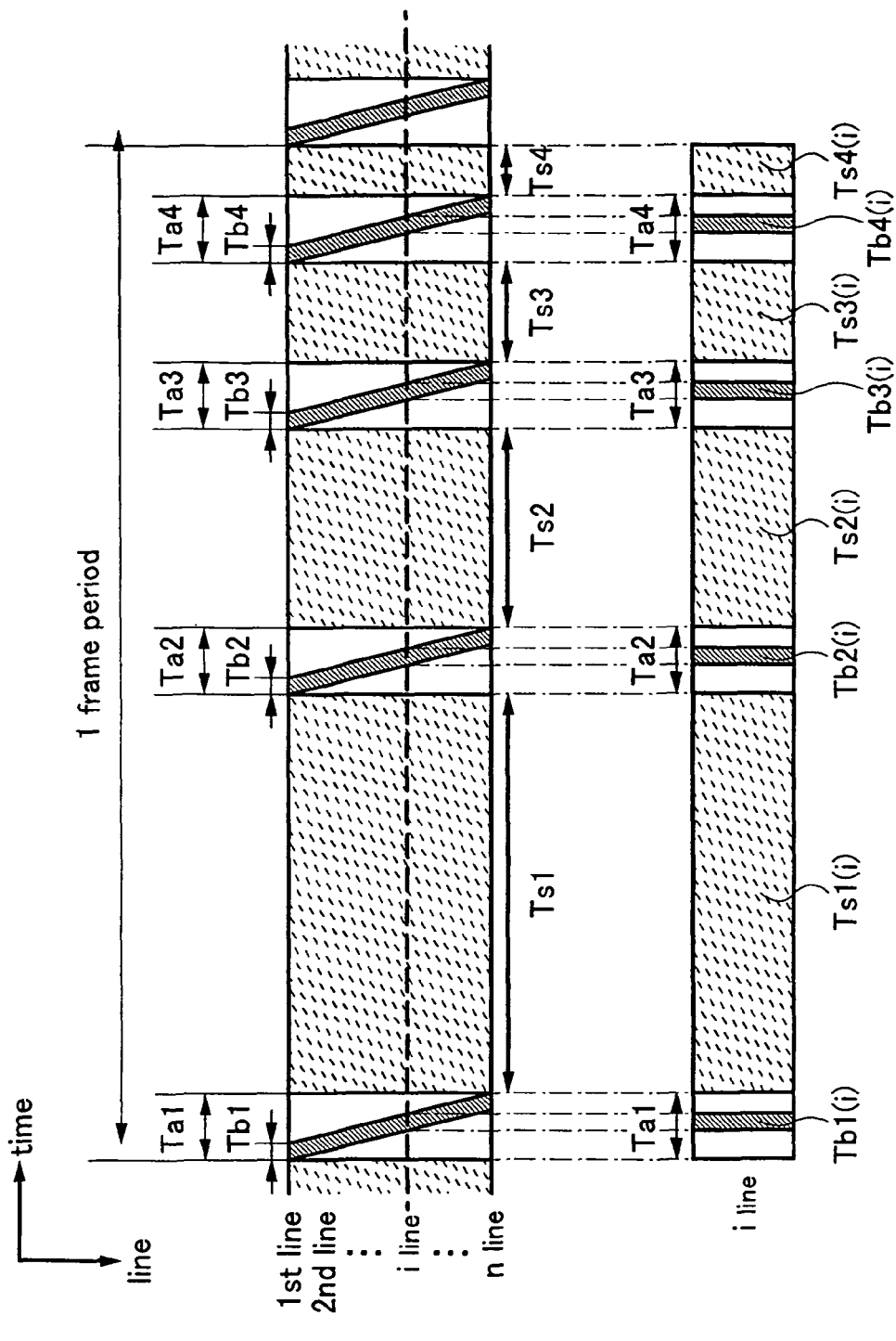
FIGS. 20A and 20B are each a timing chart of a semiconductor device according to the present invention.

FIGS. 20A and 20B are timing charts showing an example of digital time gray scale driving. The timing chart of FIG. 20A shows a driving method in the case where a signal writing period (an address period) to a pixel and a light-emitting period (a sustain period) are separated.

One frame period refers to a period for fully displaying an image for one display region. One frame period includes a plurality of subframe periods, and one subframe period includes an address period and a sustain period. Address periods $T_{a1}$ to $T_{a4}$ indicate time for writing signals to pixels in all rows, and periods $T_{b1}$ to $T_{b4}$ indicate time for writing signals to pixels in one row (or one pixel). Sustain periods $T_{s1}$ to $T_{s4}$ indicate time for maintaining a lighting state or a non-lighting state in accordance with a video signal written to the pixel, and a ratio of the length of the sustain periods is set to satisfy $T_{s1}:T_{s2}:T_{s3}:T_{s4}=2^3:2^2:2^1:2^0=8:4:2:1$. A gray scale is expressed depending on in which sustain period light emission is performed.

Here, the i-th pixel row is described with reference to FIG. 20B. First, in the address period $T_{a1}$, pixel selection signals are input to the scan lines from a first row, and in a period $T_{b1(i)}$ in the address period $T_{a1}$, a pixel in the i-th row is selected. Then, while the pixel in the i-th row is selected, a video signal is input to the pixel in the i-th row from a signal line. Then, when the video signal is written to the pixel in the i-th row, the pixel in the i-th row maintains the signal until a signal is input again. Lighting and non-lighting of the pixel in the i-th row in the sustain period $T_{s1}$ are controlled by the written video signal. Similarly, in each of the address periods $T_{a2}$, $T_{a3}$, and $T_{a4}$, a video signal is input to the pixel in the i-th row, and lighting and non-lighting of the pixel in the i-th row in each of the sustain periods $T_{s2}$, $T_{s3}$, and $T_{s4}$ are controlled by the video signal. Then, in each subframe period, a pixel to which a signal for not lighting in the address period and for lighting when the sustain period starts after the address period ends is written is lit.

The case where 4-bit gray scales are expressed is described here; however, the number of bits and the number of gray scales are not limited thereto. Note that lighting is not needed to be performed in order of $T_{s1}$, $T_{s2}$, $T_{s3}$, and $T_{s4}$, and the order may be random or light may be emitted by dividing any of the periods of $T_{s1}$, $T_{s2}$, $T_{s3}$, and $T_{s4}$ into a plurality of periods. A ratio of lighting times of $T_{s1}$, $T_{s2}$, $T_{s3}$, and $T_{s4}$ is not needed to be a power of two, and may be the same length or slightly different from a power of two.

Next, a driving method in the case where a period for writing a signal to a pixel (an address period) and a light-emitting period (a sustain period) are not separated is described. That is, a pixel in a row in which a writing operation of a video signal is completed maintains the signal until another signal is written to the pixel (or the signal is erased). A period between the writing operation and writing of another signal to the pixel is referred to as data holding time. In the data holding time, the pixel is lit or not lit in accordance with the video signal written to the pixel. The same operations are performed until the last row, and the address period ends. Then, a signal writing operation of the next subframe period starts sequentially from the row in which the data holding time ends.

As described above, in the case of the driving method in which a pixel is immediately lit or not lit in accordance with a video signal written to the pixel when the signal writing operation is completed and the data holding time starts, signals cannot be input to two rows at the same time. Accordingly, address periods need to be prevented from overlapping, so that the data holding time cannot be made shorter. As a result, it is difficult to perform high-level gray scale display.

Figures 21A, 21B:
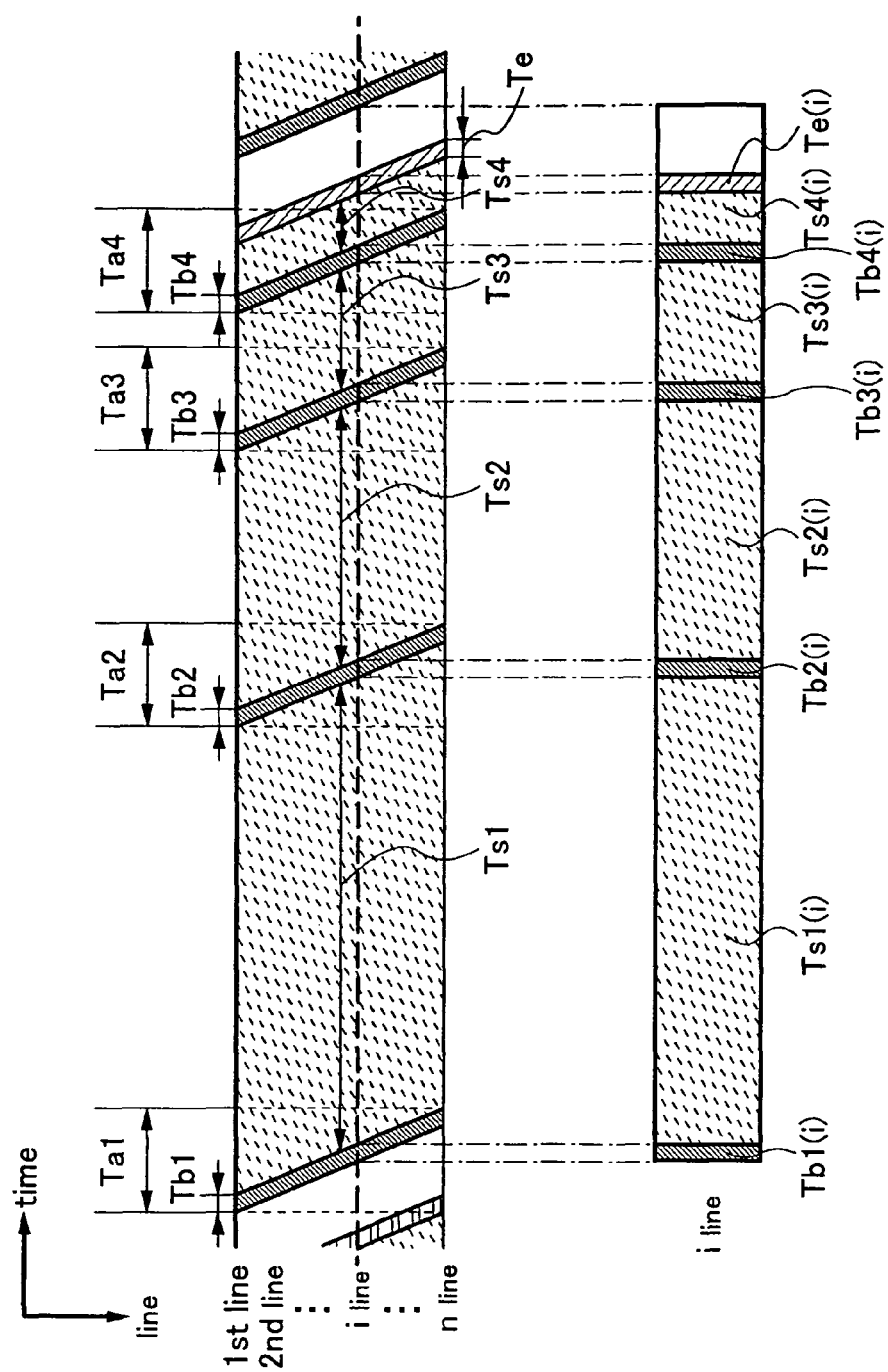
FIGS. 21A and 21B are each a timing chart of a semiconductor device according to the present invention.

Thus, the data holding time is set to be shorter than the address period by provision of an erasing period. FIG. 21A illustrates a driving method in the case where the data holding time which is shorter than the address period is set by provision of an erasing period.

Here, the i-th pixel row is described with reference to FIG. 21B. In the address period $T_{a1}$, pixel scan signals are input to the scan lines from a first row, and a pixel is selected. Then, in the period $T_{b1(i)}$, while the pixel in the i-th row is selected, a video signal is input to the pixel in the i-th row. Then, when the video signal is written to the pixel in the i-th row, the pixel in the i-th row maintains the signal until a signal is input again. Lighting and non-lighting of the pixel in the i-th row in a sustain period $T_{s1(i)}$ are controlled by the written video signal. That is, the pixel in the i-th row is immediately lit or not lit in accordance with the video signal written to the pixel after the writing operation of the video signal to the i-th row is completed. Similarly, in each of the address periods $T_{a2}$, $T_{a3}$, and $T_{a4}$, a video signal is input to the pixel in the i-th row, and lighting and non-lighting of the pixel in the i-th row in each of the sustain periods $T_{s2}$, $T_{s3}$, and $T_{s4}$ are controlled by the video signal. The end of a sustain period $T_{s4(i)}$ is set by the start of an erasing operation. This is because the pixel is forced to be not lit regardless of the video signal written to the pixel in the i-th row in an erasing time $T_{e(i)}$ in the i-th row. That is, the data holding time of the pixel in the i-th row ends when the erasing time $T_{e(i)}$ starts.

Thus, a display device with a high-level gray scale and a high duty ratio (a ratio of a lighting period in one frame period) can be provided, in which data holding time is shorter than an address period without separating the address period and a sustain period. Since instantaneous luminance can be lowered, reliability of a display element can be improved.

The case where 4-bit gray scales are expressed is described here; however, the number of bits and the number of gray scales are not limited thereto. Note that lighting is not needed to be performed in order of $T_{s1}$, $T_{s2}$, $T_{s3}$, and $T_{s4}$, and the order may be random or light may be emitted by dividing any of the periods of $T_{s1}$, $T_{s2}$, $T_{s3}$, and Ts4 into a plurality of periods. A ratio of lighting times of $T_{s1}$, $T_{s2}$, $T_{s3}$, and $T_{s4}$ is not needed to be a power of two, and may be the same length or slightly different from a power of two.

Next, a structure and an operation of a pixel to which digital time gray scale driving can be applied are described.

Figure 22:
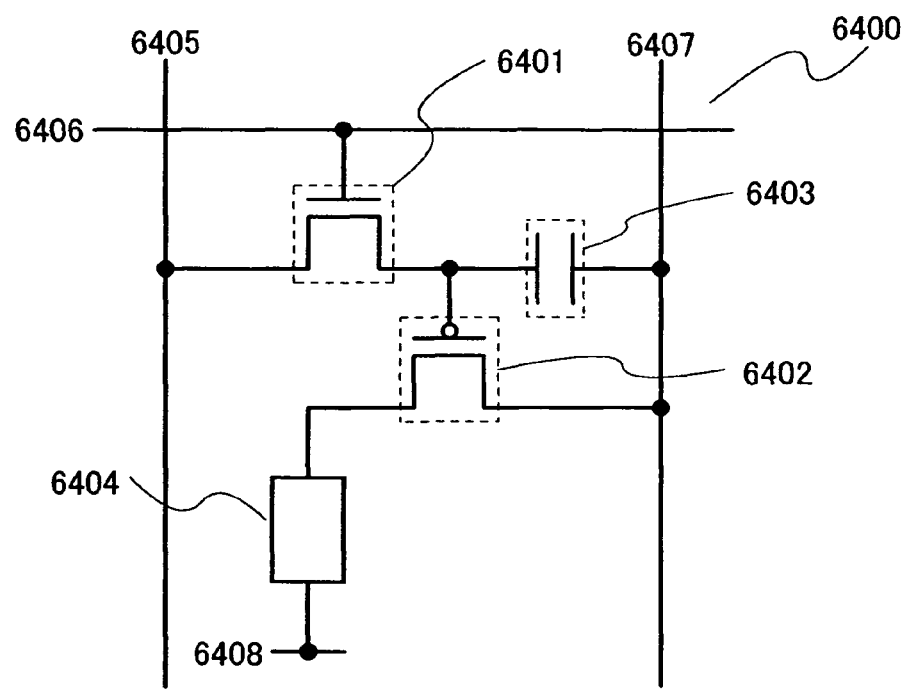
FIG. 22 illustrates a circuit structure of a semiconductor device according to the present invention.

FIG. 22 shows an example of a pixel structure to which digital time gray scale driving can be applied.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode) of the light-emitting element 6404. A second electrode of the light-emitting element 6404 corresponds to a common electrode 6408.

Note that the second electrode (the common electrode 6408) of the light-emitting element 6404 is set to have a low power supply potential. The low power supply potential refers to a potential satisfying (the low power supply potential)<(a high power supply potential) based on the high power supply potential set to the power supply line 6407. As the low power supply potential, GND, 0 V, or the like may be set, for example. In order to make the light-emitting element 6404 emit light by applying a potential difference between the high power supply potential and the low power supply potential to the light-emitting element 6404 so that current is supplied to the light-emitting element 6404, each of the potentials is set so that the potential difference between the high power supply potential and the low power supply potential is equal to or higher than the forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed in a region where a source region, a drain region, an LDD region, or the like overlaps with the gate electrode. Alternatively, capacitance may be formed between a channel formation region and the gate electrode.

Here, in the case of a voltage-input voltage driving method, a video signal is input to the gate of the driving transistor 6402 so that the driving transistor 6402 is in either of two states of being sufficiently turned on and turned off. That is, the driving transistor 6402 operates in the linear region.

Note that when the video signal by which the driving transistor 6402 operates in the saturation region is input, current can be supplied to the light-emitting element 6404. When the light-emitting element 6404 is an element luminance of which is determined in accordance with current, luminance decay due to deterioration of the light-emitting element 6404 can be suppressed. Further, when the video signal is an analog signal, current in accordance with the video signal can be supplied to the light-emitting element 6404. In this case, analog gray scale driving can be performed.

Next, a structure and an operation of a pixel called a threshold voltage compensation pixel are described. The threshold voltage compensation pixel can be applied to digital time gray scale driving and analog gray scale driving.

Figure 23:
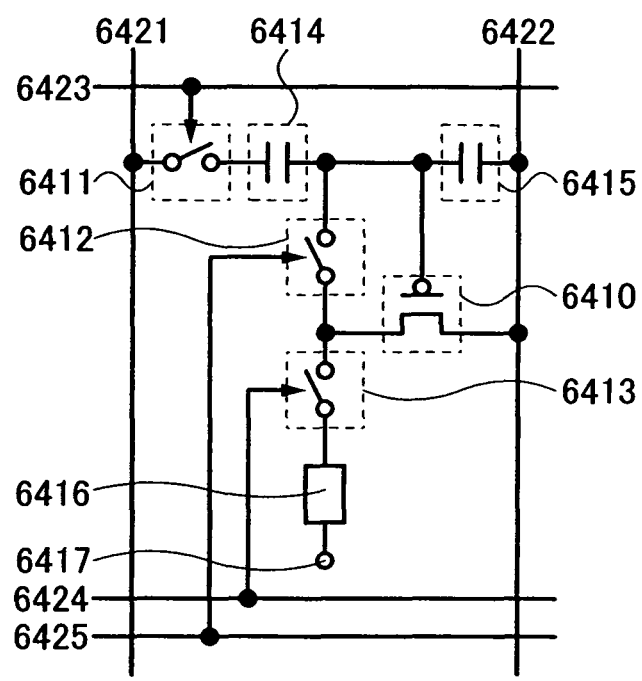
FIG. 23 illustrates a circuit structure of a semiconductor device according to the present invention.

FIG. 23 shows an example of a structure of a pixel called a threshold voltage compensation pixel.

The pixel shown in FIG. 23 includes a driving transistor 6410, a first switch 6411, a second switch 6412, a third switch 6413, a first capacitor 6414, a second capacitor 6415, and a light-emitting element 6416. A gate of the driving transistor 6410 is connected to a signal line 6421 through the first capacitor 6414 and the first switch 6411 in this order. Further, the gate of the driving transistor 6410 is connected to a power supply line 6422 through the second capacitor 6415. A first electrode of the driving transistor 6410 is connected to the power supply line 6422. A second electrode of the driving transistor 6410 is connected to a first electrode of the light-emitting element 6416 through the third switch 6413. Further, the second electrode of the driving transistor 6410 is connected to the gate of the driving transistor 6410 through the second switch 6412. A second electrode of the light-emitting element 6416 corresponds to a common electrode 6417. Note that on/off of the first switch 6411, the second switch 6412, and the third switch 6413 is controlled by signals input to a first scan line 6423, a second scan line 6425, and a third scan line 6424, respectively.

Note that a pixel structure of the present invention is not limited to that shown in FIG. 23. For example, a switch, a resistor, a capacitor, a transistor, a logic circuit, or the like may be added to the pixel shown in FIG. 23. For example, the second switch 6412 may include a p-channel transistor or an n-channel transistor, the third switch 6413 may include a transistor with polarity different from that of the second switch 6412, and the second switch 6412 and the third switch 6413 may be controlled by the same scan line.

A structure and an operation of a pixel called a current input pixel are described. The current input pixel can be applied to digital gray scale driving and analog gray scale driving.

Figure 24:
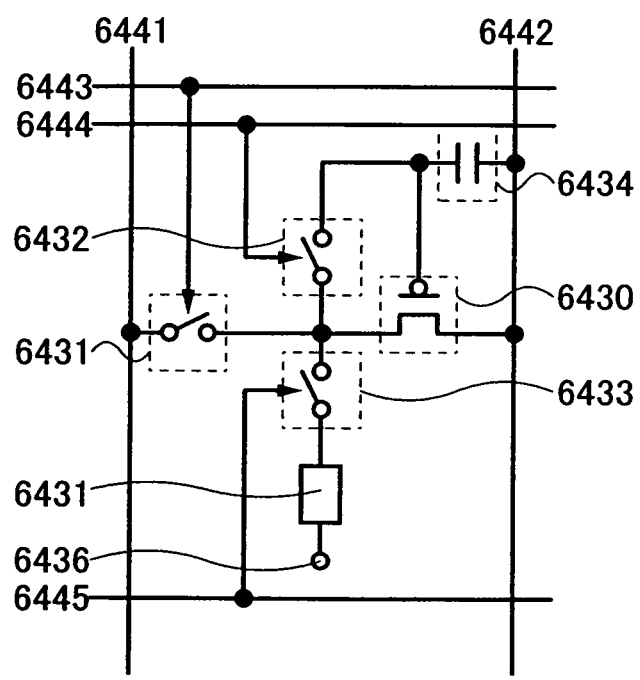
FIG. 24 illustrates a circuit structure of a semiconductor device according to the present invention.

FIG. 24 shows an example of a structure of a pixel called a current input pixel.

The pixel shown in FIG. 24 includes a driving transistor 6430, a first switch 6431, a second switch 6432, a third switch 6433, a capacitor 6434, and a light-emitting element 6435. A gate of the driving transistor 6430 is connected to a signal line 6441 through the second switch 6432 and the first switch 6431 in this order. Further, the gate of the driving transistor 6430 is connected to a power supply line 6442 through the capacitor 6434. A first electrode of the driving transistor 6430 is connected to the power supply line 6442. A second electrode of the driving transistor 6430 is connected to the signal line 6441 through the first switch 6431. Further, the second electrode of the driving transistor 6430 is connected to a first electrode of the light-emitting element 6435 through the third switch 6433. A second electrode of the light-emitting element 6435 corresponds to a common electrode 6436.

Note that the present invention is not limited to the pixel structure shown in FIG. 24. For example, a switch, a resistor, a capacitor, a transistor, a logic circuit, or the like may be added to the pixel shown in FIG. 24. For example, the first switch 6431 may include a p-channel transistor or an n-channel transistor, the second switch 6432 may include a transistor with the same polarity as the first switch 6431, and the first switch 6431 and the second switch 6432 may be controlled by the same scan line. The second switch 6432 may be provided between the gate of the driving transistor 6430 and the signal line 6441.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode.

Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

Embodiment Mode 8

In this embodiment mode, examples of electronic devices are described.

Figure 25:
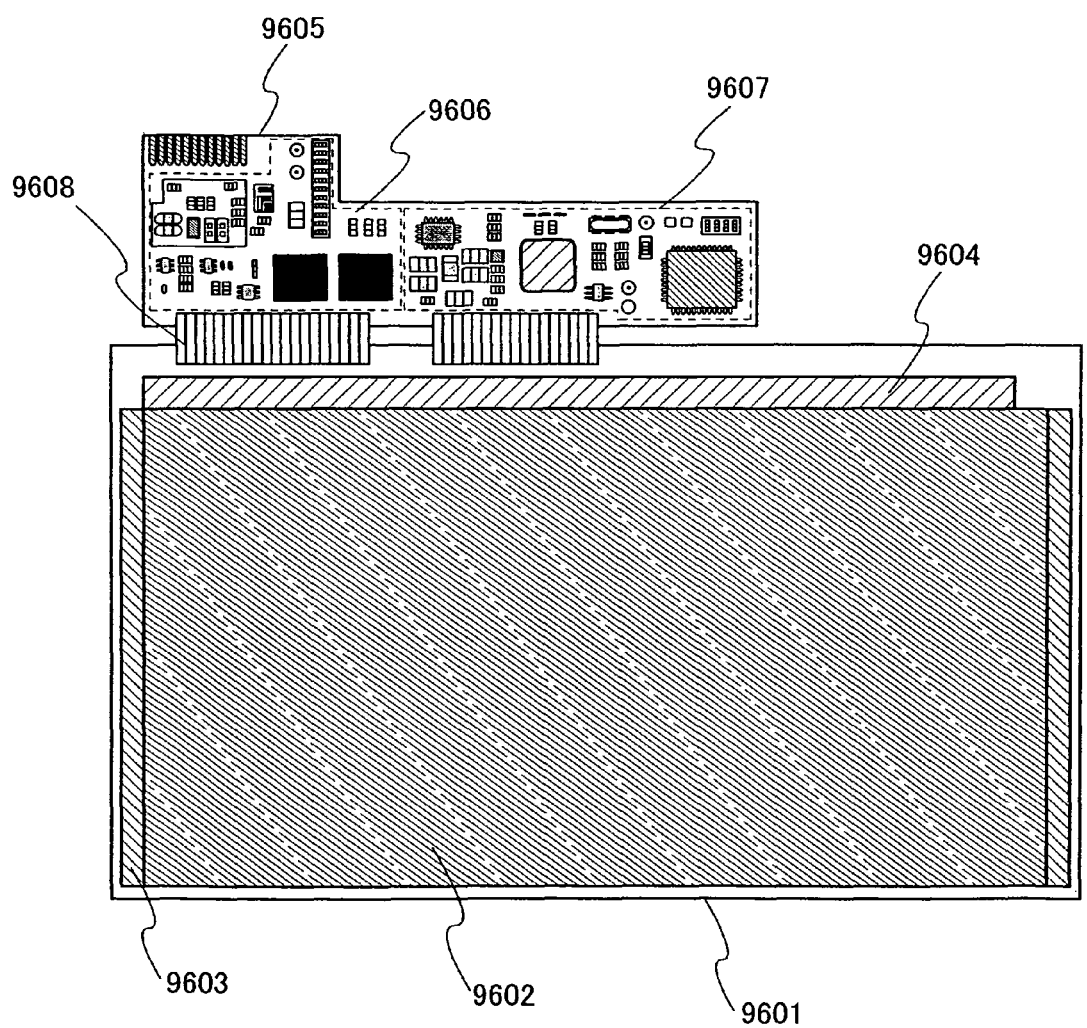
FIG. 25 illustrates an electronic device including a semiconductor device according to the present invention.

FIG. 25 shows a display panel module combining a display panel 9601 and a circuit board 9605. The display panel 9601 includes a pixel portion 9602, a scan line driver circuit 9603, and a signal line driver circuit 9604. The circuit board 9605 is provided with a control circuit 9606, a signal dividing circuit 9607, and the like, for example. The display panel 9601 and the circuit board 9605 are connected to each other by a connection wiring 9608. An FPC or the like can be used as the connection wiring.

Figure 26:
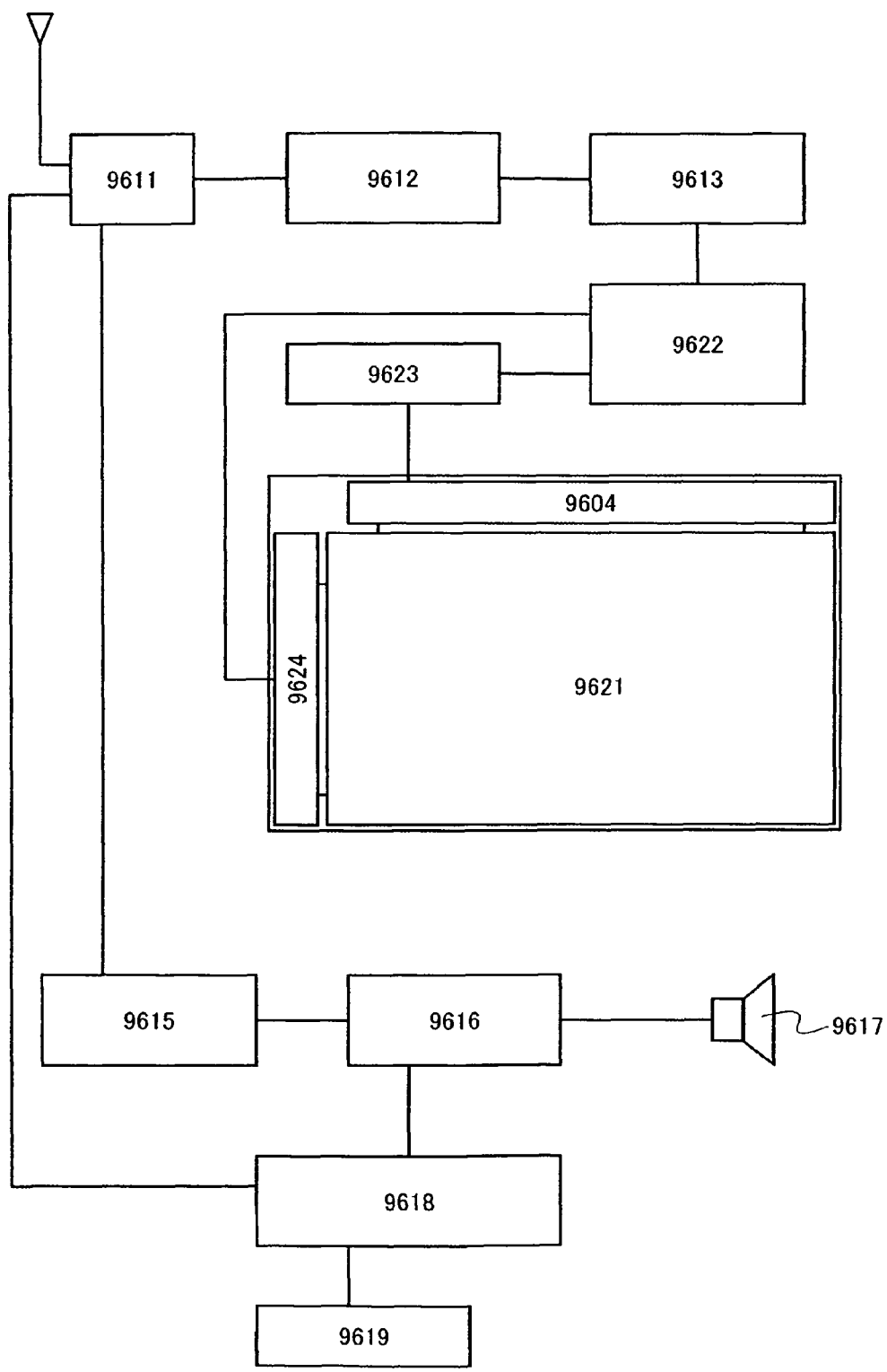
FIG. 26 illustrates an electronic device including a semiconductor device according to the present invention.

FIG. 26 is a block diagram showing a main structure of a television receiver. A tuner 9611 receives a video signal and an audio signal. The video signals are processed by an video signal amplifier circuit 9612; a video signal processing circuit 9613 which converts a signal output from the video signal amplifier circuit 9612 into a color signal corresponding to each color of red, green, and blue; and a control circuit 9622 which converts the video signal into the input specification of a driver circuit. The control circuit 9622 outputs a signal to each of a scan line driver circuit 9624 and a signal line driver circuit 9614. A display panel 9621 is driven by the scan line driver circuit 9624 and the signal line driver circuit 9614. When digital driving is performed, a structure may be employed in which a signal dividing circuit 9623 is provided on the signal line side and an input digital signal is divided into m signals (m is a positive integer) to be supplied.

Among the signals received by the tuner 9611, an audio signal is transmitted to an audio signal amplifier circuit 9615, and an output thereof is supplied to a speaker 9617 through an audio signal processing circuit 9616. A control circuit 9618 receives control information on receiving station (receiving frequency) and volume from an input portion 9619 and transmits signals to the tuner 9611 or the audio signal processing circuit 9616.

Figure 27A:
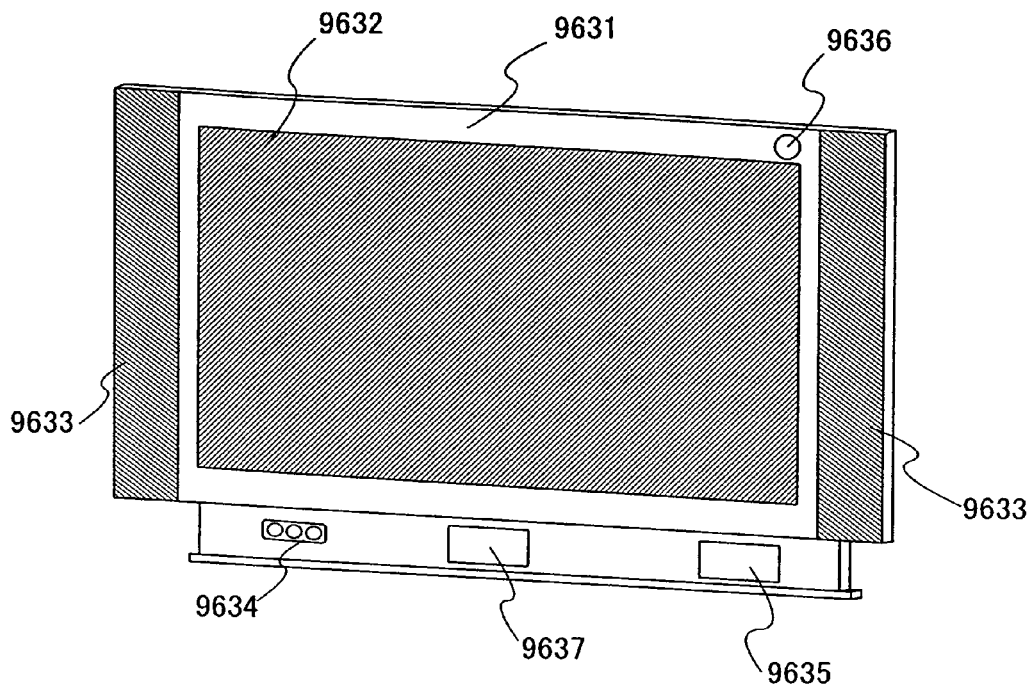
FIGS. 27A and 27B each illustrate an electronic device including a semiconductor device according to the present invention.

FIG. 27A shows a television receiver incorporated with a display panel module, which is different from FIG. 26. In FIG. 27A, a display screen 9632 incorporated in a housing 9631 is formed using the display panel module. Note that speakers 9633, input means (an operation key 9634, a connection terminal 9635, a sensor 9636 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9637), and the like may be provided as appropriate.

Figure 27B:
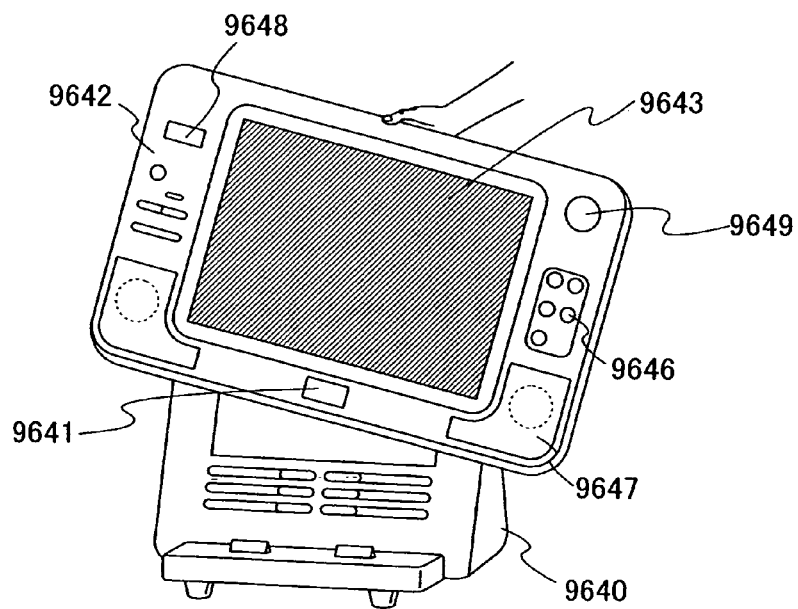

FIG. 27B shows a television receiver in which only a display can be carried wirelessly. The television receiver is provided with a display portion 9643, a speaker portion 9647, input means (an operation key 9646, a connection terminal 9648, a sensor 9649 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9641), and the like as appropriate. A battery and a signal receiver are incorporated in a housing 9642. The battery drives the display portion 9643, the speaker portion 9647, the sensor 9649, and the microphone 9641. The battery can be repeatedly charged by a charger 9640. The charger 9640 can transmit and receive a video signal and transmit the video signal to the signal receiver of the display. The device in FIG. 27B is controlled by the operation key 9646. Alternatively, the device in FIG. 27B can transmit a signal to the charger 9640 by operating the operation key 9646. That is, the device may be an image and audio interactive communication device. Further alternatively, by operating the operation key 9646, the device in FIG. 27B may transmit a signal to the charger 9640 and another electronic device is made to receive a signal which can be transmitted from the charger 9640; thus, the device in FIG. 27B can control communication of another electronic device. That is, the device may be a general-purpose remote control device. Note that the contents (or part thereof) described in each drawing of this embodiment mode can be applied to the display portion 9643.

Next, a structure example of a mobile phone is described with reference to FIG. 28.

A display panel 9662 is detachably incorporated in a housing 9650. The shape and size of the housing 9650 can be changed as appropriate in accordance with the size of the display panel 9662. The housing 9650 to which the display panel 9662 is fixed is fitted in a printed wiring board 9651 to be assembled as a module.

The display panel 9662 is connected to the printed wiring board 9651 through an FPC 9663. The printed wiring board 9651 is provided with a speaker 9652, a microphone 9653, a transmitting/receiving circuit 9654, a signal processing circuit 9655 including a CPU, a controller, and the like, and a sensor 9661 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray). Such a module, an operation key 9656, a battery 9657, and an antenna 9660 are combined and stored in a housing 9659. A pixel portion of the display panel 9662 is provided to be seen from an opening window formed in the housing 9659.

In the display panel 9662, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 9662 by COG (chip on glass). Alternatively, the IC chip may be connected to a glass substrate by using TAB (tape automated bonding) or a printed wiring board. With such a structure, power consumption of a display device can be reduced and operation time of the mobile phone per charge can be extended. Further, reduction in cost of the mobile phone can be realized.

Figure 28:
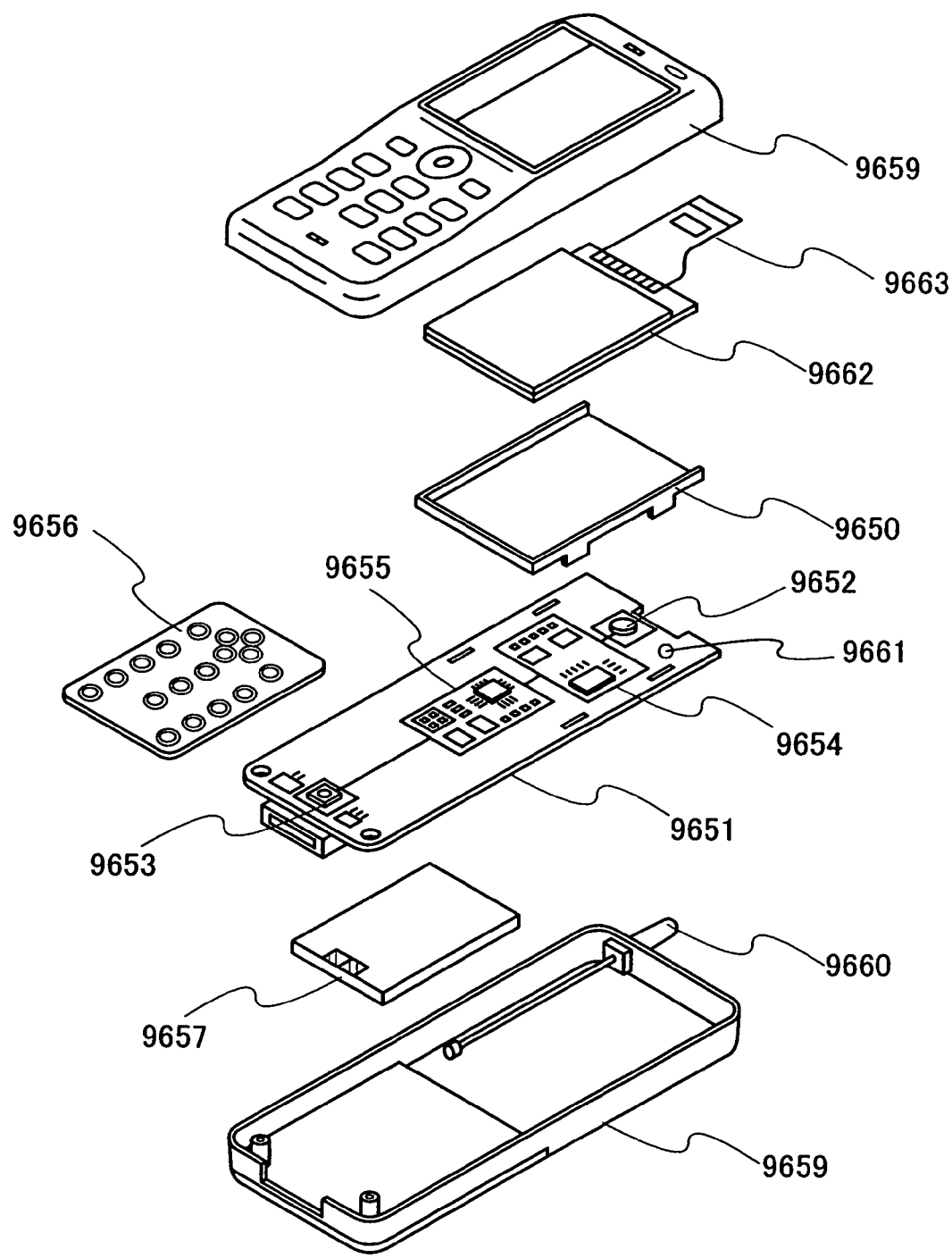
FIG. 28 illustrates an electronic device including a semiconductor device according to the present invention.

The mobile phone shown in FIG. 28 has various functions such as, but not limited to, a function of displaying various kinds of information (e.g., a still image, a moving image, and a text image); a function of displaying a calendar, a date, the time, and the like on a display portion; a function of operating or editing the information displayed on the display portion; a function of controlling processing by various kinds of software (programs); a function of wireless communication; a function of communicating with another mobile phone, a fixed phone, or an audio communication device by using the wireless communication function; a function of connecting with various computer networks by using the wireless communication function; a function of transmitting or receiving various kinds of data by using the wireless communication function; a function of operating a vibrator in accordance with incoming call, reception of data, or an alarm; and a function of generating a sound in accordance with incoming call, reception of data, or an alarm.

Figure 29A:
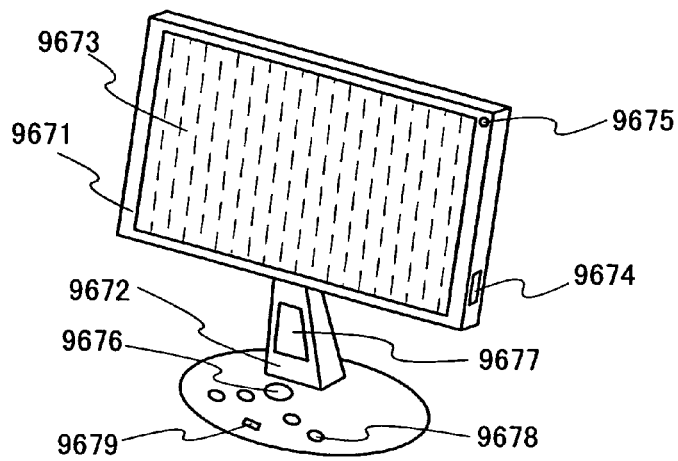
FIGS. 29A to 29C each illustrate an electronic device including a semiconductor device according to the present invention.

FIG. 29A shows a display, which includes a housing 9671, a support base 9672, a display portion 9673, a speaker 9677, an LED lamp 9679, input means (a connection terminal 9674, a sensor 9675 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 9676, and an operation key 9678), and the like. The display in FIG. 29A can have various functions such as, but not limited to, a function of displaying various kinds of information (e.g., a still image, a moving image, and a text image) on the display portion.

Figure 29B:
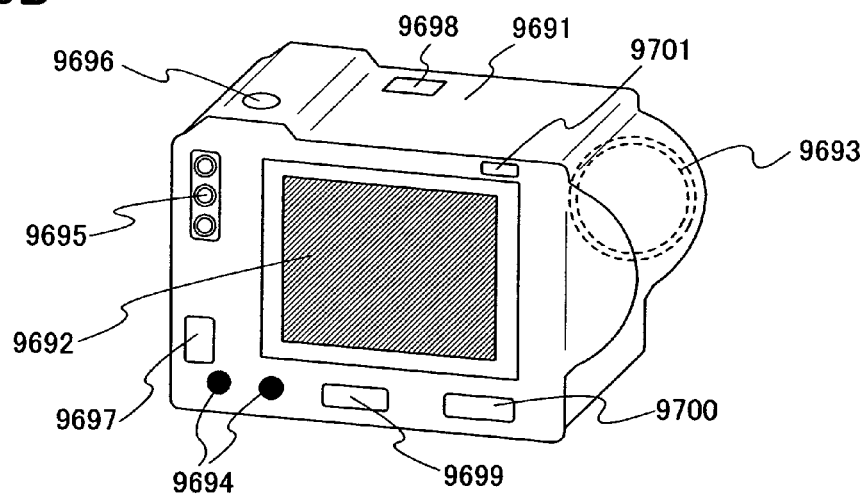

FIG. 29B shows a camera, which includes a main body 9691, a display portion 9692, a shutter button 9696, a speaker 9700, an LED lamp 9701, input means (an image receiving portion 9693, operation keys 9694, an external connection port 9695, a connection terminal 9697, a sensor 9698 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9699), and the like. The camera in FIG. 29B can have various functions such as, but not limited to, a function of photographing a still image and a moving image; a function of automatically adjusting the photographed image (the still image or the moving image); a function of storing the photographed image in a recording medium (provided externally or incorporated in the camera); and a function of displaying the photographed image on the display portion.

Figure 29C:
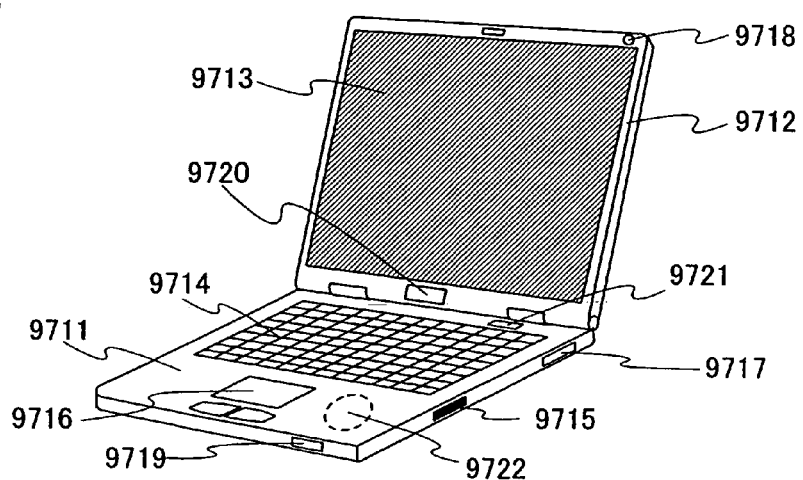

FIG. 29C shows a computer, which includes a main body 9711, a housing 9712, a display portion 9713, a speaker 9720, an LED lamp 9721, a reader/writer 9722, input means (a keyboard 9714, an external connection port 9715, a pointing device 9716, a connection terminal 9717, a sensor 9718 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9719), and the like. The computer in FIG. 29C can have various functions such as, but not limited to, a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; and a function of transmitting or receiving various kinds of data by using the communication function.

Figure 36A:
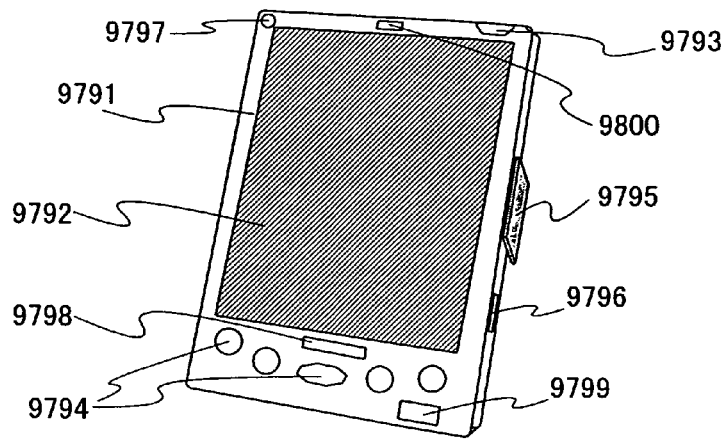
FIGS. 36A to 36C each illustrate an electronic device including a semiconductor device according to the present invention.

FIG. 36A shows a mobile computer, which includes a main body 9791, a display portion 9792, a switch 9793, a speaker 9799, an LED lamp 9800, input means (operation keys 9794, an infrared port 9795, a connection terminal 9796, a sensor 9797 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9798), and the like. The mobile computer in FIG. 36A can have various functions such as, but not limited to, a function of displaying various kinds of information (e.g., a still image, a moving image, and a text image) on the display portion; a touch panel function provided on the display portion; a function of displaying a calendar, a date, the time, and the like on the display portion; a function of controlling processing by various kinds of software (programs); a function of wireless communication; a function of connecting with various computer networks by using the wireless communication function; and a function of transmitting or receiving various kinds of data by using the wireless communication function.

Figure 36B:
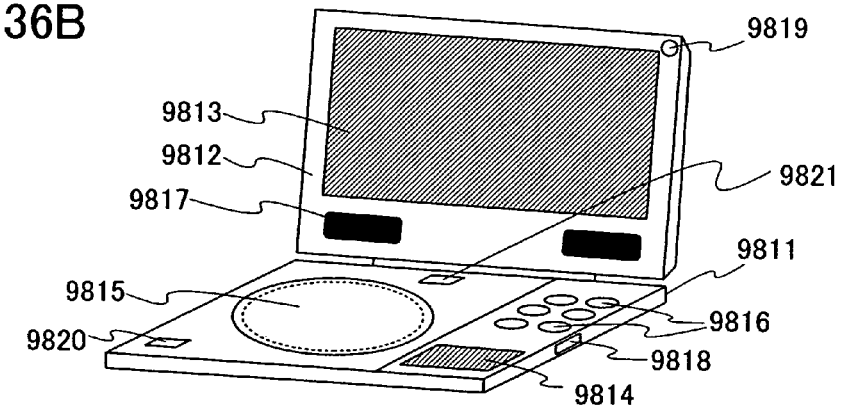

FIG. 36B shows a portable image reproducing device having a recording medium (e.g., a DVD reproducing device), which includes a main body 9811, a housing 9812, a display portion A 9813, a display portion B 9814, a speaker portion 9817, an LED lamp 9821, input means (a recording medium (e.g., DVD) reading portion 9815, operation keys 9816, a connection terminal 9818, a sensor 9819 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9820), and the like. The display portion A 9813 can mainly display image information, and the display portion B 9814 can mainly display text information.

Figure 36C:
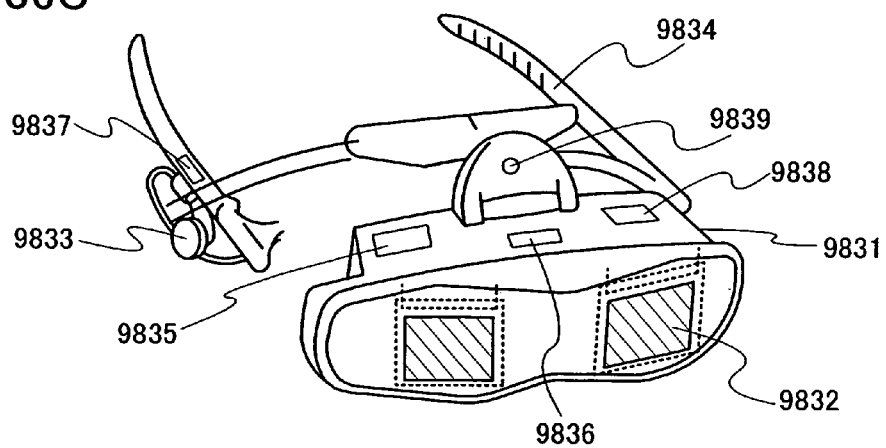

FIG. 36C shows a goggle-type display, which includes a main body 9831, a display portion 9832, an earphone 9833, a support portion 9834, an LED lamp 9839, a speaker 9838, input means (a connection terminal 9835, a sensor 9836 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9837), and the like. The goggle-type display in FIG. 36C can have various functions such as, but not limited to, a function of displaying an externally obtained image (e.g., a still image, a moving image, and a text image) on the display portion.

Figure 37A:
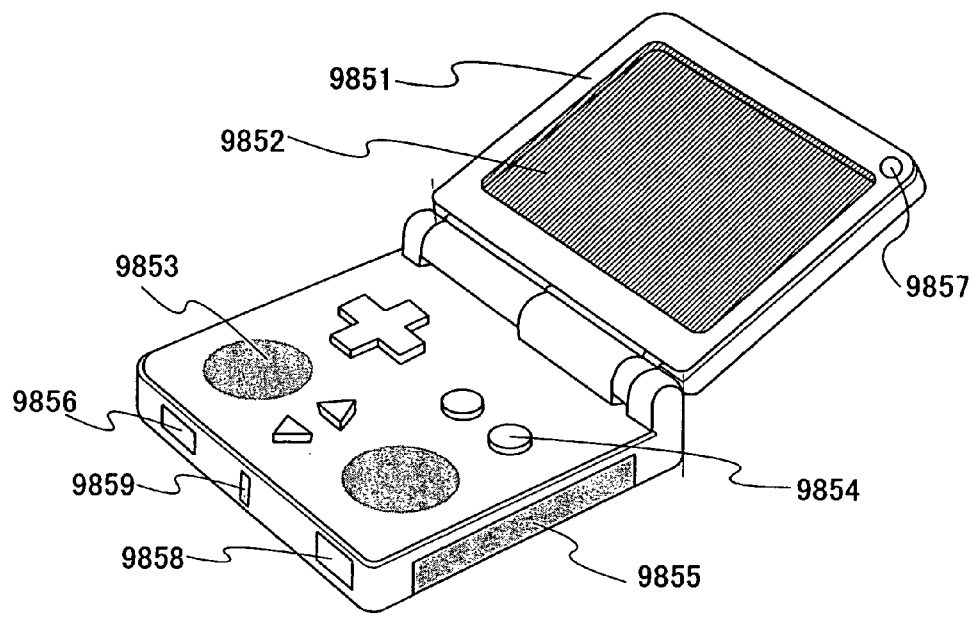
FIGS. 37A and 37B each illustrate an electronic device including a semiconductor device according to the present invention.

FIG. 37A shows a portable game machine, which includes a housing 9851, a display portion 9852, a speaker portion 9853, a recording medium insert portion 9855, an LED lamp 9859, input means (an operation key 9854, a connection terminal 9856, a sensor 9857 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9858), and the like. The portable game machine in FIG. 37A can have various functions such as, but not limited to, a function of reading a program or data stored in the recording medium to display on the display portion; and a function of sharing information by wireless communication with another portable game machine.

Figure 37B:
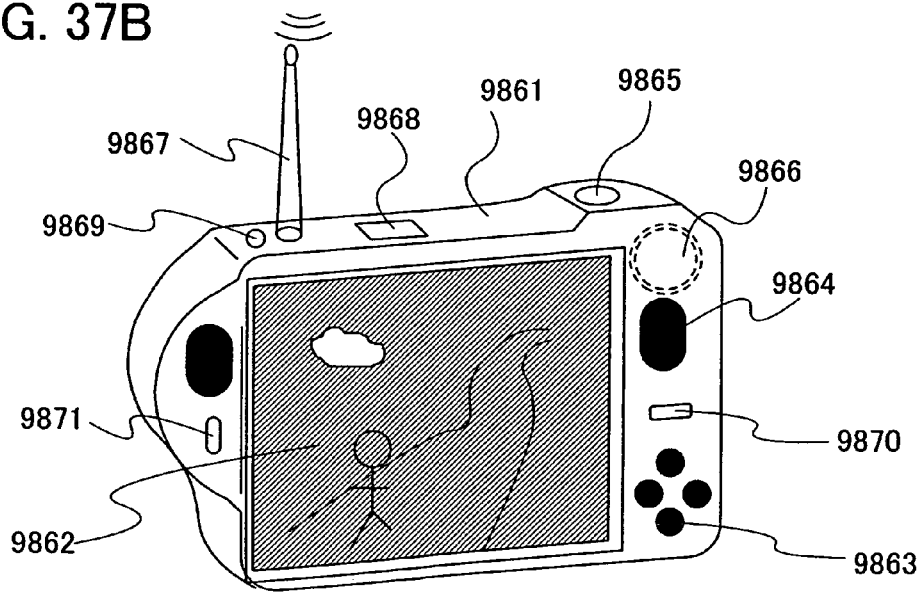

FIG. 37B shows a digital camera having a television reception function, which includes a housing 9861, a display portion 9862, a speaker 9864, a shutter button 9865, an LED lamp 9871, input means (an operation key 9863, an image receiving portion 9866, an antenna 9867, a connection terminal 9868, a sensor 9869 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9870), and the like. The digital camera having a television reception function in FIG. 37B can have various functions such as, but not limited to, a function of photographing a still image and a moving image; a function of automatically adjusting the photographed image; a function of obtaining various kinds of information from the antenna; a function of storing the photographed image or the information obtained from the antenna; and a function of displaying the photographed image or the information obtained from the antenna on the display portion.

Figure 38:
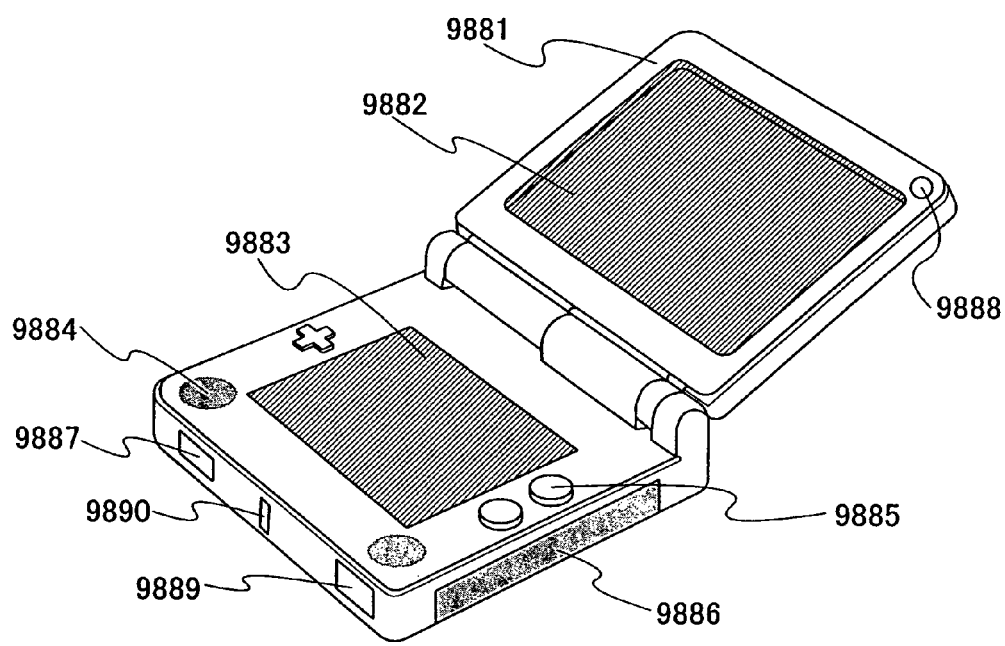
FIG. 38 illustrates an electronic device including a semiconductor device according to the present invention.

FIG. 38 shows a portable game machine, which includes a housing 9881, a first display portion 9882, a second display portion 9883, a speaker portion 9884, a recording medium insert portion 9886, an LED lamp 9890, input means (an operation key 9885, a connection terminal 9887, a sensor 9888 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 9889), and the like. The portable game machine in FIG. 38 can have various functions such as, but not limited to, a function of reading a program or data stored in the recording medium to display on the display portion; and a function of sharing information by wireless communication with another portable game machine.

As shown in FIGS. 29A to 29C, FIGS. 36A to 36C, FIGS. 37A and 37B, and FIG. 38, each electronic device includes a display portion for displaying some kind of information. In such an electronic device, a moving image can have high resolution, and a precise image can be displayed. In particular, in an electronic device including a large display portion, a transistor can be prevented from being located at a boundary of bonding silicon wafers in the display portion; thus, a highly reliable electronic device can be manufactured with high yield.

Next, application examples of the semiconductor device are described.

Figure 30:
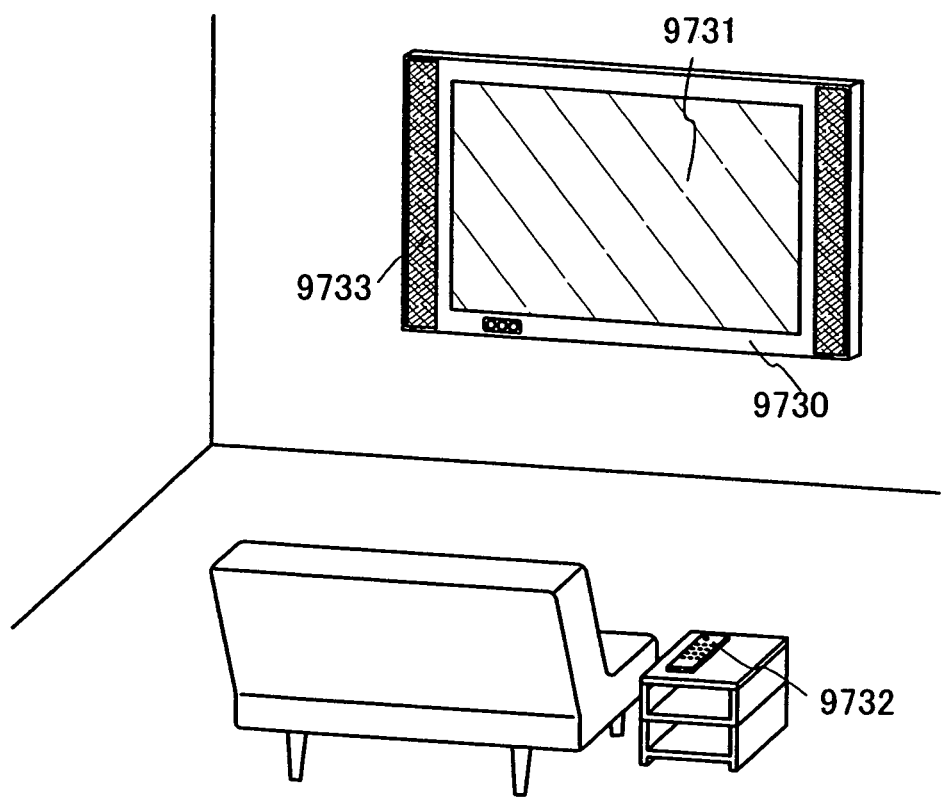
FIG. 30 illustrates an electronic device including a semiconductor device according to the present invention.

FIG. 30 shows an example where a semiconductor device is incorporated in a constructed object. FIG. 30 shows a housing 9730, a display portion 9731, a remote control device 9732 which is an operation portion, a speaker portion 9733, and the like. The semiconductor device is incorporated in the constructed object as a wall-hanging type and can be provided without requiring a large space.

Figure 31:
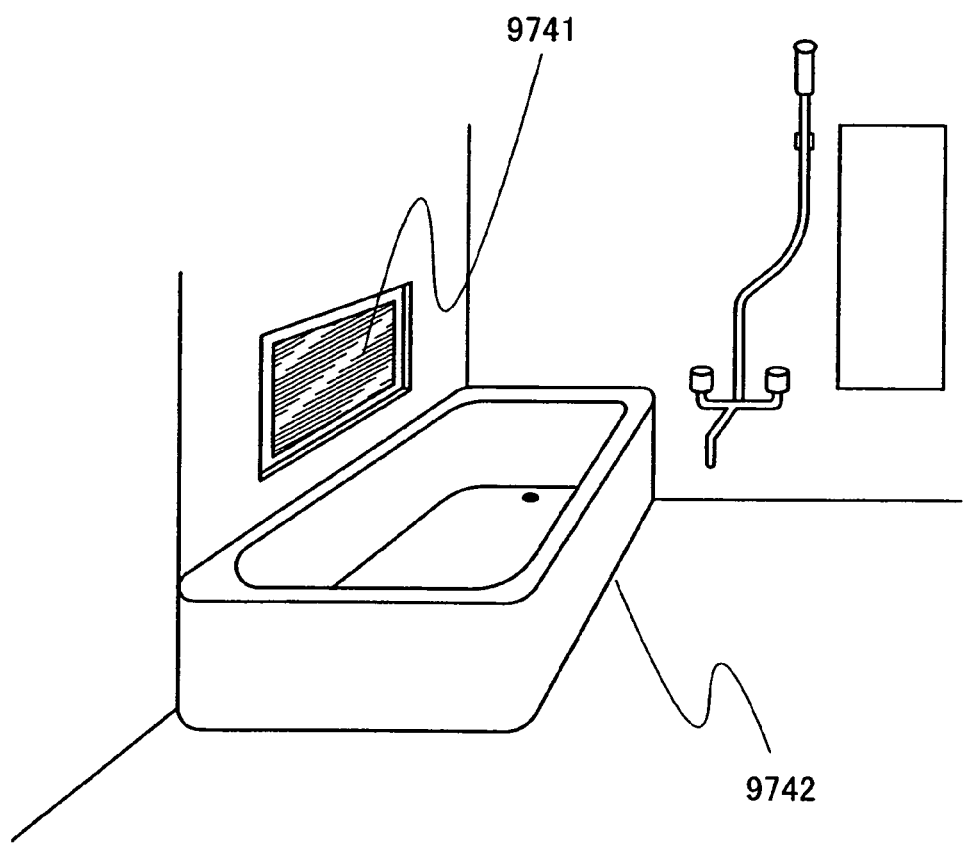
FIG. 31 illustrates an electronic device including a semiconductor device according to the present invention.

FIG. 31 shows another example where a semiconductor device is incorporated in a constructed object. A display panel 9741 is incorporated with a prefabricated bath 9742, and a person who takes a bath can view the display panel 9741. The display panel 9741 has a function of displaying information by an operation by the person who takes a bath; and a function of being used as an advertisement or an entertainment means.

Note that the semiconductor device can be provided not only to a side wall of the prefabricated bath 9742 as shown in FIG. 31, but also to various places. For example, the semiconductor device can be incorporated with part of a mirror, a bathtub itself, or the like. At this time, a shape of the display panel 9741 may be changed in accordance with a shape of the mirror or the bathtub.

Figure 32:
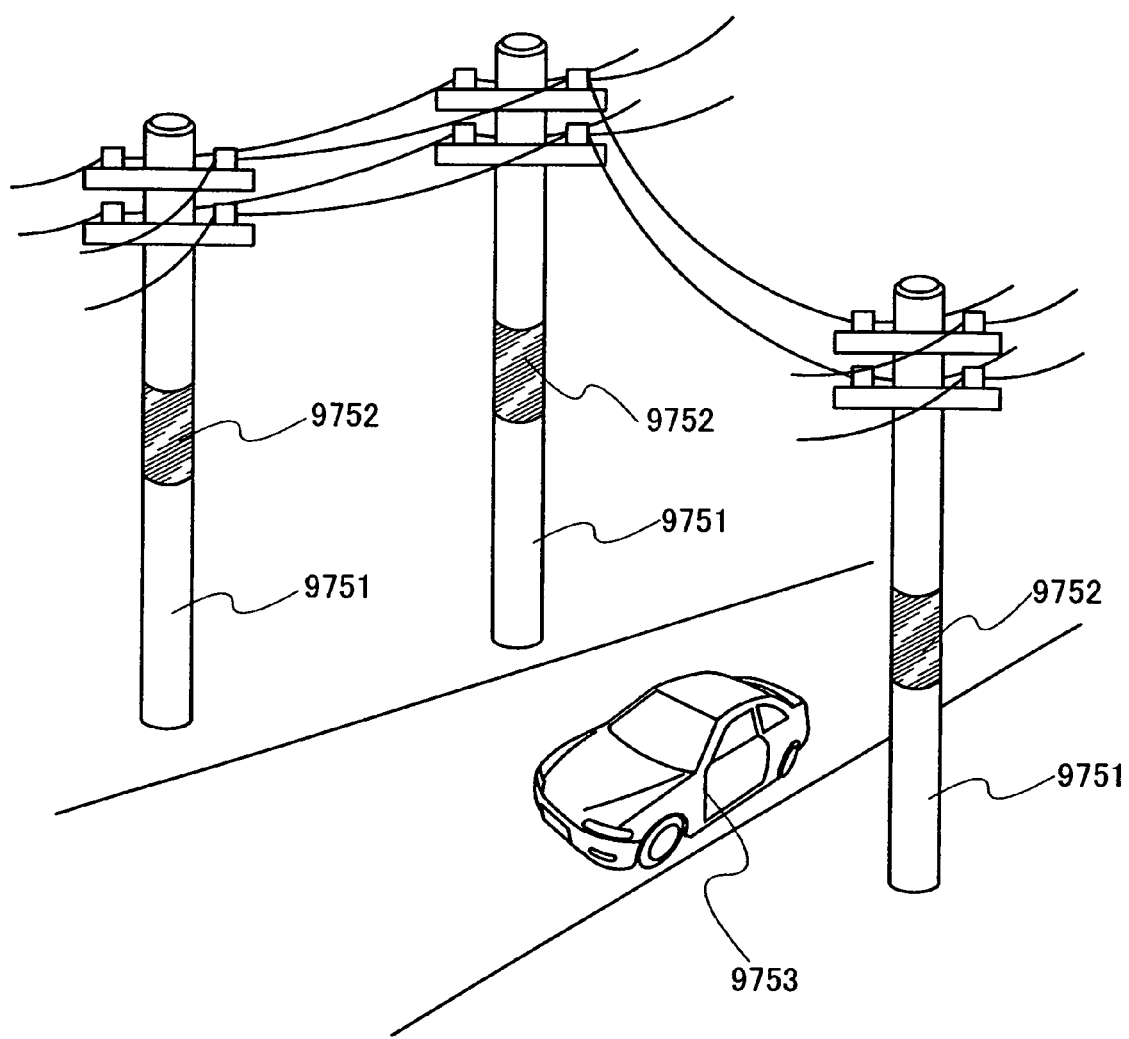
FIG. 32 illustrates an electronic device including a semiconductor device according to the present invention.

FIG. 32 shows another example where a semiconductor device is incorporated in a constructed object. A display panel 9752 is bent and attached to a curved surface of a column-shaped object 9751. Here, a utility pole is described as the column-shaped object 9751.

The display panel 9752 in FIG. 32 is provided at a position higher than a human viewpoint. When the same images are displayed on the display panels 9752 provided in constructed objects which stand together in large numbers outdoors, such as utility poles, advertisement can be performed to an unspecified number of viewers. Since it is easy for the display panel 9752 to display the same images and instantly switch images by external control, highly efficient information display and advertisement effect can be obtained. When provided with self-luminous display elements, the display panel 9752 can be effectively used as a highly visible display medium even at night. When the display panel 9752 is provided in the utility pole, a power supply means for the display panel 9752 can be easily obtained. In an emergency such as disaster, the display panel 9752 can also be used as a means to transmit correct information to victims rapidly.

An example of the display panel 9752 includes a display panel in which a switching element such as an organic transistor is provided over a film-shaped substrate and a display element is driven so as to display an image.

Note that in this embodiment mode, a wall, a column-shaped object, and a prefabricated bath are shown as examples of a constructed object; however, this embodiment mode is not limited thereto, and various constructed objects can be provided with a semiconductor device.

Next, examples where the semiconductor device is incorporated with a moving object are described.

Figure 33:
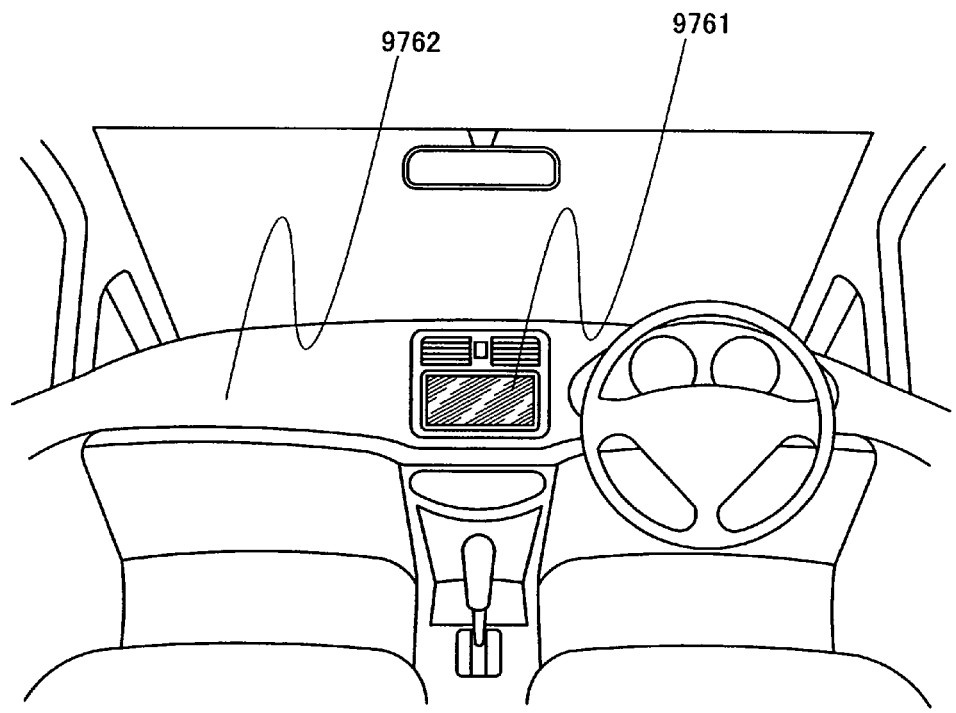
FIG. 33 illustrates an electronic device including a semiconductor device according to the present invention.

FIG. 33 shows an example where a semiconductor device is incorporated with a car. A display panel 9762 is incorporated with a car body 9761, and can display an operation of the car body or information input from inside or outside the car body on demand. Note that a navigation function may be provided.

The semiconductor device can be provided not only to the car body 9761 as shown in FIG. 33, but also to various places. For example, the semiconductor device can be incorporated with a glass window, a door, a steering wheel, a gear shift, a seat, a rear-view mirror, and the like. At this time, a shape of the display panel 9762 may be changed in accordance with a shape of an object provided with the semiconductor device.

Figure 34A:
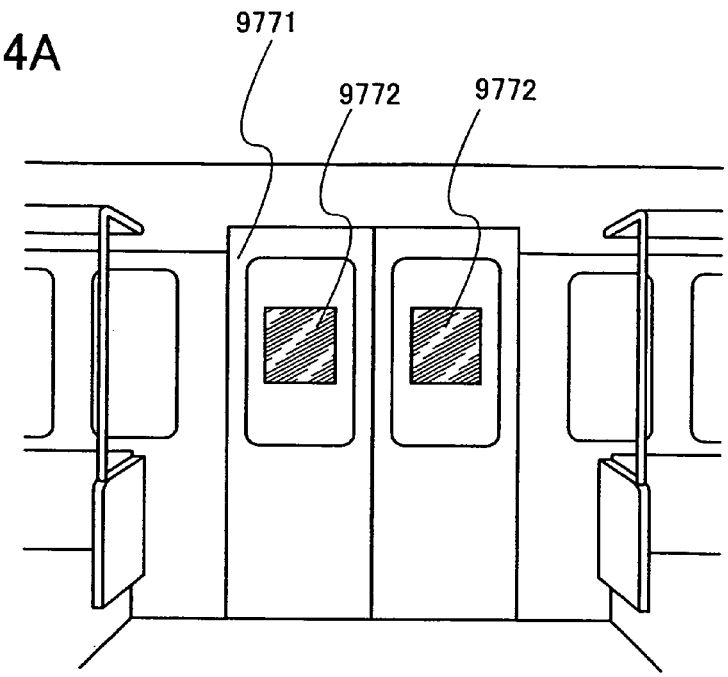
FIGS. 34A and 34B each illustrate an electronic device including a semiconductor device according to the present invention.
Figure 34B:
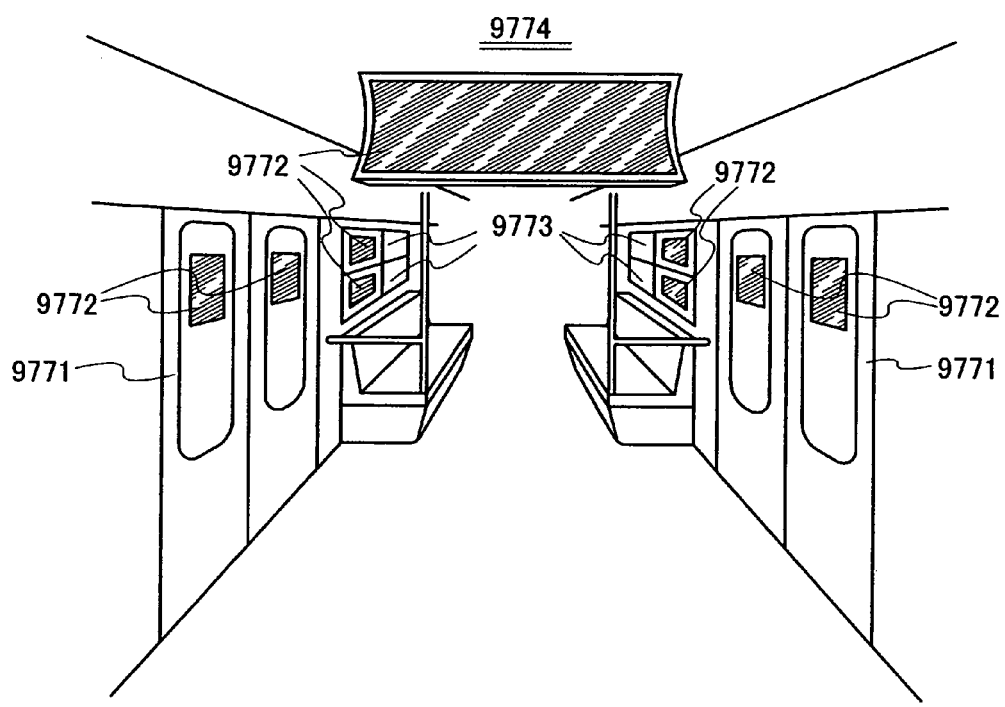

FIGS. 34A and 34B show examples where a semiconductor device is incorporated with a train car.

FIG. 34A shows an example where a display panel 9772 is provided in glass of a door 9771 in a train car, which has an advantage compared with a conventional advertisement using paper in that labor cost for changing an advertisement is not necessary. Since the display panel 9772 can instantly switch images displaying on a display portion by an external signal, images on the display panel can be switched in every time period when types of passengers on the train are changed, for example; thus, more effective advertisement effect can be obtained.

FIG. 34B shows an example where the display panels 9772 are provided to a glass window 9773 and a ceiling 9774 as well as the glass of the door 9771 in the train car. In this manner, the semiconductor device can be easily provided to a place where a semiconductor device has been difficult to be provided conventionally; thus, effective advertisement effect can be obtained. Further, the semiconductor device can instantly switch images displayed on a display portion by an external signal; thus, cost and time for changing an advertisement can be reduced, and more flexible advertisement management and information transmission can be realized.

The semiconductor device can be provided not only to the door 9771, the glass window 9773, and the ceiling 9774 as shown in FIGS. 34A and 34B, but also to various places. For example, the semiconductor device can be incorporated with a strap, a seat, a handrail, a floor, and the like. At this time, a shape of the display panel 9772 may be changed in accordance with a shape of an object provided with the semiconductor device.

Figure 35A:
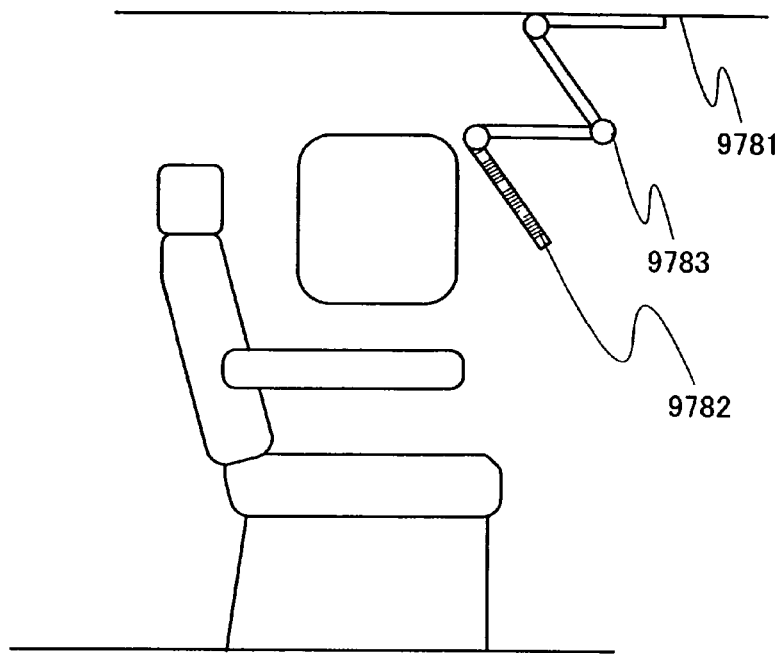
FIGS. 35A and 35B illustrate an electronic device including a semiconductor device according to the present invention.
Figure 35B:
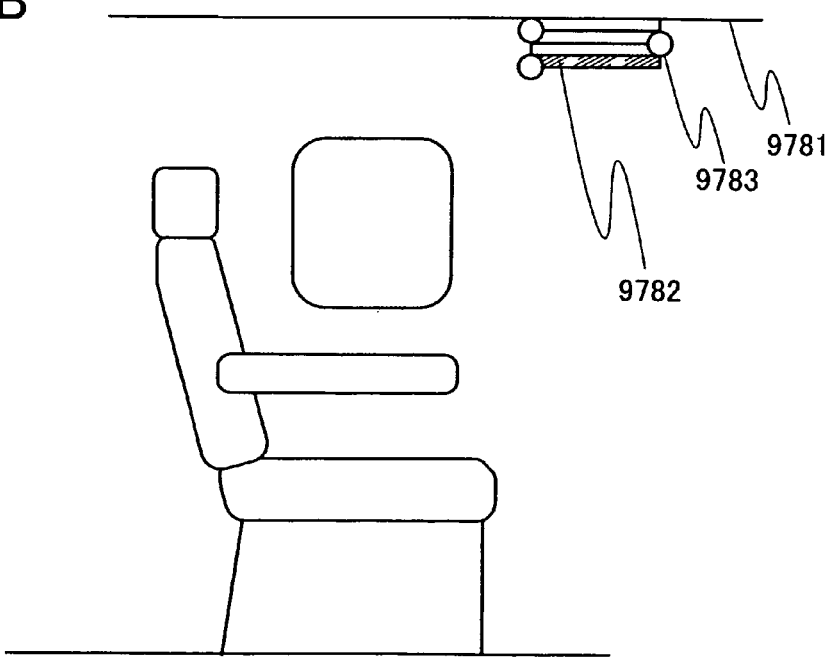

FIGS. 35A and 35B show an example where a semiconductor device is incorporated with a passenger airplane.

FIG. 35A shows a shape of a display panel 9782 attached to a ceiling 9781 above a seat of the passenger airplane when the display panel 9782 is used. The display panel 9782 is incorporated with the ceiling 9781 using a hinge portion 9783, and a passenger can view the display panel 9782 by stretching of the hinge portion 9783. The display panel 9782 has a function to display information by an operation by the passenger and a function to be used as an advertisement or an entertainment means. As shown in FIG. 35B, the hinge portion is bent and the display panel is stored in the ceiling 9781 of the airplane, so that safety in taking-off and landing can be assured. Note that a display element in the display panel is lit in an emergency, so that the display panel can also be used as an information transmission means and an evacuation light.

The semiconductor device can be provided not only to the ceiling 9781 as shown in FIGS. 35A and 35B, but also to various places. For example, the semiconductor device can be incorporated with a seat, a table attached to a seat, an ammrest, a window, and the like. A large display panel which a plurality of people can view may be provided at a wall of an airframe. At this time, a shape of the display panel 9782 may be changed in accordance with a shape of an object provided with the semiconductor device.

Note that in this embodiment mode, bodies of a train car, a car, and an airplane are shown as a moving object; however, the present invention is not limited thereto, and a semiconductor device can be provided to various objects such as a motorcycle, an four-wheel drive car (including a car, a bus, and the like), a train (including a monorail, a railroad car, and the like), and a vessel. Since the semiconductor device can instantly switch images displayed on a display panel in a moving object by an external signal, the moving object provided with the semiconductor device can be used as an advertisement display board for an unspecified number of customers, an information display board in disaster, and the like.

Note that although this embodiment mode is described with reference to various drawings, the contents (or part of the contents) described in each drawing can be freely applied to, combined with, or replaced with the contents (or part of the contents) described in another drawing. Further, even more drawings can be formed by combining each part with another part in the above-described drawings.

Similarly, the contents (or part of the contents) described in each drawing of this embodiment mode can be freely applied to, combined with, or replaced with the contents (or part of the contents) described in a drawing of another embodiment mode. Further, even more drawings can be formed by combining each part in each drawing of this embodiment mode with part of another embodiment mode.

Note that this embodiment mode shows an example of embodying, slightly transforming, partially modifying, improving, describing in detail, or applying the contents (or part of the contents) described in another embodiment mode, an example of related part thereof, or the like. Therefore, the contents described in another embodiment mode can be freely applied to, combined with, or replaced with this embodiment mode.

This application is based on Japanese Patent Application serial No. 2007-173511 filed with Japan Patent Office on Jun. 29, 2007, the entire contents of which are hereby incorporated by reference.

What is claimed is:

1. A method of manufacturing a display device comprising:
cutting out at least one wafer to form at least a first hexagonal semiconductor substrate and a second hexagonal semiconductor substrate;
defining an imaginary line by which a rectangular substrate divided into one or more display portions formed over the rectangular substrate; and
arranging and attaching the first and second hexagonal semiconductor substrates to the rectangular substrate so that one side of the first hexagonal semiconductor substrate is parallel to the imaginary line, the second hexagonal semiconductor substrate is arrange nearest to the first hexagonal substrate, and the one side of the first hexagonal semiconductor substrate is parallel to one side of the second hexagonal semiconductor substrate,
wherein an outline of the one or more display portions is defined by the imaginary line.

2. A method of manufacturing a display device comprising:
cutting out at least one wafer to form first and second hexagonal semiconductor substrates;
arranging the first and second hexagonal semiconductor substrates over a rectangular substrate to be attached to the rectangular substrate;
forming a plurality of semiconductor regions; and
forming a display portion provided with a plurality of pixels, each of the pixels including at least one of the semiconductor regions and a pixel electrode electrically connected to the one of the semiconductor regions,
wherein the plurality of semiconductor regions are formed in such a manner that the first and second hexagonal semiconductor substrates are attached to the rectangular substrate and a boundary region of the first and second hexagonal semiconductor substrates is provided between the one of the semiconductor regions and a semiconductor region next to the one of the semiconductor regions.

3. The method of manufacturing the display device according to claim 2, wherein the pixels in the display portion are arranged in delta pattern.

4. The method of manufacturing the display device according to claim 1, wherein one side of the rectangular substrate is one meter or more.

5. The method of manufacturing the display device according to claim 2, wherein one side of the rectangular substrate is one meter or more.

6. A method of manufacturing a display device comprising:
cutting out at least one wafer to form at least a first hexagonal semiconductor substrate and a second hexagonal semiconductor substrate;
defining an imaginary line by which a rectangular substrate is divided into one or more display portions formed over the rectangular substrate; and
arranging and attaching the first and second hexagonal semiconductor substrates to the rectangular substrate adjacent to each other so that one side of the first hexagonal semiconductor substrate is parallel to the imaginary line and the one side of the first hexagonal semiconductor substrate is parallel to one side of the second hexagonal semiconductor substrate,
wherein an outline of the one or more display portions is defined by the imaginary line.

7. A method of manufacturing a display device comprising:
cutting out at least one wafer to form at least a first hexagonal semiconductor substrate and a second hexagonal semiconductor substrate;
defining an imaginary outline by which a rectangular substrate is divided into one or more display portions formed over the rectangular substrate; and
arranging and attaching the first and second hexagonal semiconductor substrates to the rectangular substrate adjacent to each other so that one side of the first hexagonal semiconductor substrate is parallel to at least one line of the imaginary outline and the one side of the first hexagonal semiconductor substrate is parallel to one side of the second hexagonal semiconductor substrate.

* * * * *

UNITED STATES PATENT AND TRADEMARK OFFICE
CERTIFICATE OF CORRECTION

PATENT NO. : 8,431,451 B2
APPLICATION NO. : 12/213799
DATED : April 30, 2013
INVENTOR(S) : Yasunori Yoshida et al.

It is certified that error appears in the above-identified patent and that said Letters Patent is hereby corrected as shown below:

In the Specification

Column 2, line 5, "ia" should be -- a --;

Column 6, line 57, "(PAIC)," should be -- (PALC), --;

Column 7, line 26, "organic E-L," should be -- organic EL, --;

Column 11, line 59, "Q and B" should be -- G, and B --;

Column 15, line 11, "wiringto" should be -- wiring to --;

Column 26, line 2, "tetramethylcyclotetrasiloxahe" should be -- tetramethylcyclotetrasiloxane --;

Column 46, line 29, "ammrest," should be -- armrest, --;

In the Claims

Claim 1, column 47, line 11, "divided" should be -- is divided --.

Signed and Sealed this
Third Day of December, 2013

Margaret A. Focarino
*Commissioner for Patents of the United States Patent and Trademark Office*